(12) United States Patent
Sagehashi et al.

(10) Patent No.: US 8,877,424 B2
(45) Date of Patent: Nov. 4, 2014

(54) MONOMER, POLYMER, RESIST COMPOSITION, AND PATTERNING PROCESS

(71) Applicant: Shin-Etsu Chemical Co., Ltd., Tokyo (JP)

(72) Inventors: Masayoshi Sagehashi, Joetsu (JP); Jun Hatakeyama, Joetsu (JP); Koji Hasegawa, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/762,859

(22) Filed: Feb. 8, 2013

(65) Prior Publication Data

US 2013/0209935 A1 Aug. 15, 2013

(30) Foreign Application Priority Data

Feb. 10, 2012 (JP) ................ 2012-026798

(51) Int. Cl.
  G03F 7/039 (2006.01)
  G03F 7/20 (2006.01)
  G03F 7/30 (2006.01)
  G03F 7/38 (2006.01)
  G03F 7/004 (2006.01)

(52) U.S. Cl.
  USPC ........ 430/270.1; 430/311; 430/325; 430/326; 430/330; 430/331; 430/910; 430/921; 430/925; 526/281; 526/282; 526/243; 526/245; 526/257; 526/266; 526/268; 526/269; 526/271; 526/328.5

(58) Field of Classification Search
  None
  See application file for complete search history.

(56) References Cited

U.S. PATENT DOCUMENTS

| | | |
|---|---|---|
| 6,448,420 B1 | 9/2002 | Kinsho et al. |
| 6,830,866 B2 | 12/2004 | Kobayashi et al. |
| 7,514,204 B2 | 4/2009 | Hatakeyama et al. |
| 7,537,880 B2 | 5/2009 | Harada et al. |
| 7,598,016 B2 | 10/2009 | Kobayashi et al. |
| 7,622,242 B2 | 11/2009 | Hatakeyama et al. |
| 7,642,034 B2 | 1/2010 | Hatakeyama et al. |
| 7,670,750 B2 | 3/2010 | Harada et al. |
| 7,759,047 B2 | 7/2010 | Hatakeyama et al. |
| 7,771,913 B2 | 8/2010 | Kaneko et al. |
| 8,034,547 B2 | 10/2011 | Tsubaki et al. |
| 8,043,788 B2 | 10/2011 | Kobayashi et al. |
| 8,101,335 B2 | 1/2012 | Harada et al. |

(Continued)

FOREIGN PATENT DOCUMENTS

| | | |
|---|---|---|
| JP | 2000-327633 A | 11/2000 |
| JP | 2003-66612 A | 3/2003 |

(Continued)

OTHER PUBLICATIONS

DERWENT English abstract for JP2005-255742 (2005).*

(Continued)

*Primary Examiner* — Sin J. Lee
(74) *Attorney, Agent, or Firm* — Westerman, Hattori, Daniels & Adrian, LLP

(57) ABSTRACT

A polymer is prepared from an adamantane methacrylate monomer whose alcoholic hydroxyl group is protected with an alicyclic-containing tertiary alkyl group. A photoresist composition comprising the polymer displays a high sensitivity and a high dissolution contrast during both alkaline development and organic solvent development.

11 Claims, 1 Drawing Sheet

PHOTORESIST COATING

PHOTORESIST EXPOSURE

(56) References Cited

U.S. PATENT DOCUMENTS

| | | |
|---|---|---|
| 2007/0003867 A1 | 1/2007 | Hatakeyama et al. |
| 2008/0090172 A1 | 4/2008 | Hatakeyama et al. |
| 2011/0236826 A1 | 9/2011 | Hatakeyama et al. |
| 2011/0250539 A1 | 10/2011 | Sagehashi et al. |
| 2011/0305992 A1 | 12/2011 | Tarutani et al. |

FOREIGN PATENT DOCUMENTS

| | | | |
|---|---|---|---|
| JP | 2005-255742 | * | 9/2005 |
| JP | 3790649 B2 | | 6/2006 |
| JP | 2007-25634 A | | 2/2007 |
| JP | 2007-297590 A | | 11/2007 |
| JP | 2007-316448 A | | 12/2007 |
| JP | 2008-3569 A | | 1/2008 |
| JP | 2008-81716 A | | 4/2008 |
| JP | 2008-107443 A | | 5/2008 |
| JP | 2008-111089 A | | 5/2008 |
| JP | 2008-111103 A | | 5/2008 |
| JP | 2008-122932 A | | 5/2008 |
| JP | 2008-239918 A | | 10/2008 |
| JP | 2008-281974 A | | 11/2008 |
| JP | 2008-281975 A | | 11/2008 |
| JP | 2008-281980 A | | 11/2008 |
| JP | 2009-25707 A | | 2/2009 |
| JP | 2009-25723 A | | 2/2009 |
| JP | 2009-31767 A | | 2/2009 |
| JP | 2009-53657 A | | 3/2009 |
| JP | 2009-98638 A | | 5/2009 |
| JP | 2009-276363 A | | 11/2009 |
| JP | 4631297 B2 | | 2/2011 |
| JP | 2011-197339 A | | 10/2011 |
| JP | 2011-221513 A | | 11/2011 |
| JP | 2011-231312 A | | 11/2011 |

OTHER PUBLICATIONS

DERWENT English abstract for JP2011-197339 (2011).*

Machine-assisted English translation of JP2005-255742, provided by JPO (2005).*

Machine-assisted English translation of JP2011-197339, provided by JPO (2011).*

Truffert et al., "Ultimate contact hole resolution using immersion lithography with line/space imaging", Proc. of SPIE, vol. 7274, 2009, pp. 72740N-1-72740N-12.

Nakao et al., "0.12 μm Hole Pattern Formation by KrF Lithography for Giga Bit DRAM", IEEE, Digest 61, 1996, pp. 61-64.

Nakamura et al., "Contact Hole Formation by Multiple Exposure Technique in Ultra-low k1 Lithography", Proc. of SPIE, vol. 5377, 2009, pp. 255-263.

Arimitsu et al., "Sensitivity Enhancement of Chemical-Amplification-Type Photoimaging Materials by Acetoacetic Acid Derivatives", Journal of Photopolymer Science and Technology, vol. 8, No. 1, 1995, pp. 43-44.

Arimitsu et al., "Effect of Phenolic Hydroxyl Residues on the Improvement of Acid-Proliferation-Type Photoimaging Materials", Journal of Photopolymer Science and Technology, vol. 9 No. 1, 1996, pp. 29-30.

Kudo et al., "Enhancement of the Senesitivity of Chemical-Amplification-Type Photoimaging Materials by β-Tosyloxyketone Acetals", Journal of Photopolymer Science and Technology, vol. 8, No. 1, 1995, pp. 45-46.

* cited by examiner

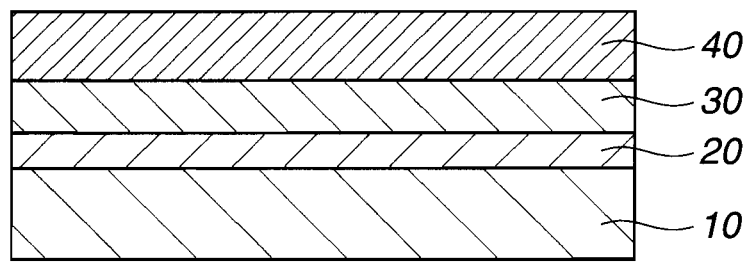
FIG.1A PHOTORESIST COATING
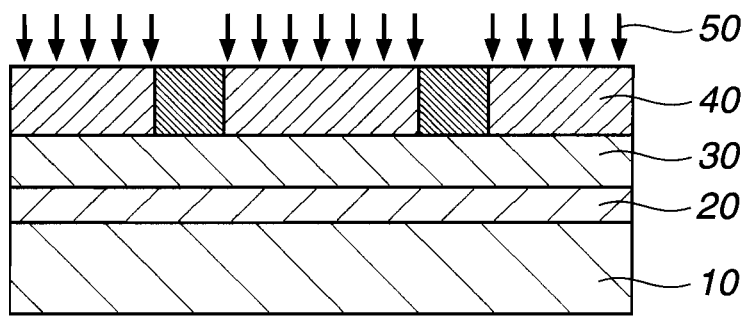
FIG.1B PHOTORESIST EXPOSURE
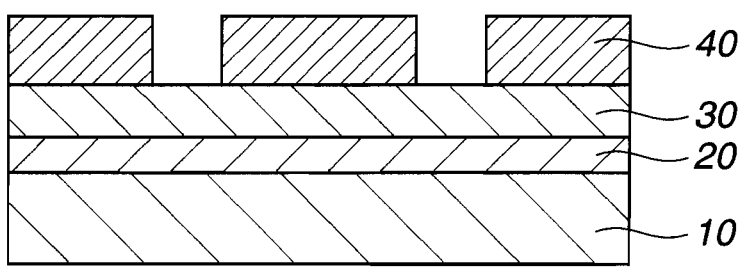
FIG.1C ORGANIC SOLVENT DEVELOPMENT the

MONOMER, POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2012-026798 filed in Japan on Feb. 10, 2012, the entire contents of which are hereby incorporated by reference.

TECHNICAL FIELD

This invention relates to a monomer useful as a starting reactant for functional, pharmaceutical and agricultural chemicals, a polymer comprising recurring units derived from the monomer, a photoresist composition comprising the polymer, and a pattern forming process using the photoresist composition. The monomer is useful for the preparation of a polymer that finds use as a base resin in a radiation-sensitive resist composition having high transparency to radiation with a wavelength of up to 500 nm, especially up to 300 nm, specifically KrF, ArF or $F_2$ laser radiation and improved development properties.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 μm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 μm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was abandoned and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER, LWR) of resist film, defect-free MoSi laminate mask, reduced aberration of reflection mirror, and the like.

Another candidate for the 32-nm node lithography is high refractive index liquid immersion lithography. The development of this technology was abandoned because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Proc. SPIE, Vol. 5377, p. 255 (2004) that a pattern of X-direction lines is formed in a positive resist film using dipole illumination, the resist pattern is cured, another resist material is coated thereon, and a pattern of Y-direction lines is formed in the other resist film using dipole illumination, leaving a lattice-like line pattern, interstices of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in IEEE IEDM Tech. Digest 61 (1996) to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art.

Proc. SPIE Vol. 7274, p. 72740N (2009) reports three methods for forming hole patterns via image reversal. The three methods are: method (1) involving subjecting a positive resist material to two double-dipole exposures of X and Y lines to form a dot pattern, depositing a $SiO_2$ film thereon by LPCVD, and effecting $O_2$—RIE for reversal of dots into holes; method (2) involving forming a dot pattern by the same steps as in (1), but using a resist material designed to turn alkali-soluble and solvent-insoluble upon heating, coating a phenol-base overcoat film thereon, effecting alkaline development for image reversal to form a hole pattern; and method (3) involving double dipole exposure of a positive resist material and organic solvent development for image reversal to form holes.

The formation of negative pattern through organic solvent development is a traditional technique. A resist material comprising cyclized rubber is developed using an alkene such as xylene as the developer. An early chemically amplified resist material comprising poly(t-butoxycarbonyloxystyrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist material featuring a high resolution is subjected to organic solvent development to form a negative pattern. An attempt to double a resolution by combining two developments, alkali development and organic solvent development is under study.

As the ArF resist material for negative tone development with organic solvent, positive ArF resist compositions of the prior art design may be used. Pattern forming processes are described in JP-A 2008-281974, 2008-281975, 2008-281980, 2009-053657, 2009-025707, and 2009-025723.

These patent documents disclose resist materials for organic solvent development comprising a copolymer of hydroxyadamantane methacrylate, a copolymer of norbornane lactone methacrylate, a copolymer of methacrylate having acidic groups including carboxyl, sulfo, phenol, thiol and other groups substituted with two or more acid labile groups, and a copolymer of methacrylate having a cyclic acid-stable group ester, and pattern forming processes using the same.

The ester unit having a carboxyl group protected with an acid labile group is one of predominant constituent units of base resins in currently available chemically amplified resist compositions. JP 4631297 discloses a positive resist comprising units of hydroxyadamantane methacrylate whose hydroxyl group is protected with a tertiary alkyl group. Also, JP-A 2011-197339 discloses formation of a negative pattern via organic solvent development using a base resin comprising those units having a hydroxyl group protected in acetal or tertiary ether form as the sole acid labile unit.

CITATION LIST

Patent Document 1: JP-A 2008-281974
Patent Document 2: JP-A 2008-281975
Patent Document 3: JP-A 2008-281980
Patent Document 4: JP-A 2009-053657
Patent Document 5: JP-A 2009-025707
Patent Document 6: JP-A 2009-025723
Patent Document 7: JP 4631297
Patent Document 8: JP-A 2011-197339
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 10 times. While Patent Documents 1 to 6 describe conventional photoresist materials of the alkaline aqueous solution development type, there is a demand for a novel material which can offer a significant dissolution contrast upon organic solvent development.

When holes are formed by negative development, regions surrounding the holes receive light so that excess acid is generated therein. It is then important to control acid diffusion because the holes are not opened if the acid diffuses inside the holes.

An object of the invention is to provide a photoresist composition which displays a high sensitivity and a high dissolution contrast during both alkaline development and organic solvent development. Specifically, an object of the invention is to provide a monomer, a polymer prepared from the monomer and suited for use in photoresist compositions, a resist composition comprising the polymer as a base resin, and a pattern forming process using the resist composition.

The inventors have found that a monomer having the general formula (1A) or (1B) defined below can be readily synthesized, and that a resist composition comprising a polymer resulting from the monomer is not only useful in forming positive patterns in conventional alkaline developer, but also is improved in dissolution contrast during organic solvent development and forms a hole pattern via positive/negative reversal which is improved in sensitivity, resolution, and dimensional uniformity.

A first embodiment of the invention provides a monomer having the general formula (1A) or (1B).

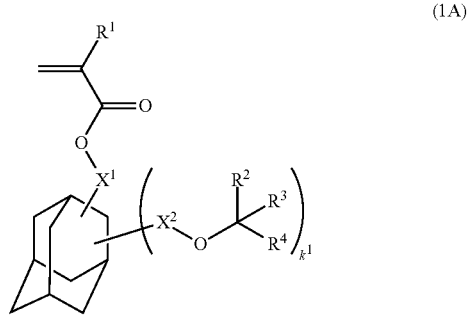

(1A)

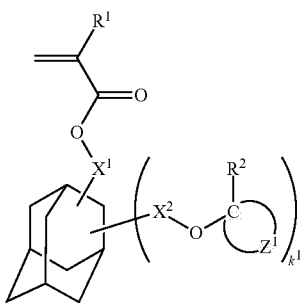
(1B)

Herein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached.

A second embodiment of the invention provides a polymer comprising recurring units having the general formula (2A) or (2B).

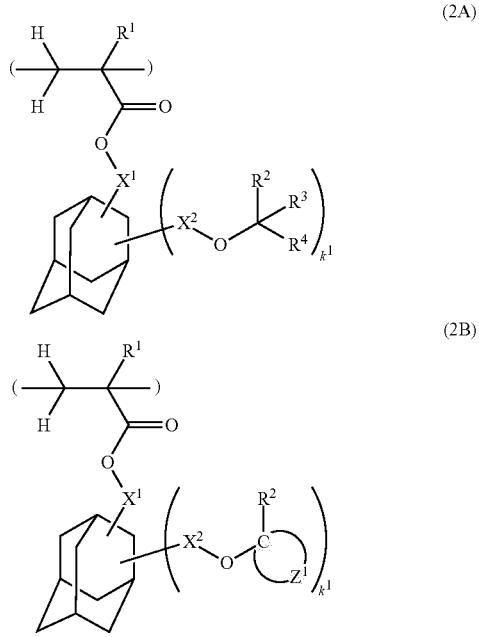

Herein $R^1$ to $R^5$, $X^1$, $X^2$, $Z^1$, and $k^1$ are as defined above.

The polymer may further comprise recurring units (b) of at least one type having a carboxyl group substituted with an acid labile group and/or recurring units (c) of at least one type derived from a monomer having an adhesive group selected from the class consisting of hydroxyl, cyano, carbonyl, ester, ether, lactone, carboxyl, carboxylic anhydride, sulfonic acid ester, disulfone, and carbonate groups.

A third embodiment of the invention provides a resist composition comprising a base resin comprising the polymer defined above, an acid generator, and an organic solvent.

A fourth embodiment of the invention provides a pattern forming process comprising the steps of applying a resist composition comprising a base resin comprising the polymer defined above, an acid generator, and an organic solvent onto a substrate, prebaking the composition to form a resist film, exposing the resist film to high-energy radiation to define exposed and unexposed regions, baking, and developing the exposed film in a developer to form a pattern.

In one preferred embodiment, an alkaline aqueous solution is used as the developer in the developing step to form a positive pattern wherein the exposed region of film is dissolved and the unexposed region of film is not dissolved.

In another preferred embodiment, an organic solvent is used as the developer in the developing step to form a negative pattern wherein the unexposed region of film is dissolved and the exposed region of film is not dissolved.

The developer is preferably at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

Preferably, the step of exposing the resist film to high-energy radiation includes KrF lithography of wavelength 248 nm, ArF lithography of wavelength 193 nm, electron beam (EB) lithography, or extreme ultraviolet (EUV) lithography of wavelength 13.5 nm.

Advantageous Effects of Invention

A photoresist film comprising a polymer comprising recurring units derived from the inventive monomer and an acid generator is useful in forming positive patterns by conventional alkaline development. It is also effective in forming images via positive/negative reversal by organic solvent development because the photoresist film is characterized by a high dissolution contrast between the unexposed region of promoted dissolution and the exposed region of inhibited dissolution during organic solvent development. By subjecting this photoresist film to exposure through a mask bearing a lattice-like pattern and organic solvent development, a fine hole pattern can be formed at a high sensitivity and a high precision of dimensional control.

BRIEF DESCRIPTION OF DRAWINGS

FIG. 1 schematically illustrates in cross-sectional views the pattern forming process of the invention, FIG. 1A shows a photoresist film formed on a substrate, FIG. 1B shows the photoresist film being exposed, and FIG. 1C shows the photoresist film being developed in organic solvent.

DESCRIPTION OF EMBODIMENTS

In the disclosure, the singular forms "a," "an" and "the" include plural referents unless the context clearly dictates otherwise. The notation (Cn-Cm) means a group containing from n to m carbon atoms per group.

The abbreviations and acronyms have the following meaning.

PAG: photoacid generator
Mw: weight average molecular weight
Mn: number average molecular weight
Mw/Mn: molecular weight distribution or dispersity
GPC: gel permeation chromatography
PEB: post-exposure baking It is understood that for some structures represented by chemical formulae, there can exist enantiomers and diastereomers because of the presence of asymmetric carbon atoms. In such a case, a single formula collectively represents all such isomers. The isomers may be used alone or in admixture.

Monomer

In the first embodiment, the invention provides a monomer having the general formula (1A) or (1B). This monomer or formula is simply referred to as monomer (1) or formula (1) when it is unnecessary to discriminate these two formulae.

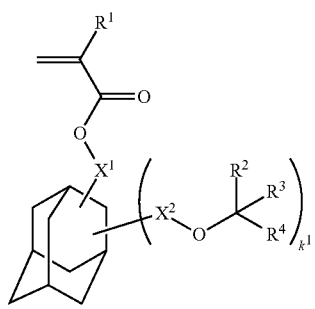
(1A)

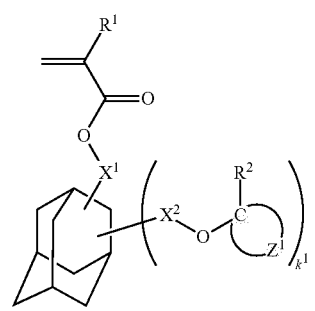
(1B)

Herein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached.

Suitable cyclic monovalent $C_3$-$C_{15}$ hydrocarbon groups represented by $R^2$ include cyclopropyl, cyclobutyl, cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl.

Suitable straight, branched or cyclic monovalent $C_1$-$C_{15}$ hydrocarbon groups represented by $R^3$, $R^4$ and $R^5$ include methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl.

Examples of the $C_5$-$C_{15}$ alicyclic group that $Z^1$ forms with the carbon atom to which it is attached are shown below.

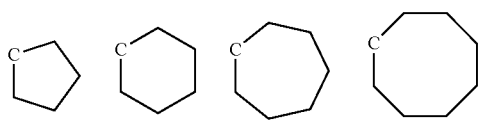

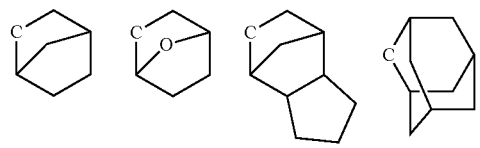

Suitable straight or branched divalent $C_1$-$C_4$ hydrocarbon groups represented by $X^1$ and $X^2$ include alkylene groups such as methylene, ethylene, propane-1,1-diyl, propane-1,2-diyl, propane-1,3-diyl, butane-1,1-diyl, butane-1,2-diyl, butane-1,3-diyl, and butane-1,4-diyl.

The subscript $k^1$ is an integer of 1 to 3, with $k^1$=1 or 2 being preferred. In the case of $k^1$=3, the monomer itself may have a higher molecular weight and sometimes become difficult to purify by distillation.

Illustrative non-limiting examples of the monomer having formula (1) are given below wherein $R^1$ is as defined above.

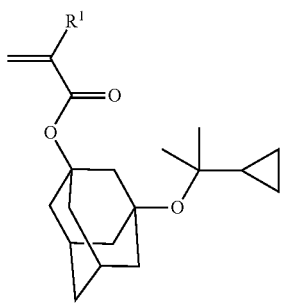

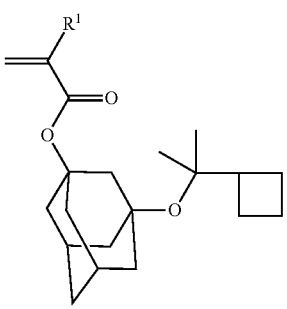

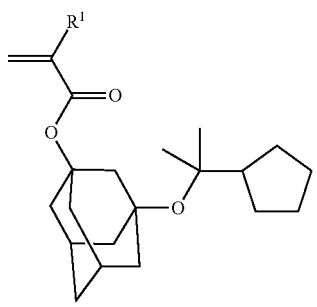
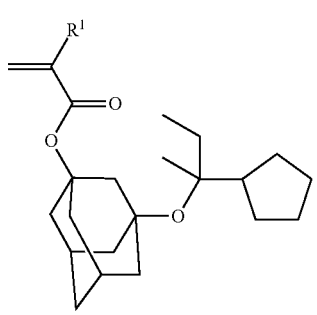
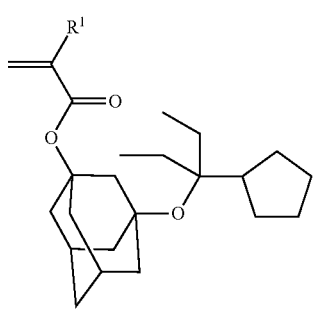
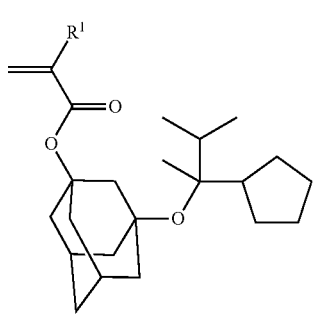
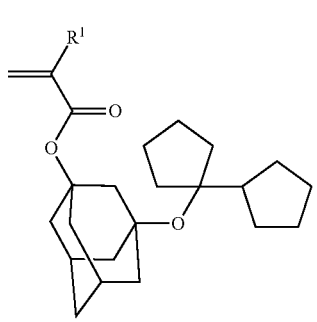
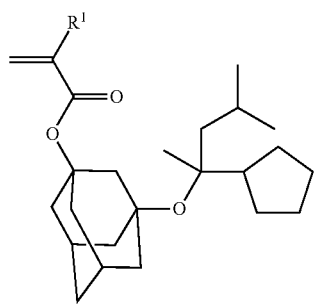
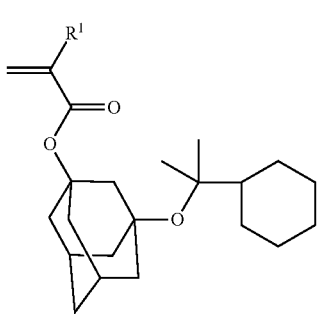
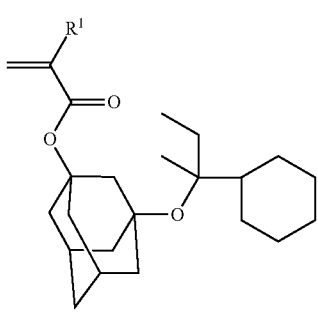
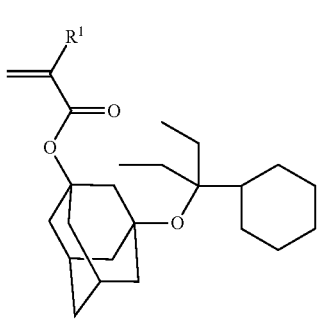
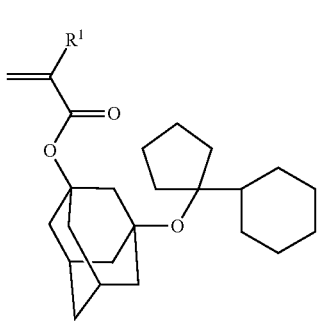

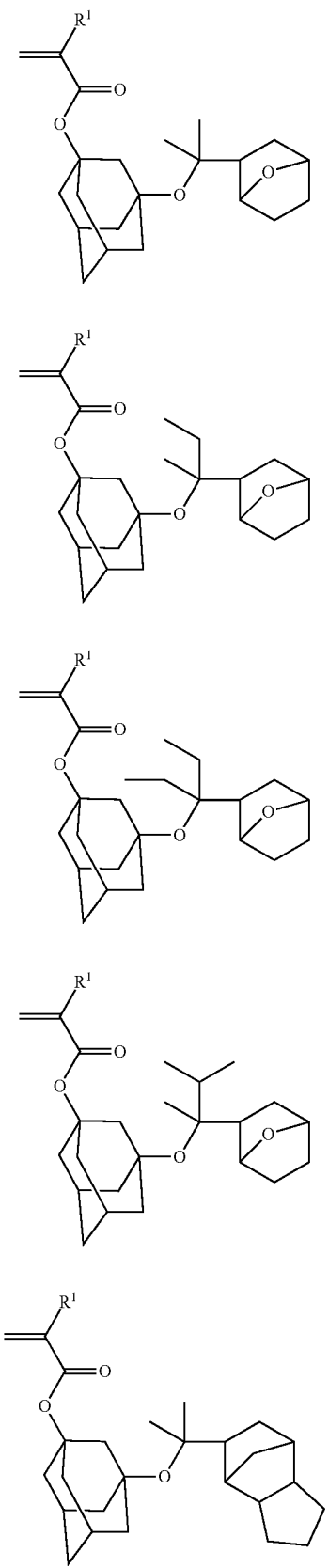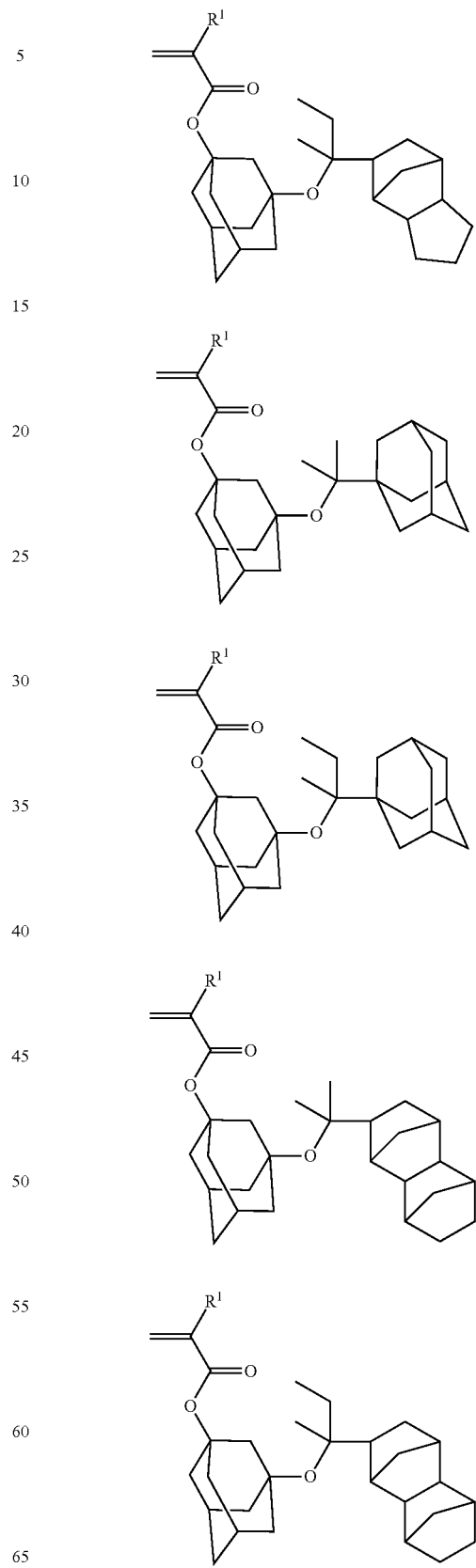

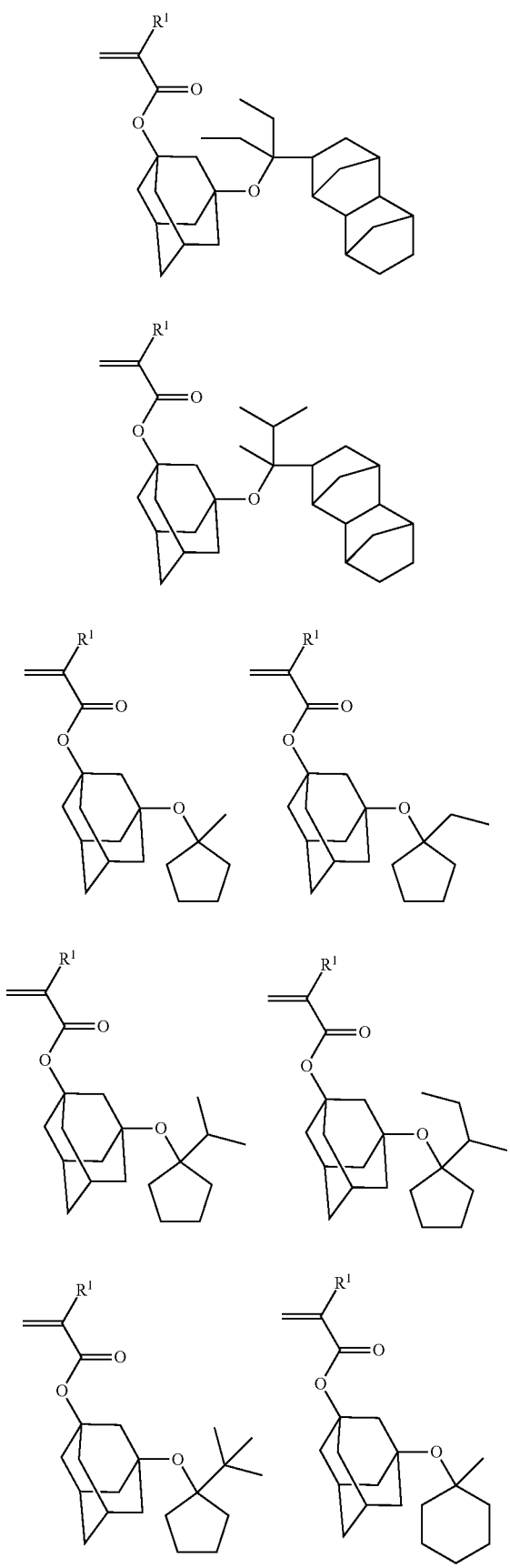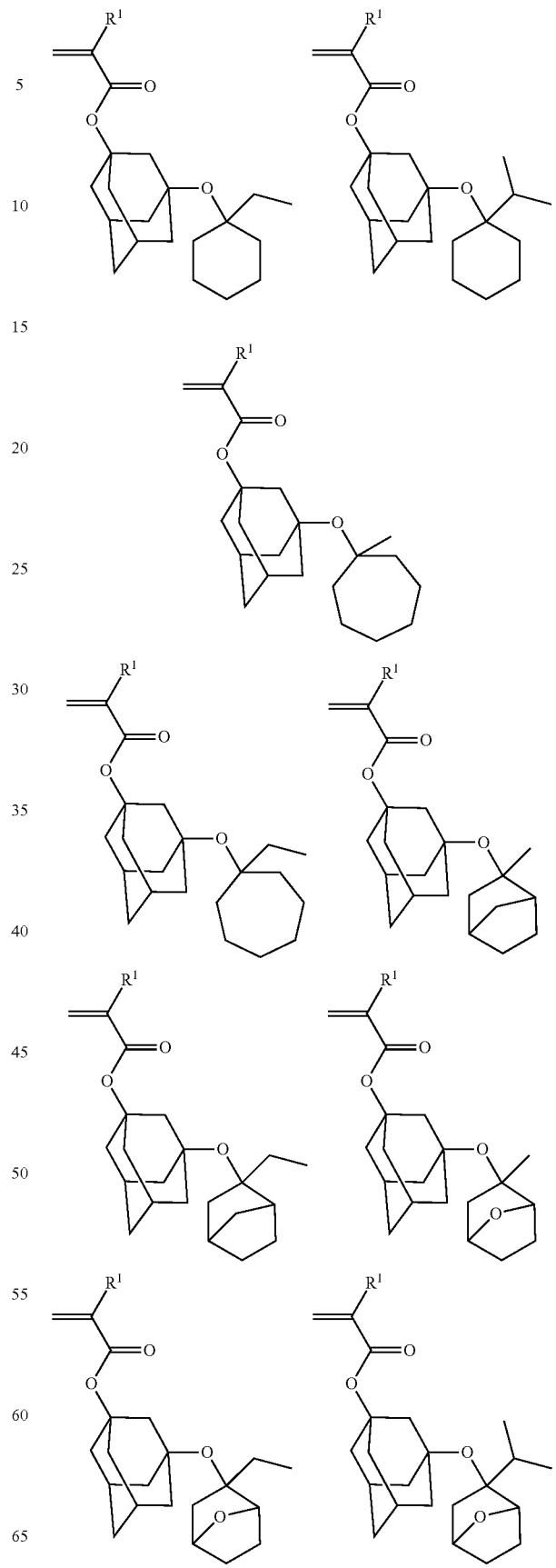

15
-continued
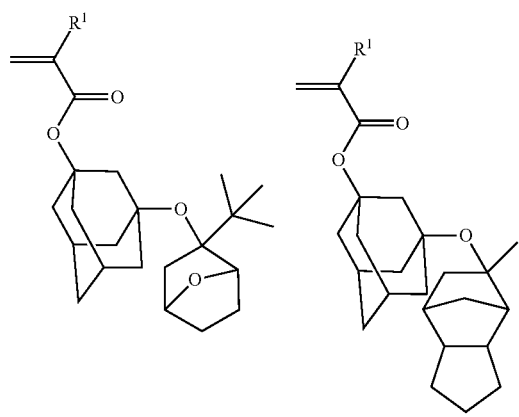
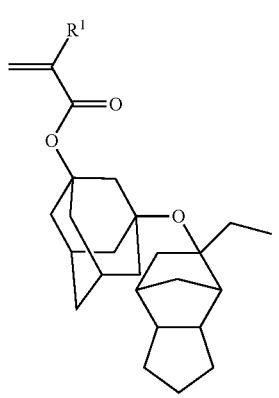
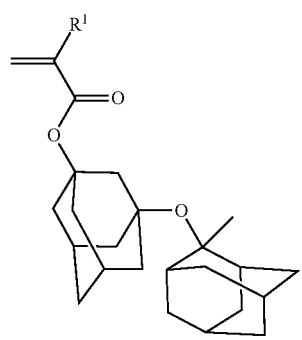
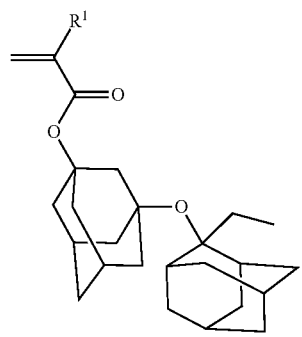
16
-continued
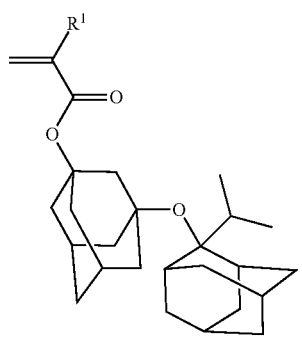
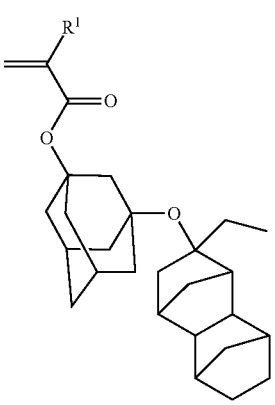
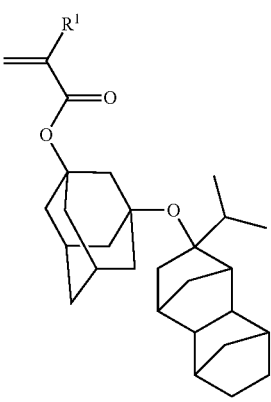
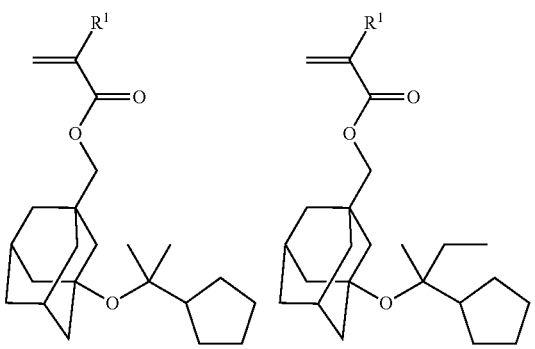

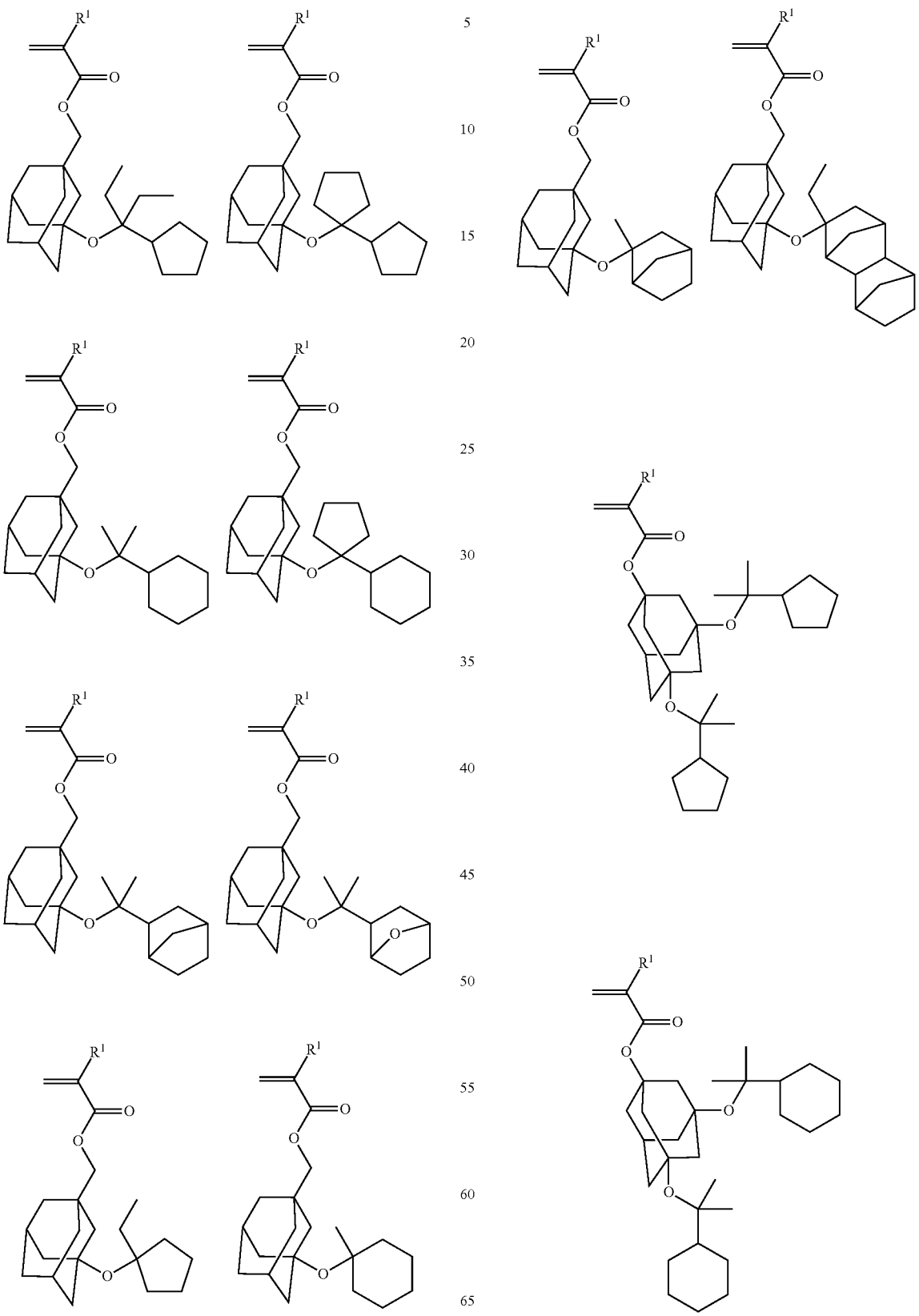

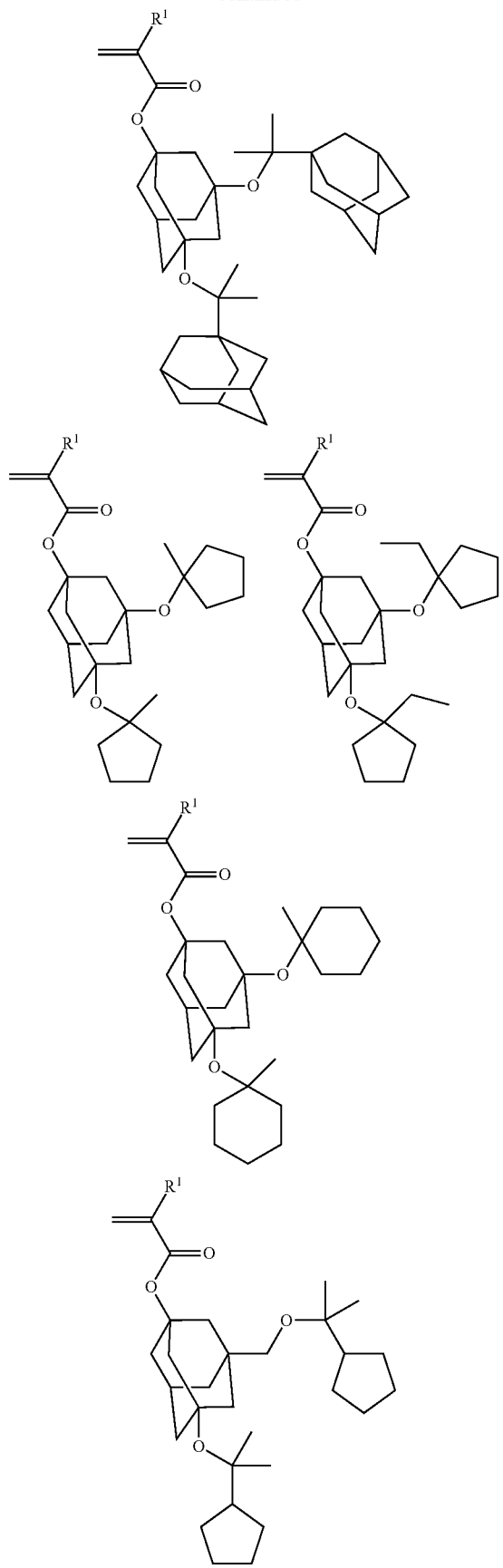
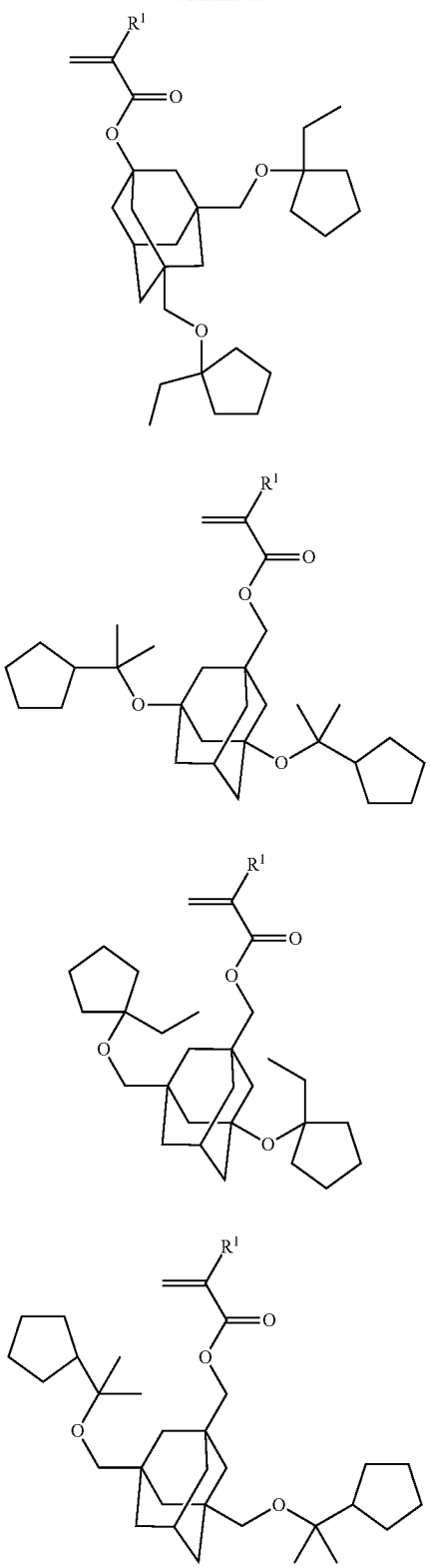
The monomer having formula (1) may be prepared by any well-known methods. Two exemplary methods are illustrated below although the synthesis route is not limited thereto. The first method proceeds through steps I and II according to the reaction scheme shown below.

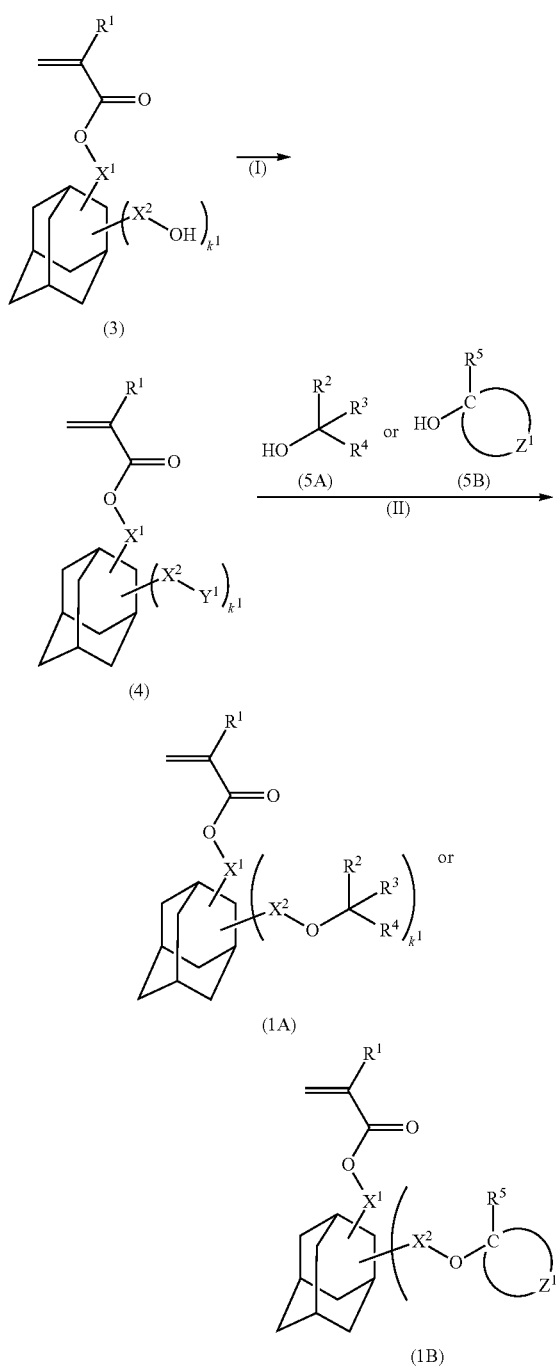

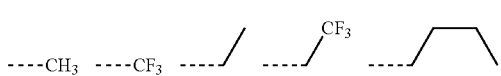

Herein $R^1$ to $R^5$, $X^1$, $X^2$, $Z^1$, and $k^1$ are as defined above. $Y^1$ is chlorine, bromine or —$OSO_2R^6$ group. $R^6$ is a straight, branched or cyclic $C_1$-$C_{15}$ alkyl or aryl group optionally substituted with a heteroatom.

When $Y^1$ is –$OSO_2R^6$ group, examples of the optionally substituted, straight, branched or cyclic $C_1$-$C_{15}$ alkyl or aryl group represented by $R^6$ are given below.

Notably, the broken line denotes a valence bond. Most preferably $R^6$ is methyl.

The first method for the synthesis of a monomer having formula (1) is now described in detail. Step I is to invert hydroxyl group on an alcohol compound (3) to leaving group $Y^1$ to form a monomer precursor (4).

When $Y^1$ is —$OSO_2R^6$ group, alcohol compound (3) may be reacted with a sulfonylating agent such as methanesulfonyl chloride or p-toluenesulfonic acid hydrate under basic conditions to form a corresponding sulfonate. The reaction may be conducted in a solventless system or in a solvent by adding alcohol compound (3), sulfonylating agent, and an aqueous solution of an organic or inorganic base in sequence or at the same time and optionally cooling or heating. Suitable solvents include methylene chloride, acetonitrile, toluene, xylene, hexane, tetrahydrofuran or diisopropyl ether. Suitable organic bases include triethylamine, pyridine and 4-dimethylaminopyridine, and suitable inorganic bases include sodium hydroxide, potassium hydroxide and potassium carbonate.

The amount of sulfonylating agent used widely varies with reaction conditions, but is desirably 1.0 to 5.0 moles, more desirably 1.0 to 2.0 moles when alcohol compound (3) wherein $k^1$=1 is used. The amount of base used widely varies with reaction conditions because sometimes the base itself also serves as the solvent. The base is desirably used in an amount of 1.0 to 20 moles per mole of alcohol compound (3). The reaction temperature is usually in a range of 0 to 50° C. It is desired for higher yields that the reaction time be determined by monitoring the progress of reaction by thin-layer chromatography (TLC) or gas chromatography (GC). The reaction time is usually about 30 minutes to about 40 hours. The precursor (4) may be recovered from the reaction mixture by ordinary aqueous work-up. If necessary, it can be purified by any standard technique such as distillation, recrystallization or chromatography.

Where precursor (4) is chloride or bromide (that is, formula (4) wherein leaving group $Y^1$ is chlorine or bromine), it may be obtained by any well-known procedure using a chlorinating agent such as thionyl chloride, phosphorus oxychloride or oxalyl chloride or a brominating agent such as phosphorus tribromide or phosphorus pentabromide.

When precursor (4) is derived from alcohol compound (3), a choice of leaving group $Y^1$ is arbitrary as mentioned above. However, the preferred leaving group $Y^1$ is sulfonate because the precursor is mostly available in high yields independent of the structure of alcohol compound (3).

Step II is to react the precursor (4) with an alcohol compound (5A) or (5B) under basic conditions to form inventive monomer (1). The reaction may run in a standard mode. The reaction may be conducted in a solventless system or in a solvent by adding precursor (4), alcohol compound (5A) or (5B), and an organic or inorganic base in sequence or at the same time and optionally cooling or heating. It is acceptable to use a metal alkoxide which is previously prepared by reacting alcohol compound (5A) or (5B) with a base (e.g., sodium hydride or n-butyl lithium). Suitable organic bases include triethylamine, N,N-diisopropylethylamine, pyridine, 4-dimethylaminopyridine, N,N-dimethylaniline and 1,5-diazabicyclo[5.4.0]undec-7-ene (DBU). Suitable inorganic bases include sodium hydroxide, potassium hydroxide and potassium carbonate. Examples of the solvent used herein include hydrocarbons such as toluene, xylene, hexane, and heptane, chlorinated solvents such as methylene chloride, chloroform, and dichloroethane, ethers such as diethyl ether, tetrahydrofuran, and dibutyl ether, nitriles such as acetonitrile, and aprotic polar solvents such as N,N-dimethylformamide, N,N-dimethylacetamide, N-methylpyrrolidone, and dimethyl sulfoxide, alone or in admixture. A choice is preferably made from those solvents having a boiling point of at least 100° C. since the reaction is conducted under heating.

The amount of alcohol compound (5A) or (5B) used widely varies with reaction conditions, but is desirably 1.0 to 30 moles, more desirably 1.0 to 10 moles when precursor (4) wherein $k^1=1$ is used. The amount of base used is typically 1.0 to 20 moles, preferably 1.0 to 5.0 moles when precursor (4) wherein $k^1=1$ is used. The reaction temperature is usually in a range of room temperature to 200° C., preferably 40 to 150° C. It is desired for higher yields that the reaction time be determined by monitoring the progress of reaction by thin-layer chromatography (TLC) or gas chromatography (GC). The reaction time is usually about 24 to about 170 hours. The monomer (1) may be recovered from the reaction mixture by ordinary aqueous work-up. If necessary, it can be purified by any standard technique such as distillation, recrystallization or chromatography.

The second method for the synthesis of monomer (1) is an addition reaction between an olefin corresponding to alcohol compound (5A) or (5B) from which water molecule is removed and alcohol compound (3) in the presence of an acid catalyst. The reaction may be conducted in a solventless system or in a solvent (e.g., toluene, hexane, methylene chloride or dichloromethane) by adding the olefin and alcohol compound (3) in the presence of acid catalyst and optionally cooling or heating. Suitable acid catalysts used herein include mineral acids such as hydrochloric acid, sulfuric acid, nitric acid, and perchloric acid, organic acids such as p-toluenesulfonic acid, benzenesulfonic acid, methanesulfonic acid, and trifluoroacetic acid, and solid acid catalysts such as Amberlyst®.

It is noted that JP 4631297 and JP-A 2011-197339 disclose structures containing a tertiary ether substituent group represented by the formula (1A) or (1B) defined herein, but describe nowhere the synthesis of those compounds wherein the hydroxyl group on hydroxyadamantane methacrylate and analogs is protected with an alicyclic-containing tertiary alkyl group, like the inventive monomers. It is unknown how to synthesize these compounds.

It is thus believed that the present invention first discloses, in a substantial sense, adamantane methacrylate derivatives whose alcoholic hydroxyl group is protected with an alicyclic-containing tertiary alkyl group. Also, the synthesis of these derivatives is first disclosed herein.

Polymer

In the second embodiment, the invention provides a polymer or high-molecular-weight compound comprising recurring units derived from the monomer of formula (1A) or (1B). Specifically, the recurring units derived from the monomer of formula (1A) or (1B) include units having the general formula (2A) or (2B). This unit or formula is simply referred to as unit (2) or formula (2) when it is unnecessary to discriminate these two formulae.

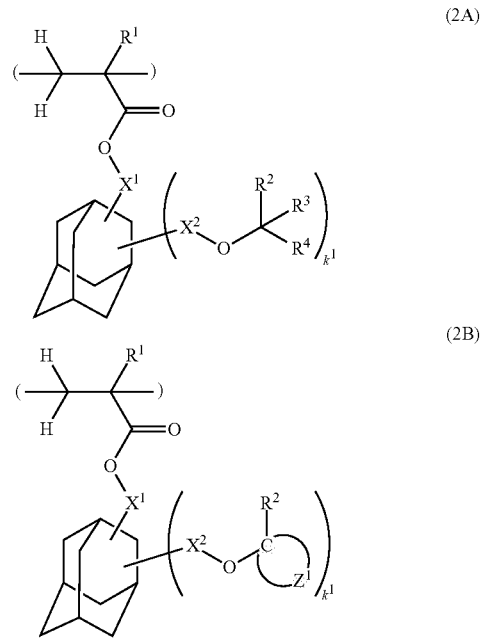

Herein $R^1$ to $R^5$, $X^1$, $X^2$, $Z^1$, and $k^1$ are as defined above.

In addition to the recurring units (2), the polymer of the invention may further comprise recurring units (b) having an acid labile group-substituted carboxyl group as represented by the following formula.

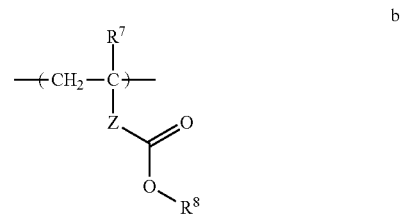

Suitable monomers Mb from which recurring units (b) are derived have the following formula.

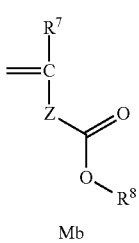

Herein $R^7$ is hydrogen or methyl, $R^8$ is an acid labile group, and Z is a single bond or —C(=O)—O—$R^9$— wherein $R^9$ is a straight, branched or cyclic $C_1$-$C_{10}$ alkylene group which may contain an ether, ester, lactone or hydroxyl radical, or a naphthylene group.

Examples of the monomers Mb having different Z structures are given below wherein $R^7$ and $R^8$ are as defined above.

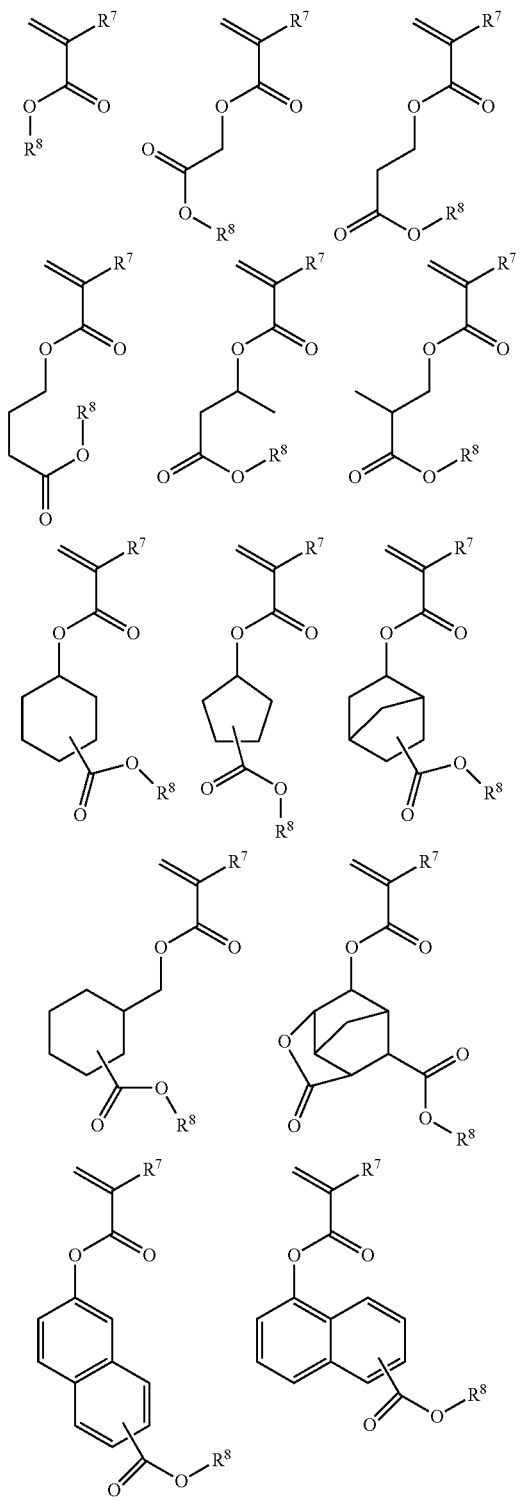

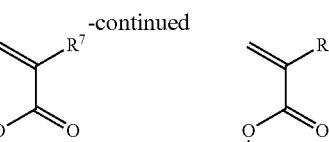

-continued

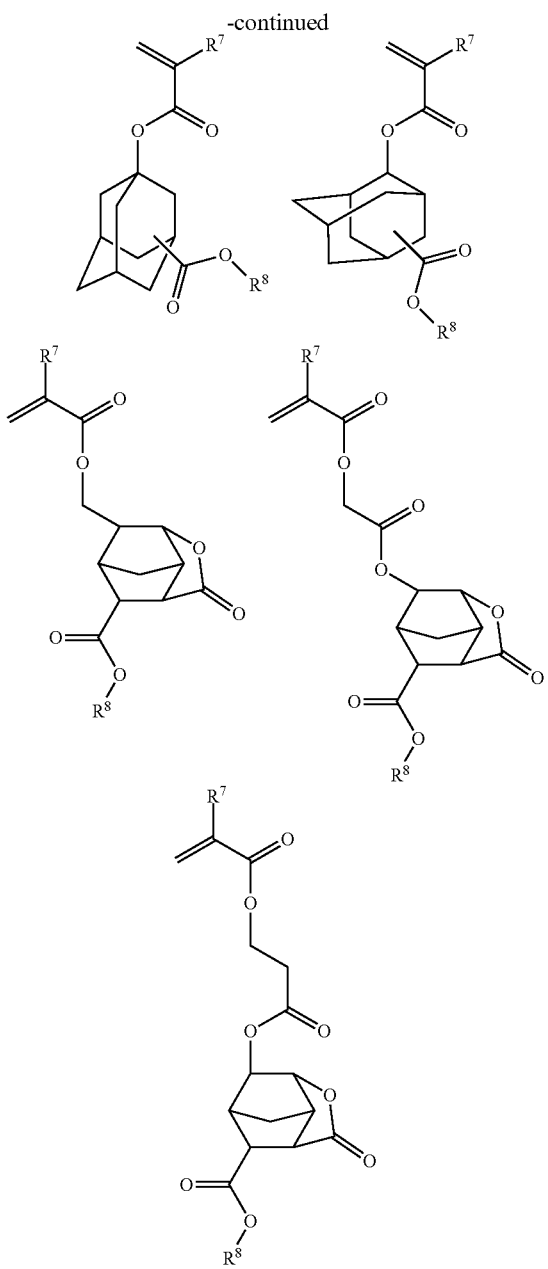

The acid labile group represented by $R^8$ may be selected from a variety of such groups. Suitable acid labile groups include groups of the following formulae (AL-10) and (AL-11), tertiary alkyl groups of the following formula (AL-12), and oxoalkyl groups of 4 to 20 carbon atoms, but are not limited thereto.

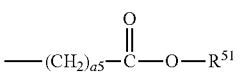 (AL-10)

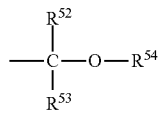 (AL-11)

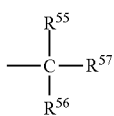 (AL-12)

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

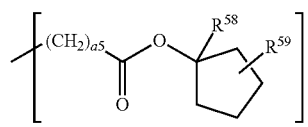 (AL-10)-1

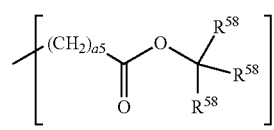 (AL-10)-2

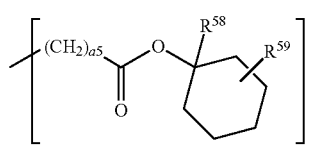 (AL-10)-3

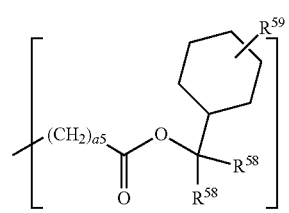 (AL-10)-4

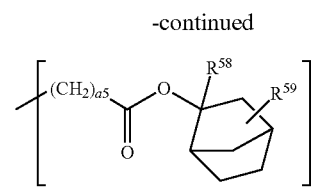 (AL-10)-5

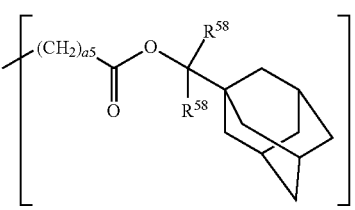 (AL-10)-6

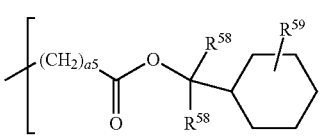 (AL-10)-7

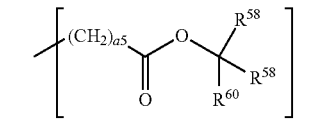 (AL-10)-8

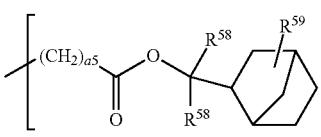 (AL-10)-9

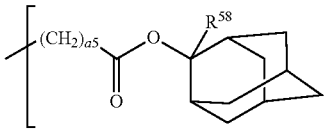 (AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{59}$ is a $C_6$-$C_{20}$ aryl group or $C_7$-$C_{20}$ aralkyl group; and "a5" is as defined above.

Illustrative examples of the acetal group of formula (AL-11) include those of the following formulae (AL-11)-1 to (AL-11)-34.

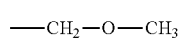 (AL-11)-1

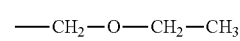 (AL-11)-2

 (AL-11)-3

 (AL-11)-4

 (AL-11)-5

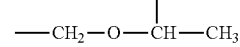 (AL-11)-6

(AL-11)-7 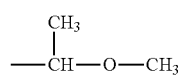
(AL-11)-8 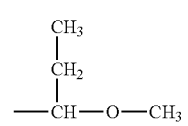
(AL-11)-9 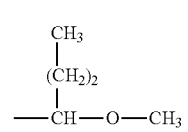
(AL-11)-10 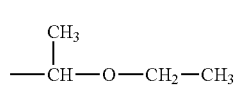
(AL-11)-11 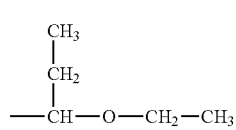
(AL-11)-12 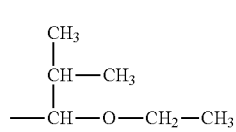
(AL-11)-13 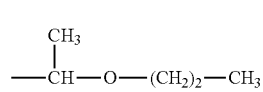
(AL-11)-14 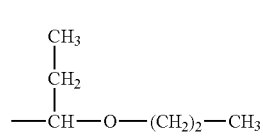
(AL-11)-15 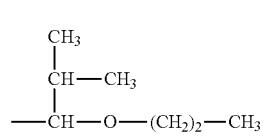
(AL-11)-16 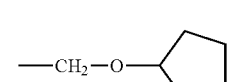
(AL-11)-17 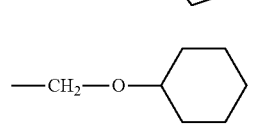
(AL-11)-18 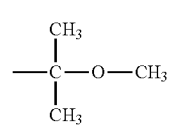
(AL-11)-19 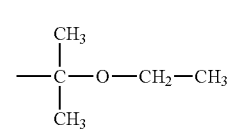
(AL-11)-20 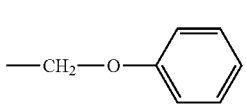
(AL-11)-21 
(AL-11)-22 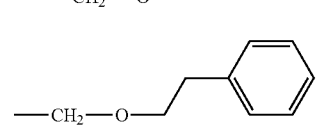
(AL-11)-23 
(AL-11)-24 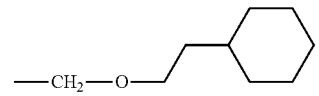
(AL-11)-25 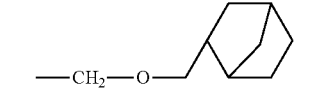
(AL-11)-26 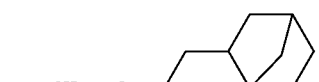
(AL-11)-27 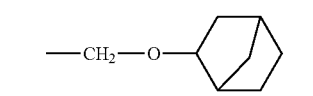
(AL-11)-28 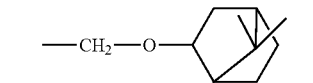
(AL-11)-29 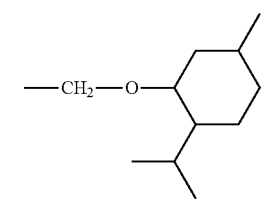
(AL-11)-30 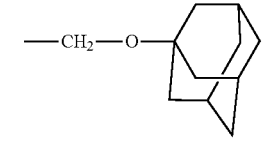
(AL-11)-31 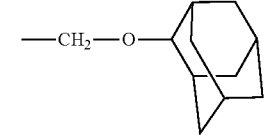
(AL-11)-32 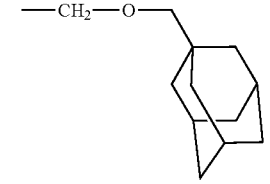

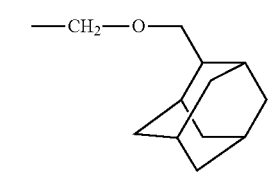
(AL-11)-33

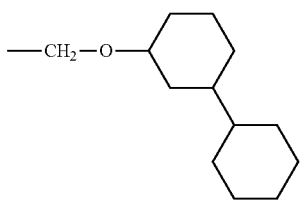
(AL-11)-34

Other examples of acid labile groups include those of the following formula (AL-11a) or (AL-11b) while the polymer may be crosslinked within the molecule or between molecules with these acid labile groups.

(AL-11a)

$$-\overset{R^{61}}{\underset{R^{62}}{C}}{+}O-R^{63}{\xrightarrow{b5}}O-A{+}O{+}R^{63}-O{\xrightarrow{d5}}\overset{R^{61}}{\underset{R^{62}}{C}}-]_{c5}$$

(AL-11b)

$$-\overset{R^{61}}{\underset{R^{62}}{C}}-O-R^{63}-B-A{+}B{+}R^{63}-O{\xrightarrow{d5}}\overset{R^{61}}{\underset{R^{62}}{C}}-]_{c5}$$

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

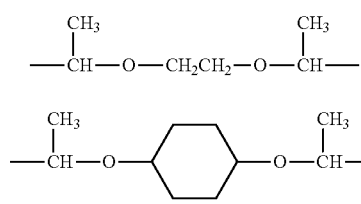
(AL-11)-35

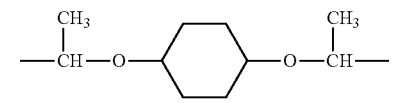
(AL-11)-36

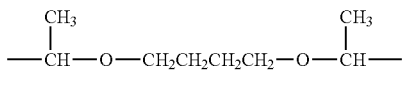
(AL-11)-37

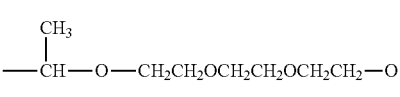
(AL-11)-38

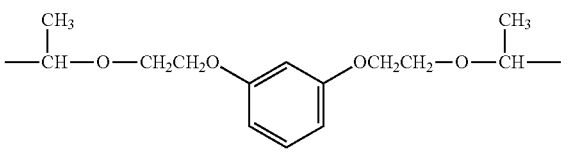
(AL-11)-39

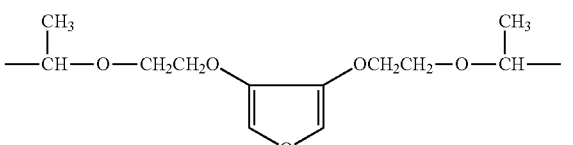
(AL-11)-40

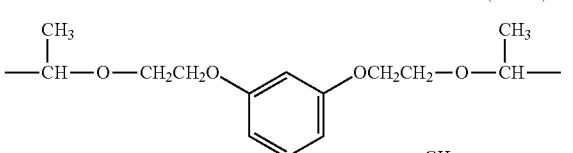
(AL-11)-41

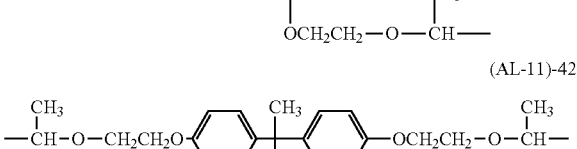
(AL-11)-42

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

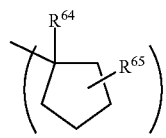
(AL-12)-1

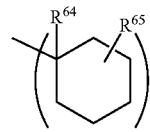
(AL-12)-2

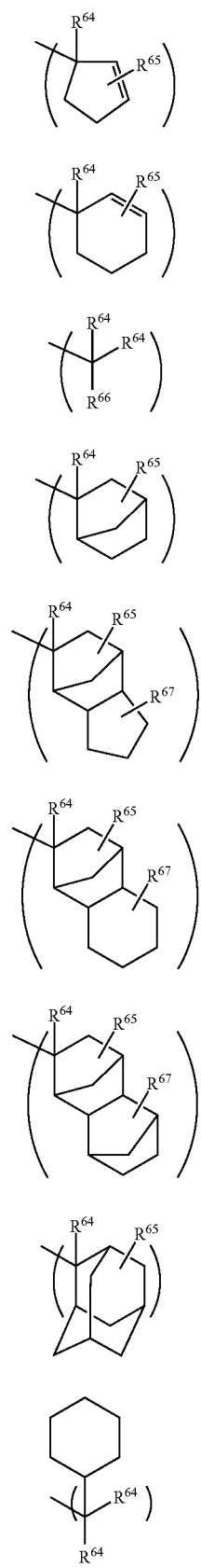

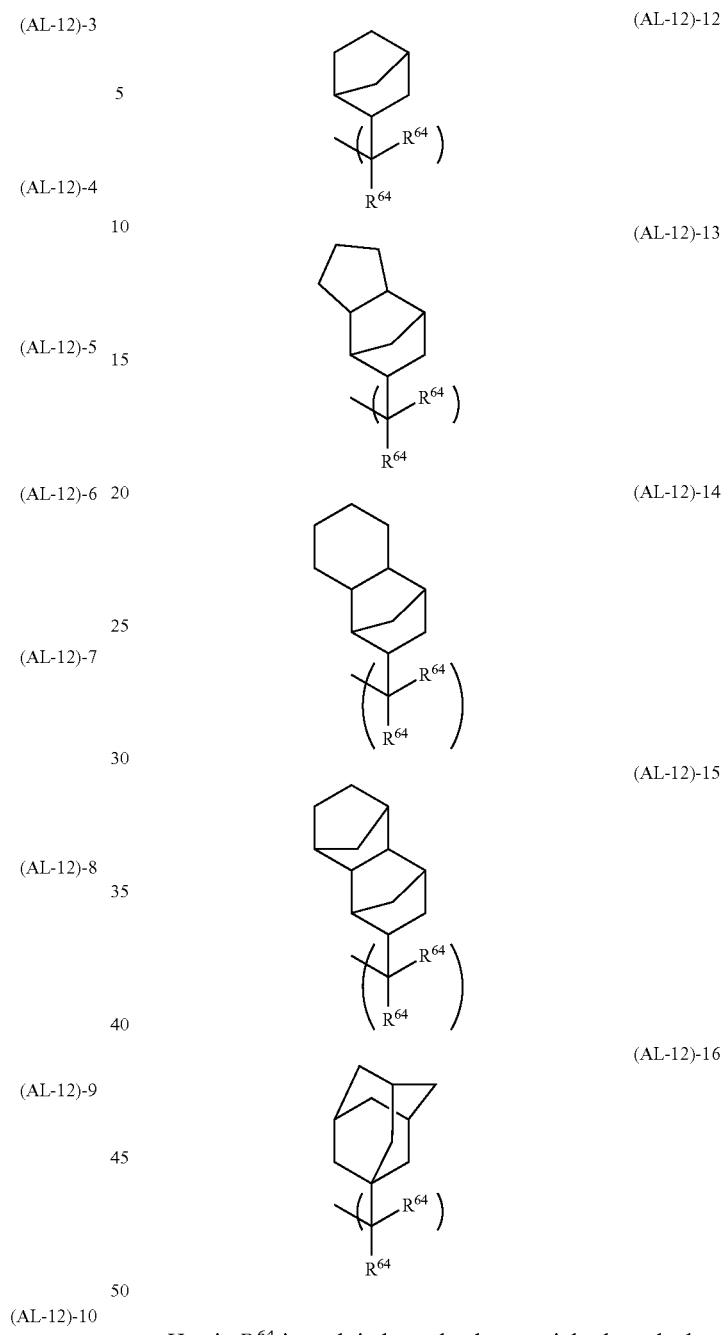

Herein $R^{64}$ is each independently a straight, branched or cyclic $C_1$-$C_8$ alkyl group, $C_6$-$C_{20}$ aryl group or $C_7$-$C_{20}$ aralkyl group, two $R^{64}$ may bond together to form a ring; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formulae (AL-12)-17 and (AL-12)-18, the polymer may be crosslinked within the molecule or between molecules. In formulae (AL-12)-17 and (AL-12)-18, $R^{64}$ is as defined above, $R^{68}$ is a single bond, or a straight, branched or cyclic $C_1$-$C_{20}$ alkylene group or arylene group which may contain a heteroatom such as oxygen, sulfur or nitrogen, and b6 is an integer of 0 to 3.

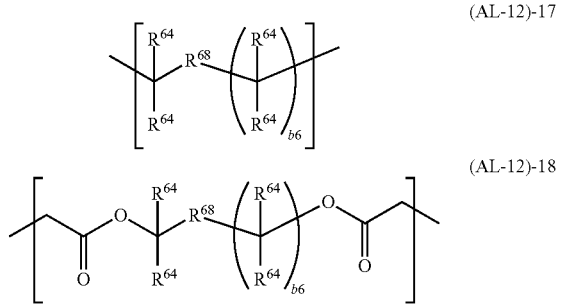

(AL-12)-17

(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

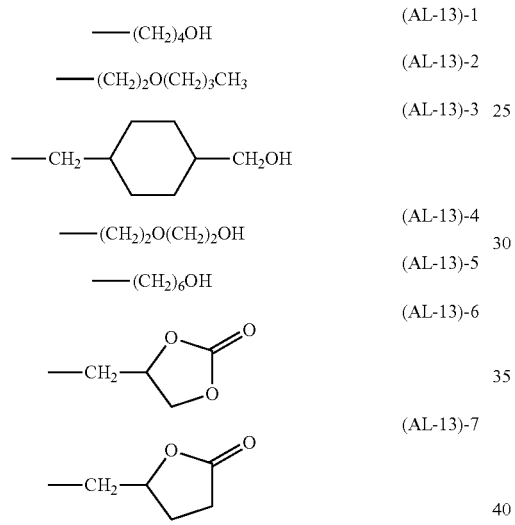

—(CH₂)₄OH    (AL-13)-1

—(CH₂)₂O(CH₂)₃CH₃    (AL-13)-2

(AL-13)-3

—(CH₂)₂O(CH₂)₂OH    (AL-13)-4

—(CH₂)₆OH    (AL-13)-5

(AL-13)-6

(AL-13)-7

As the acid labile group $R^8$, groups having an exo-form structure represented by the formula (AL-12)-19 are also preferred.

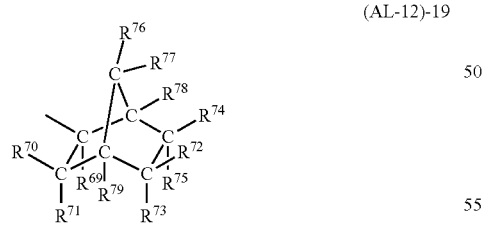

(AL-12)-19

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent $C_1$-$C_{15}$ hydrocarbon group, typically alkyl, which may contain a heteroatom; and $R^{76}$ and $R^{77}$ are hydrogen or a monovalent $C_1$-$C_{15}$ hydrocarbon group, typically alkyl, which may contain a heteroatom. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, specifically aliphatic ring, with the carbon atom(s) to which they are attached, and in this case, each ring-former R is a divalent $C_1$-$C_{15}$ hydrocarbon group, typically alkylene, which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633), with such recurring units being illustrated below.

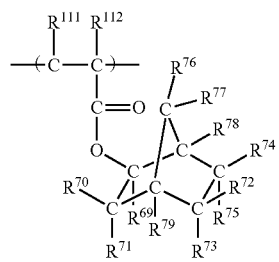

It is noted that $R^{111}$ and $R^{112}$ are each independently hydrogen, methyl, —COOCH₃, —CH₂COOCH₃ or the like. Illustrative non-limiting examples of suitable monomers are given below.

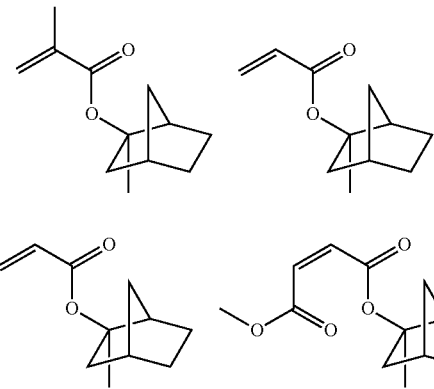

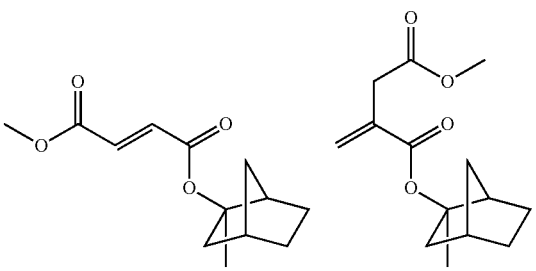

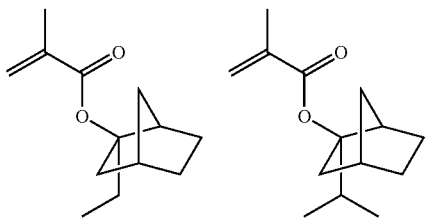

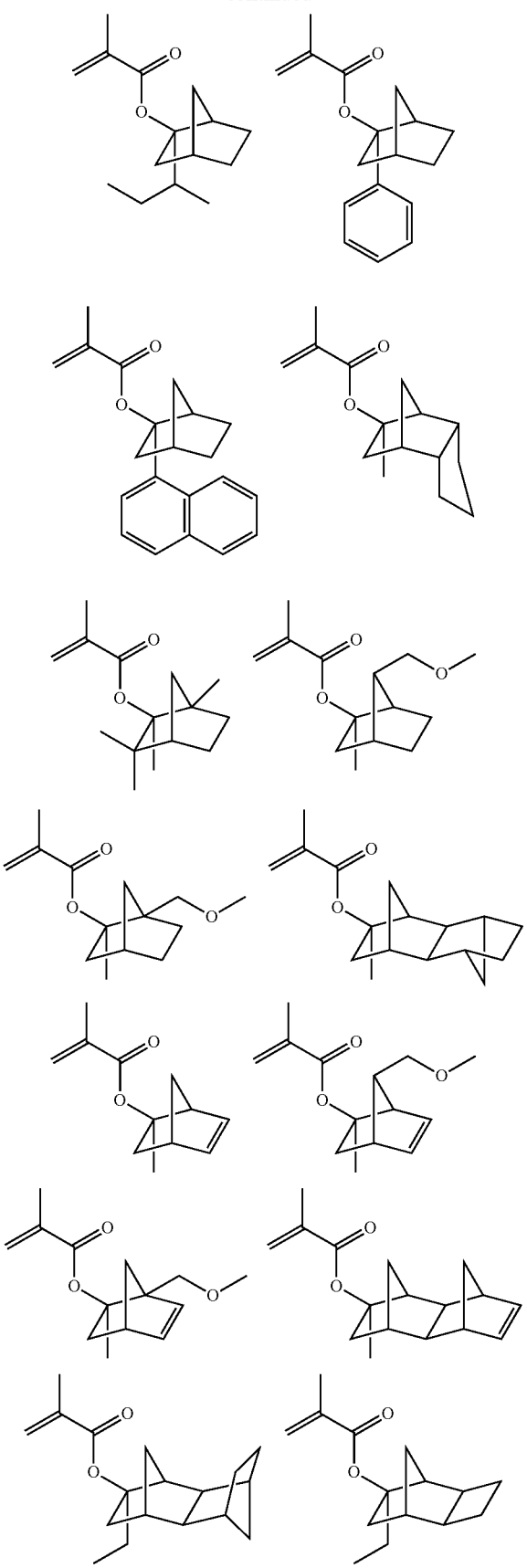

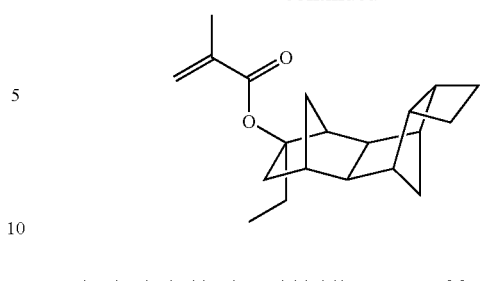

Also included in the acid labile groups of formula (AL-12) as $R^8$ are acid labile groups having furandiyl, tetrahydrofurandiyl or oxanorbornanediyl as represented by the following formula (AL-12)-20.

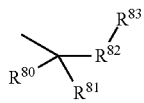

(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$ may bond together to form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

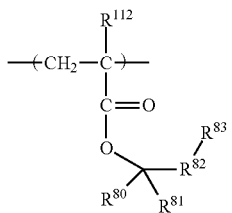

(wherein $R^{80}$ to $R^{83}$, and $R^{112}$ are as defined above) are derived are shown below. Note that Me is methyl and Ac is acetyl.

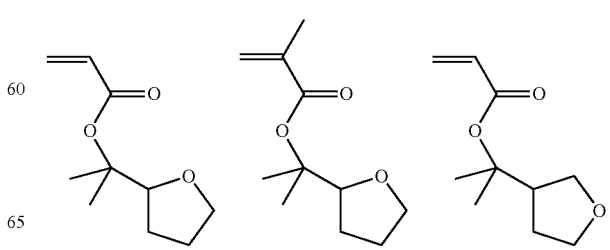

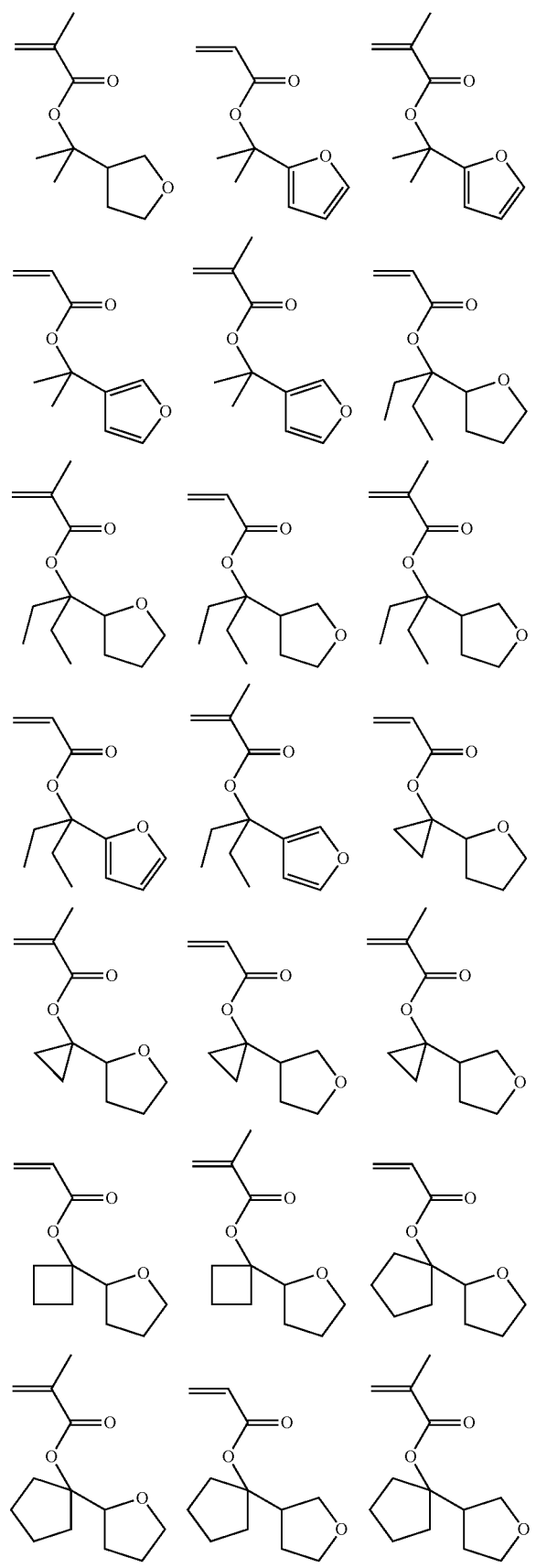
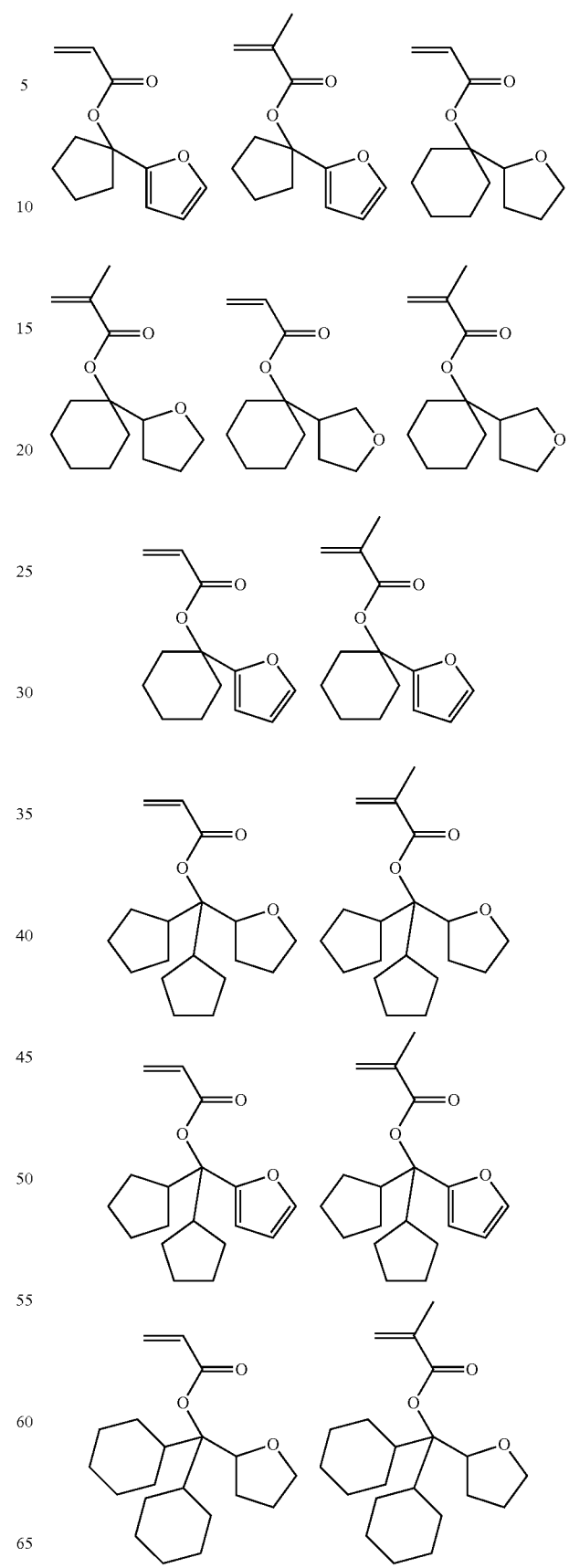

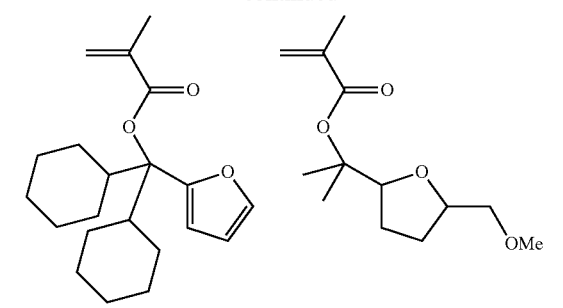
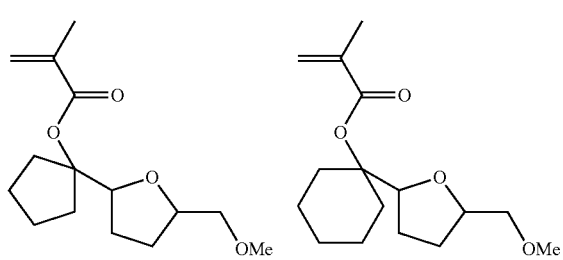
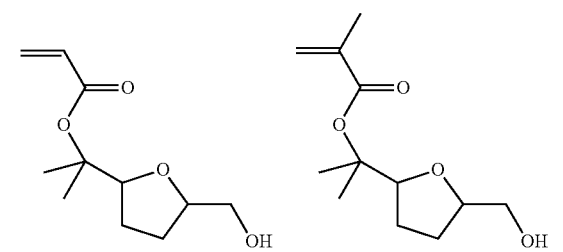
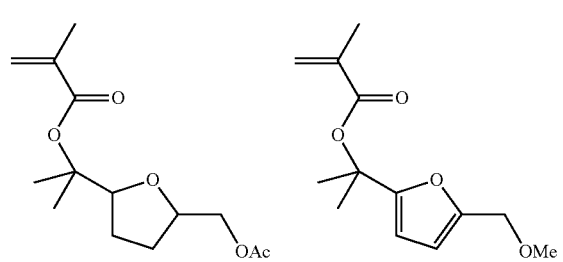
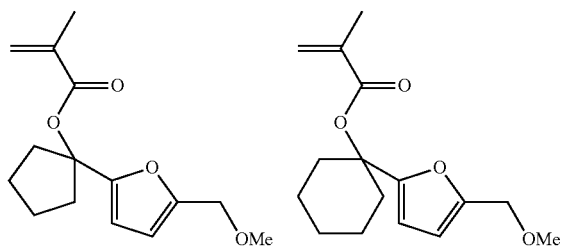
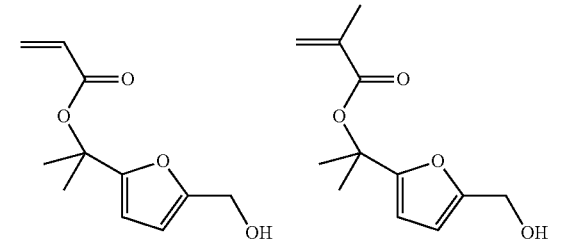

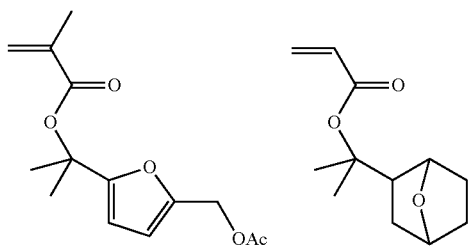
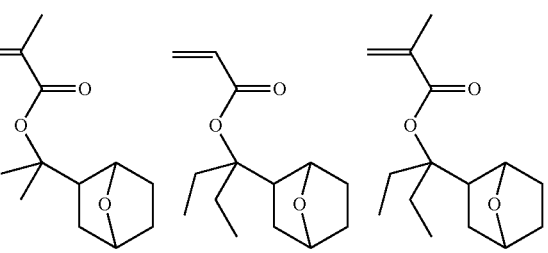
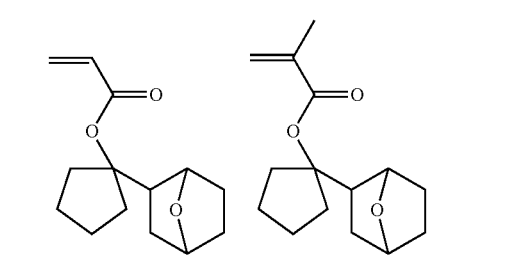
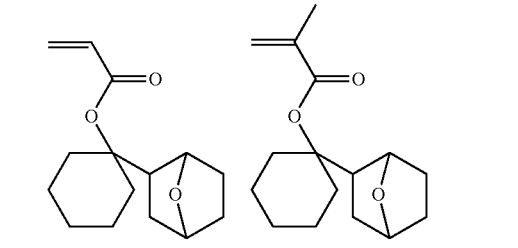

For convenience of description, the unit having formula (2) is designated unit (a). While the polymer used herein preferably includes recurring units (a) and optional recurring units (b), it may have further copolymerized therein recurring units (c) derived from monomers having an adhesive group such as hydroxyl, cyano, carbonyl, ester, ether, lactone, carboxyl, carboxylic anhydride, sulfonic acid ester, disulfone, and carbonate group. Inter alia, units having a lactone ring are most preferred for copolymerization.

Examples of monomers from which recurring units (c) are derived are given below.

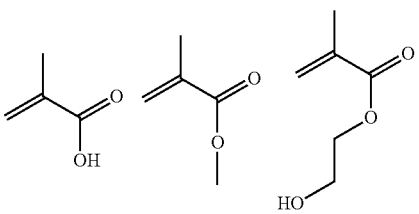

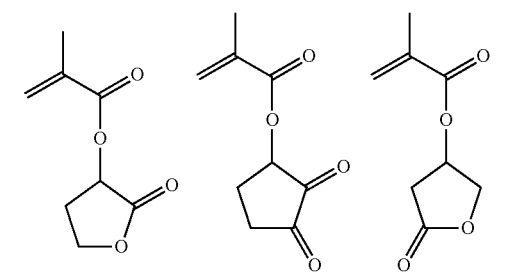
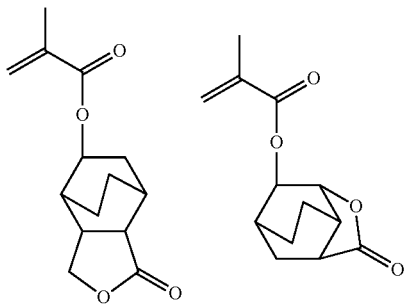
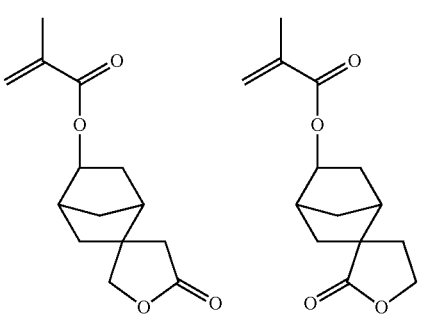
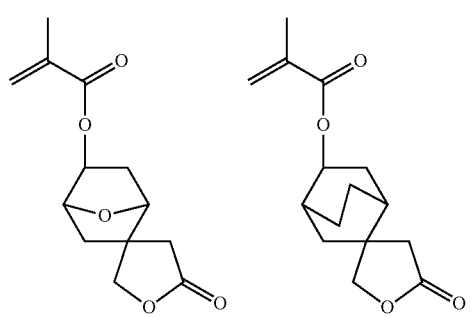
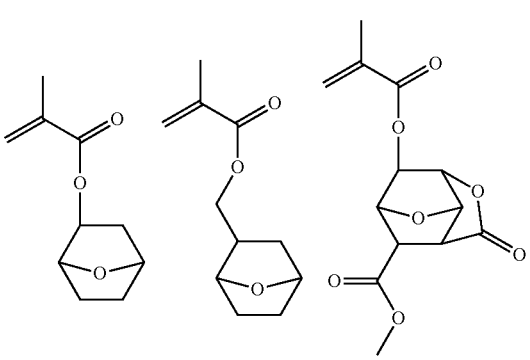
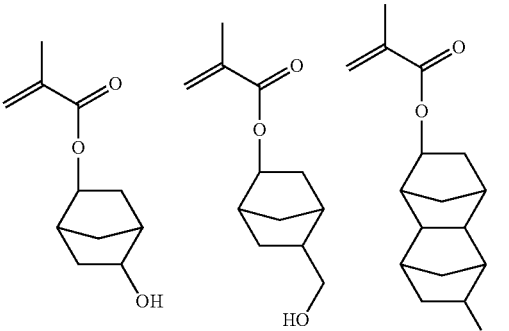
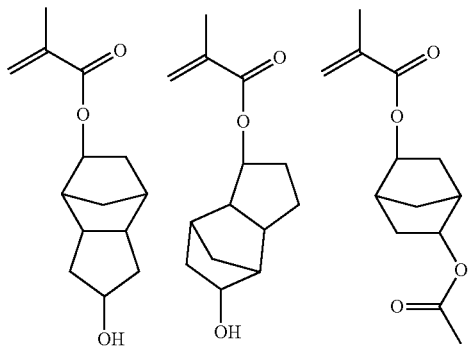

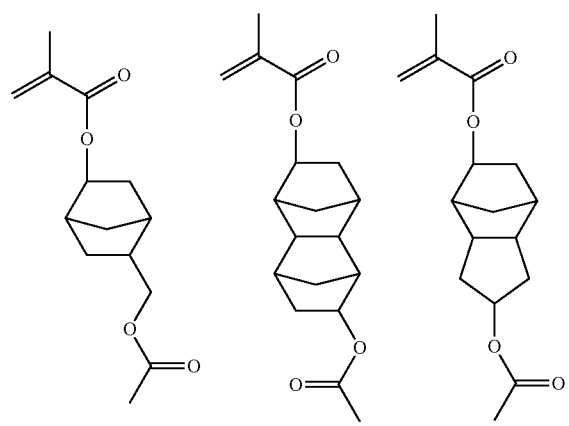
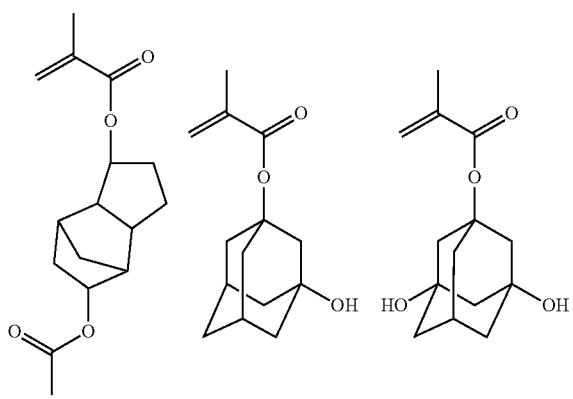
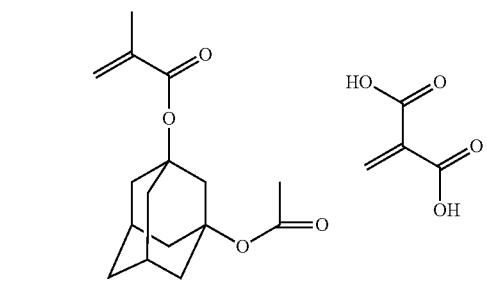
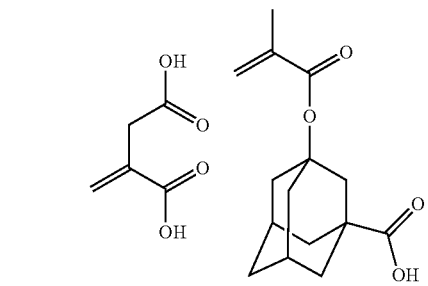
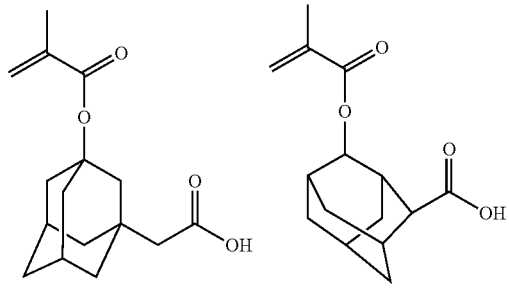
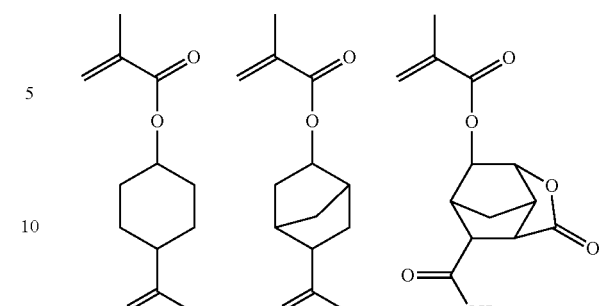
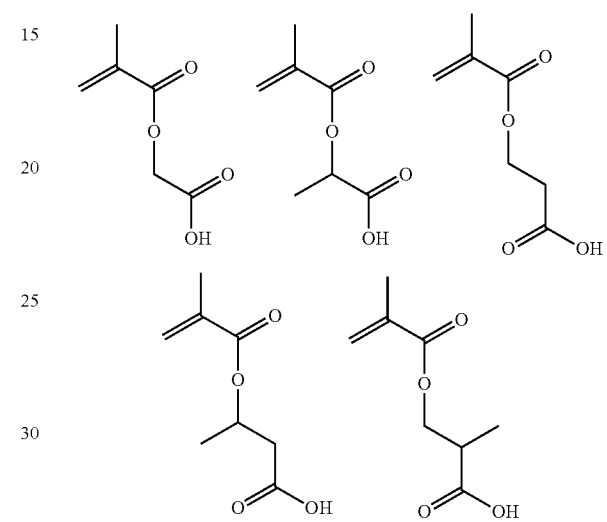
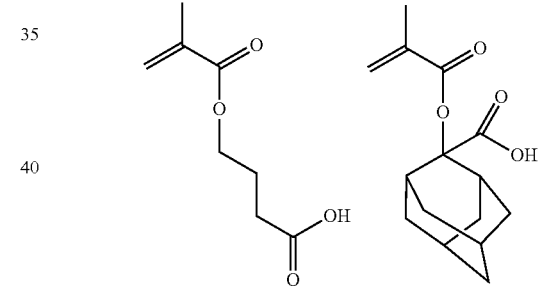
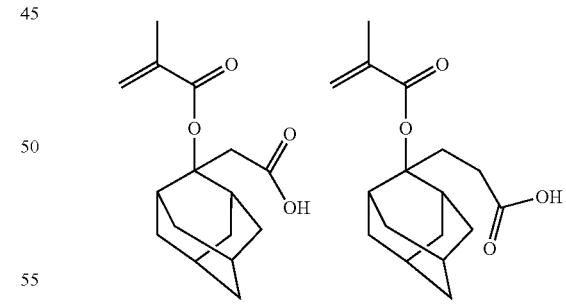
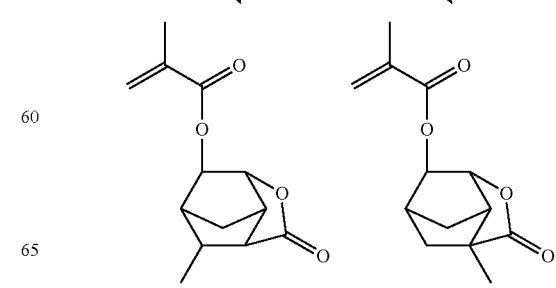

47
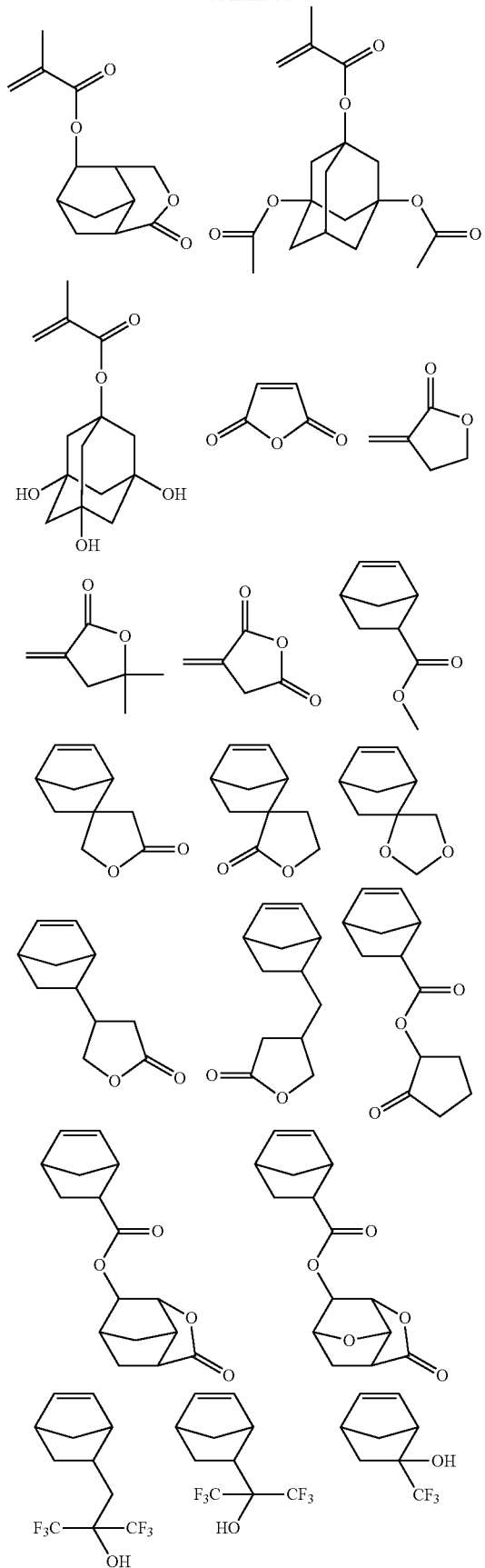
48
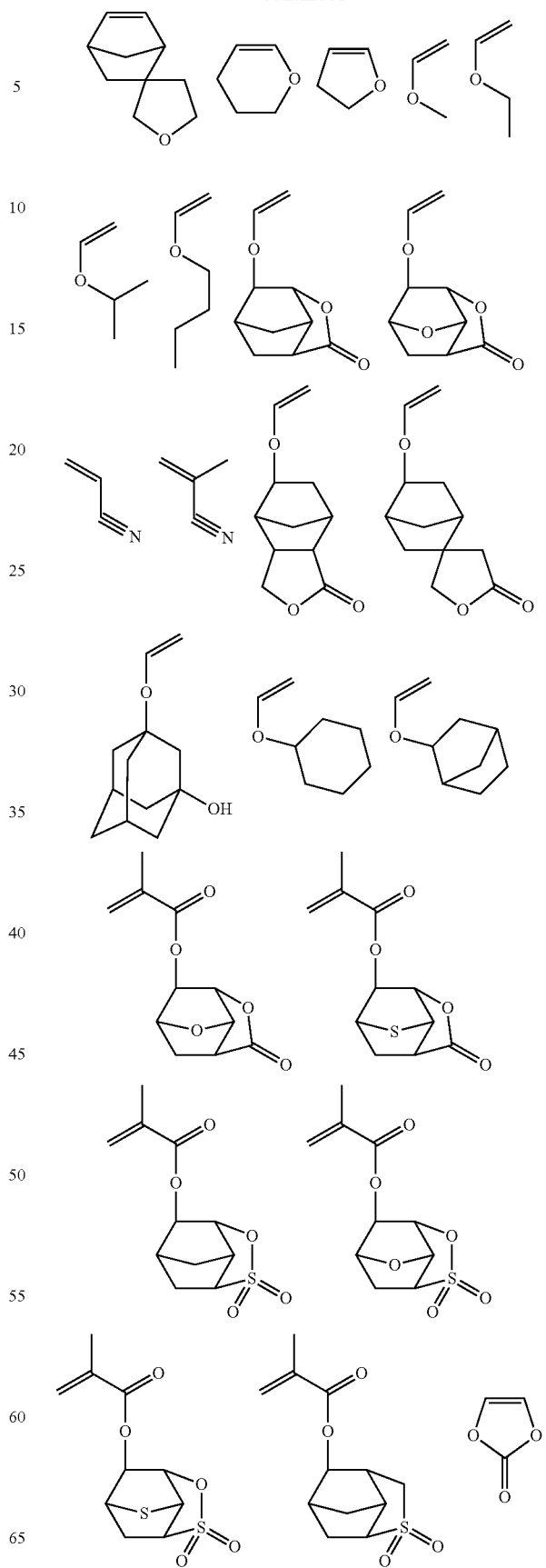

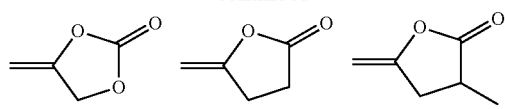
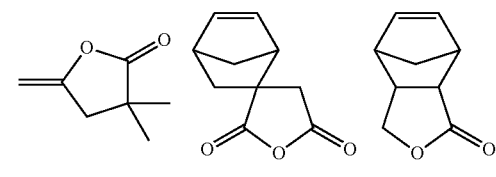
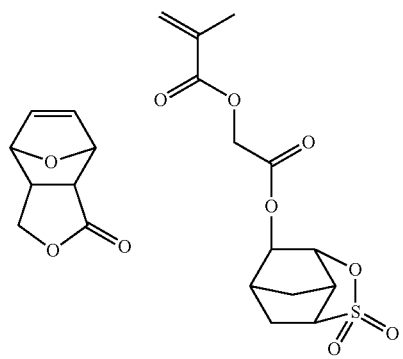
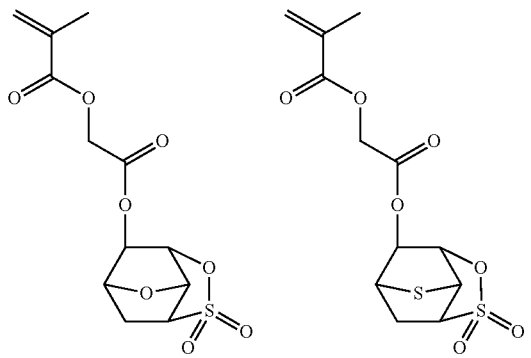
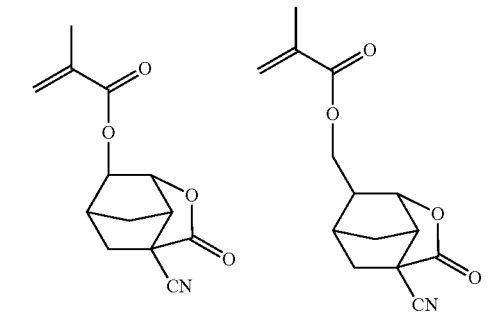
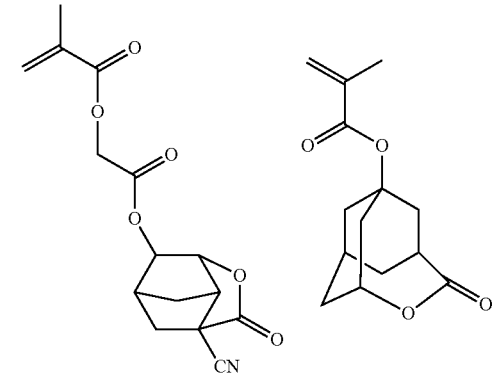
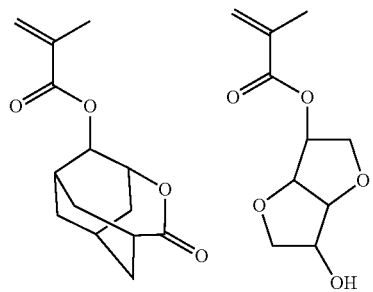
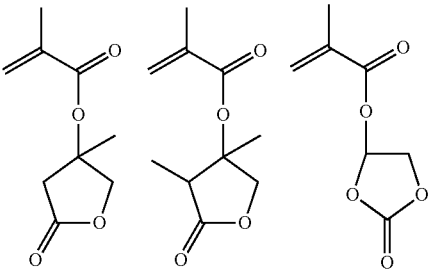
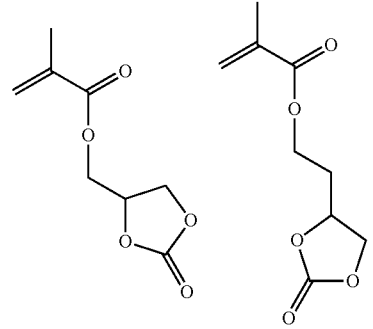
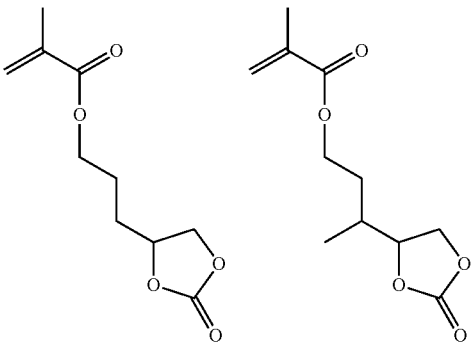
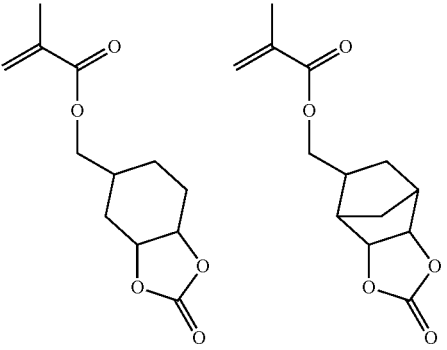

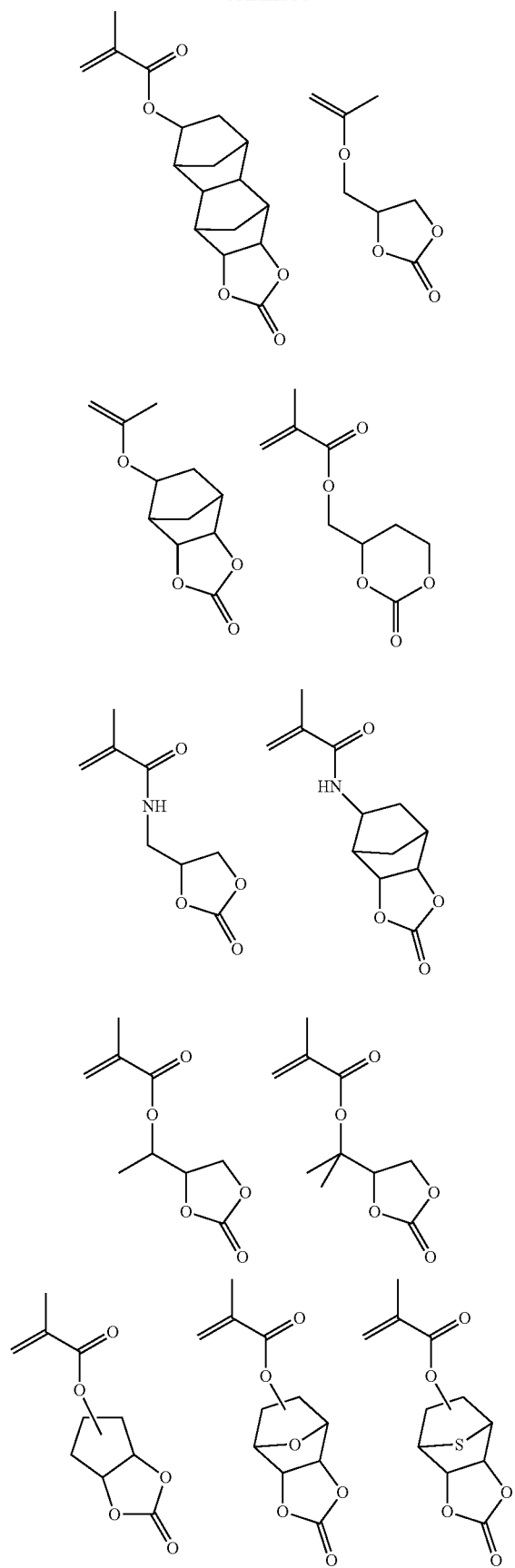
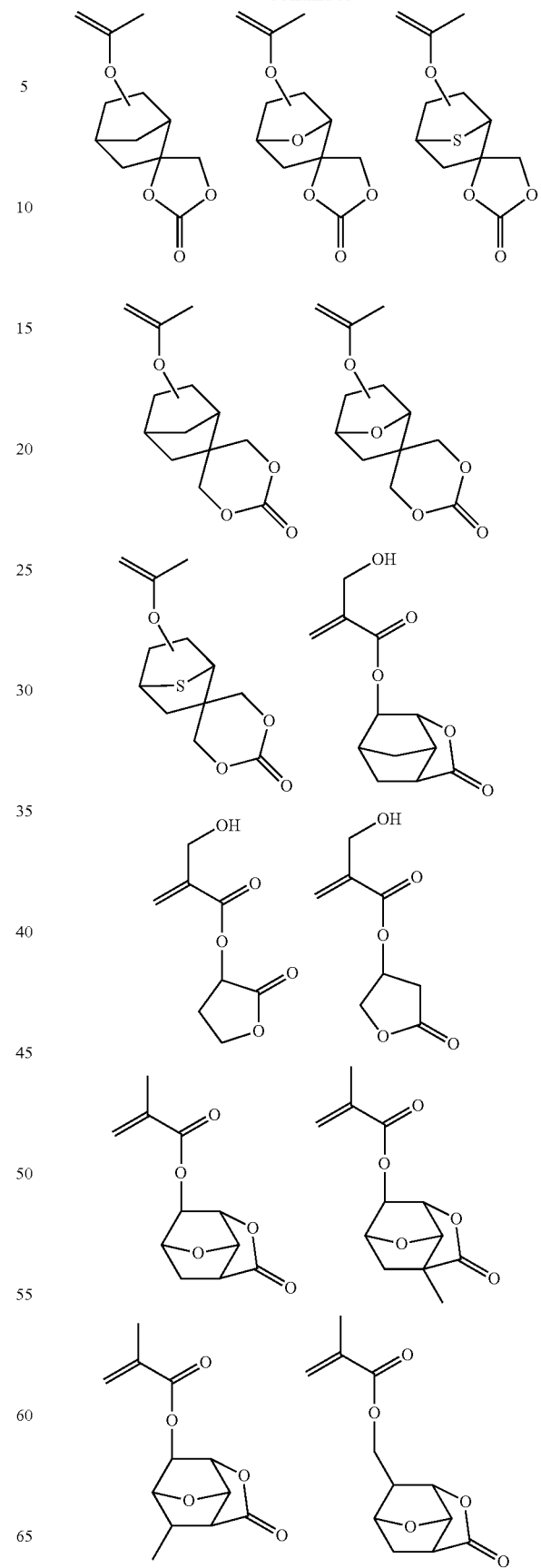

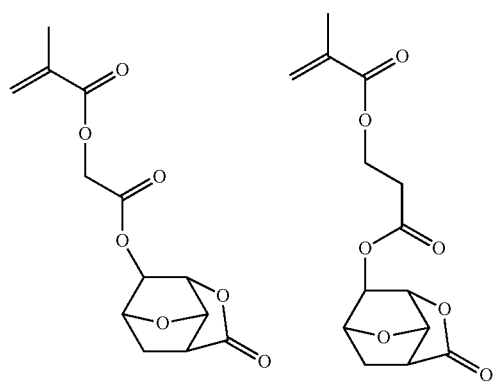
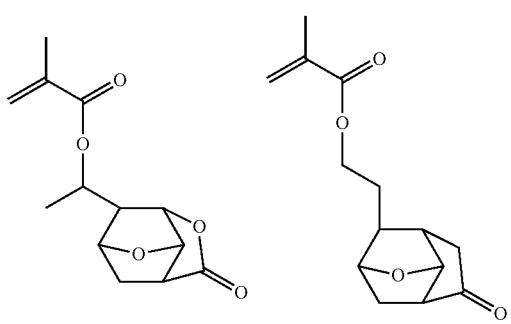
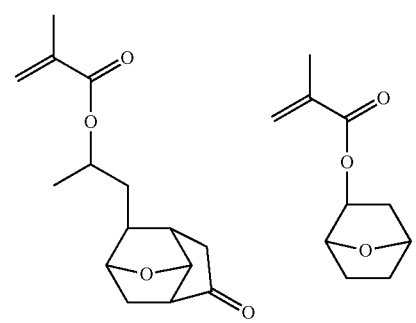
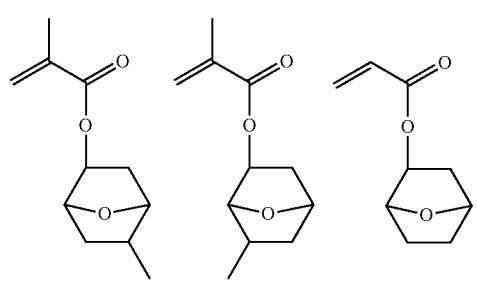
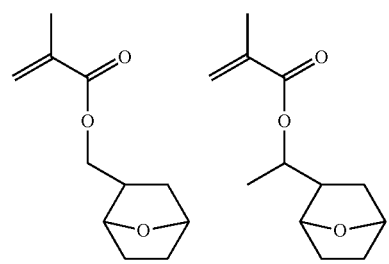
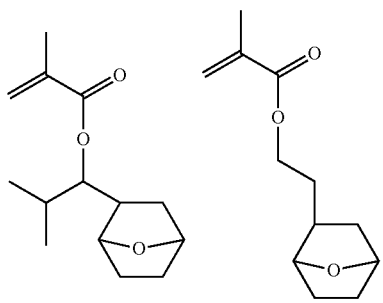
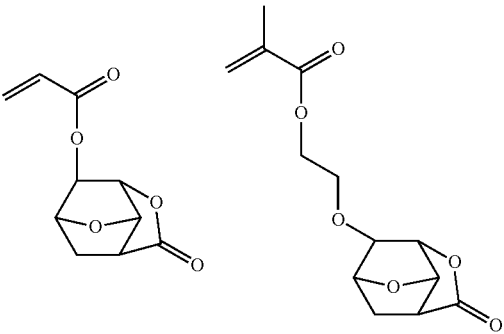
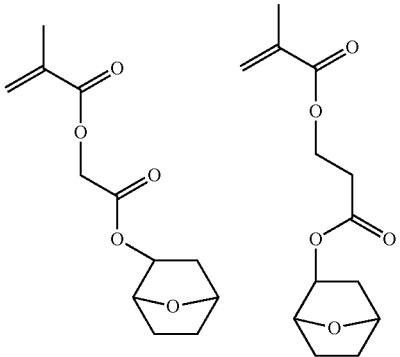
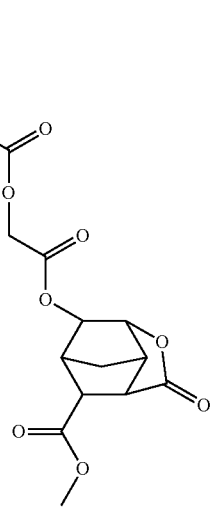

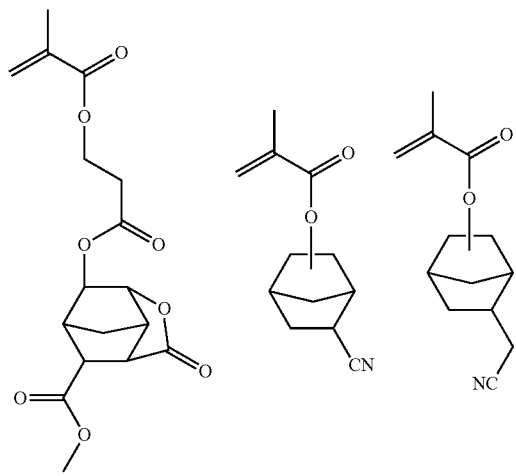
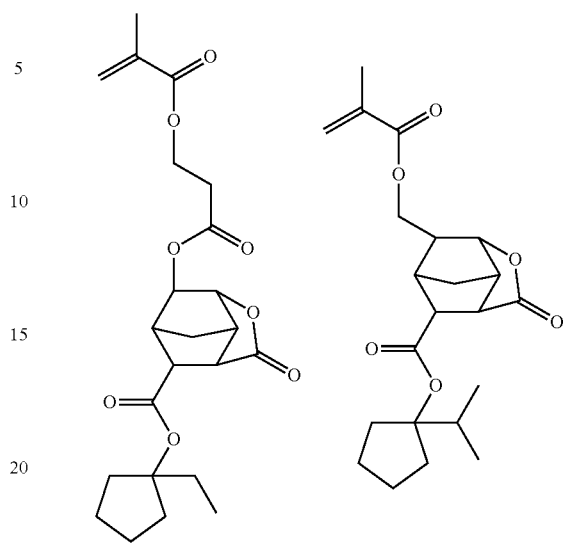
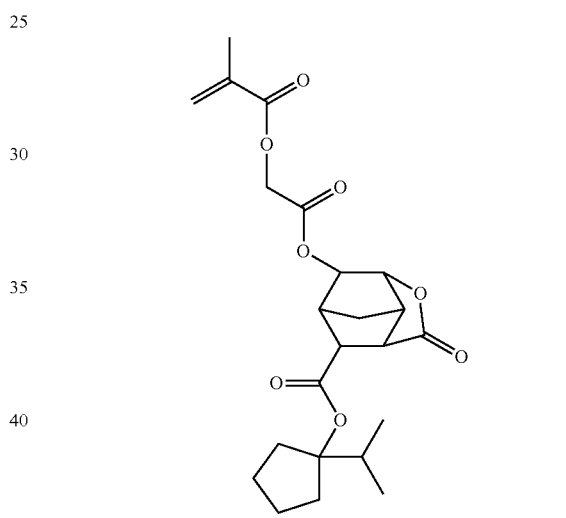
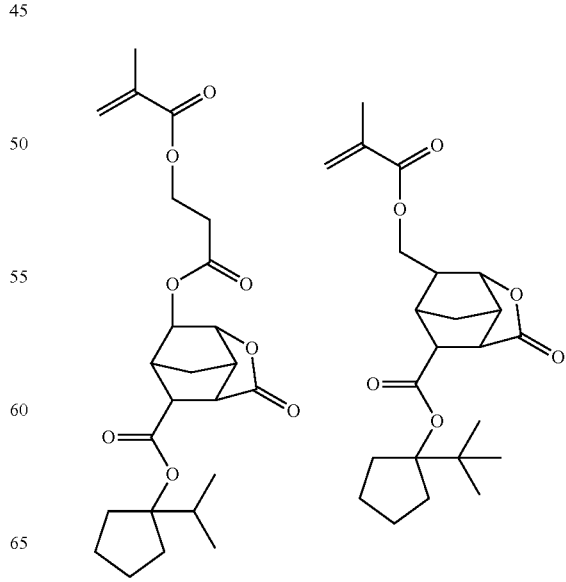

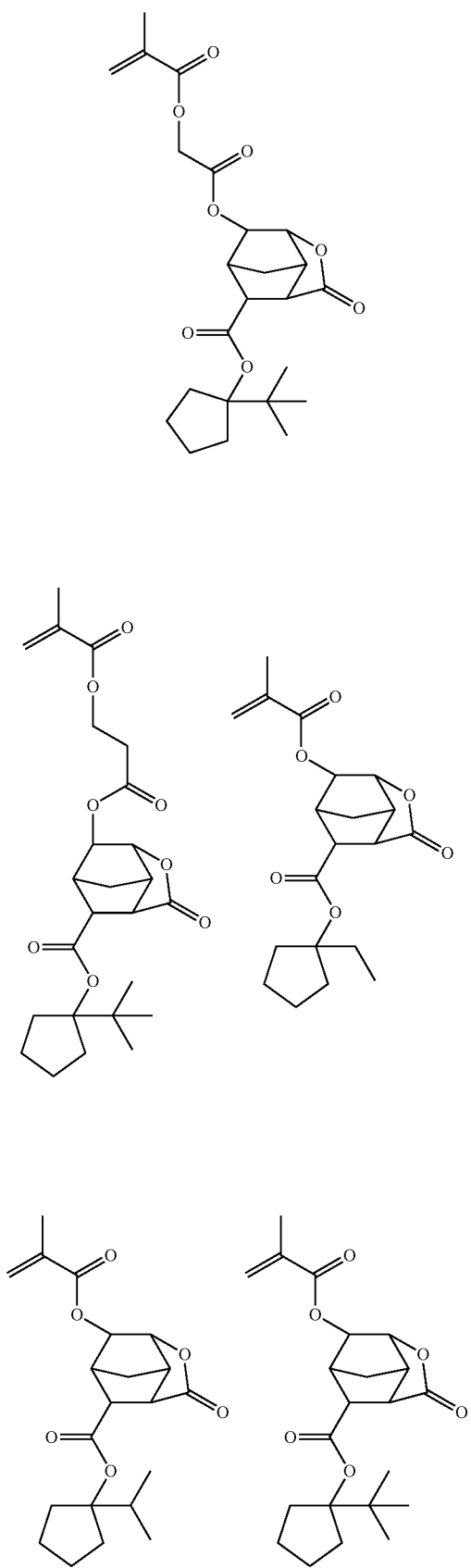

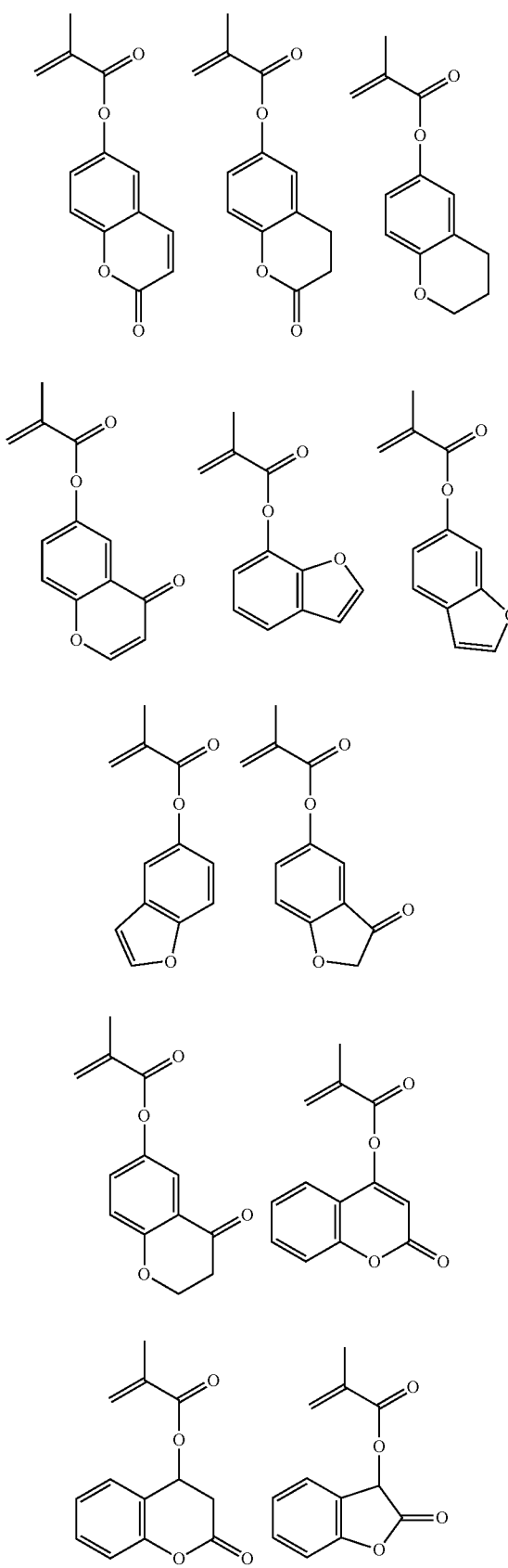
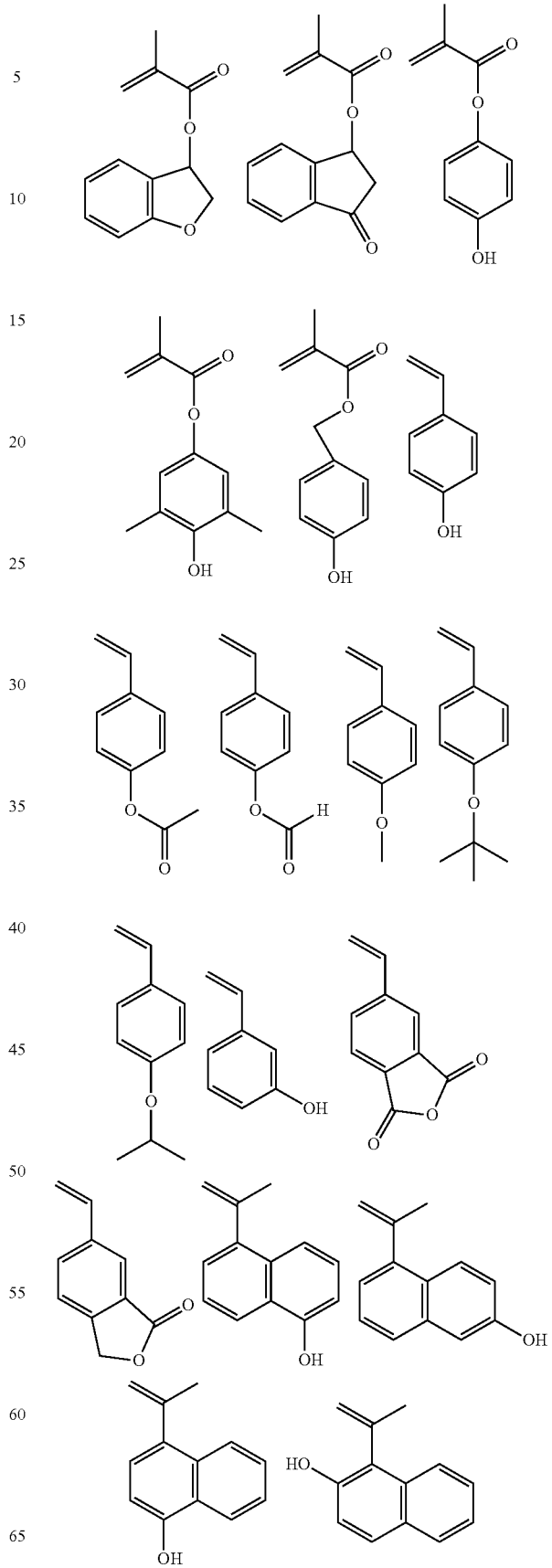

61
-continued
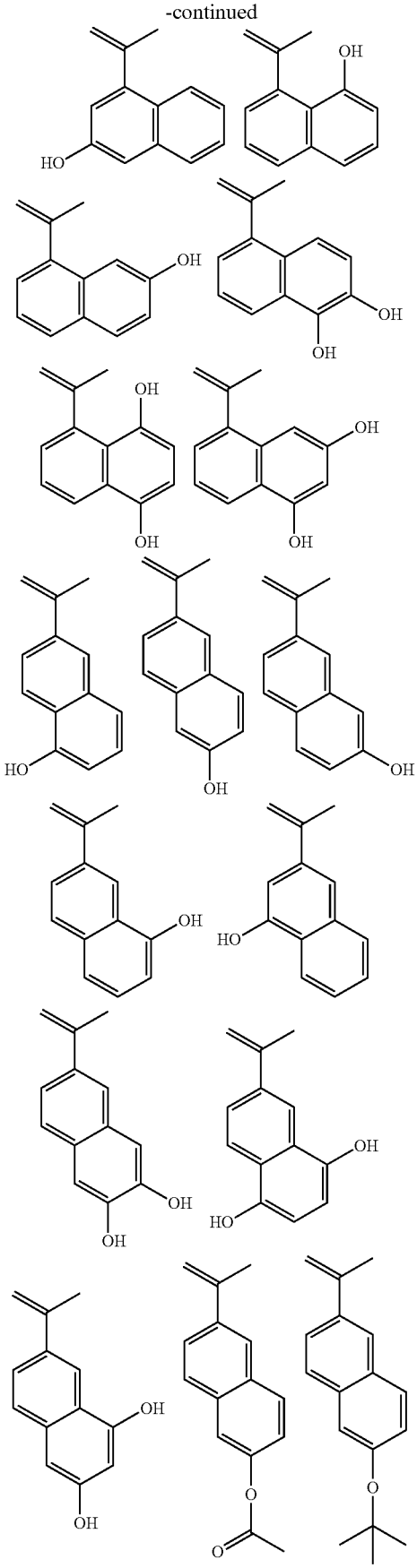
62
-continued
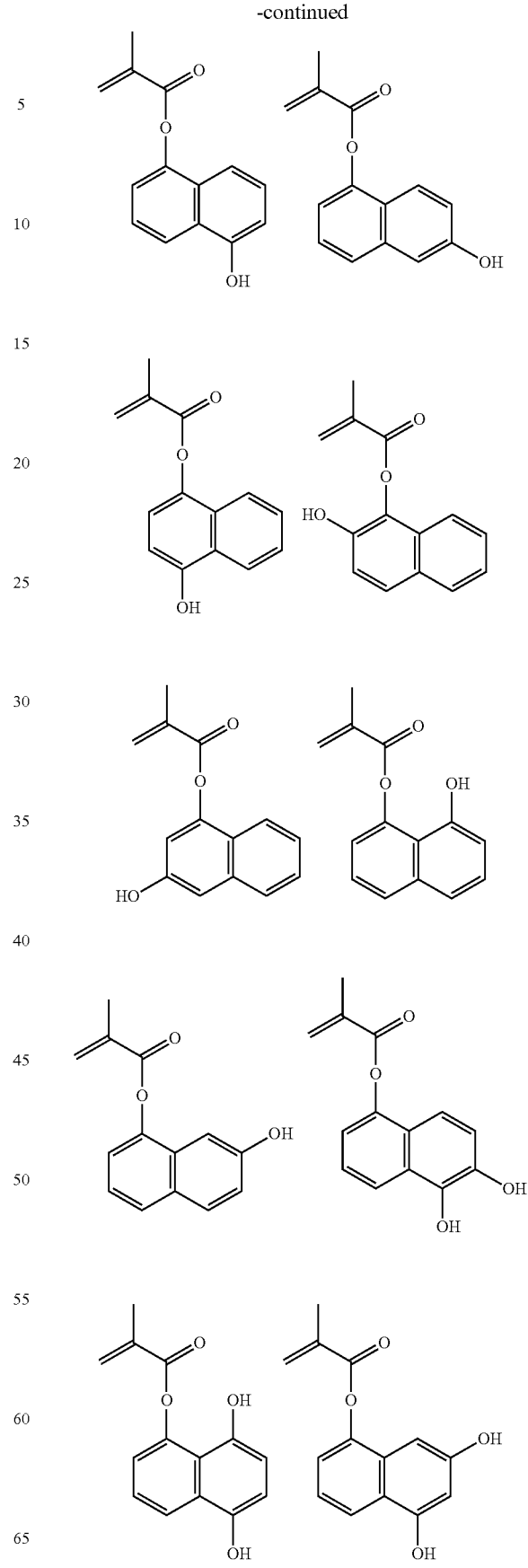

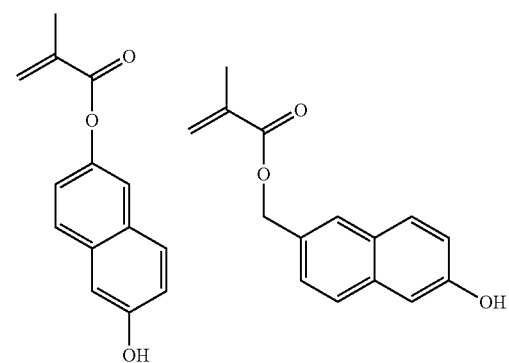
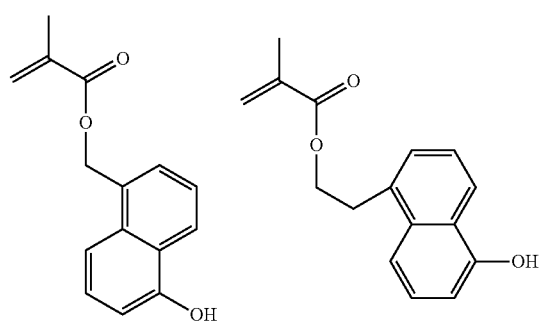
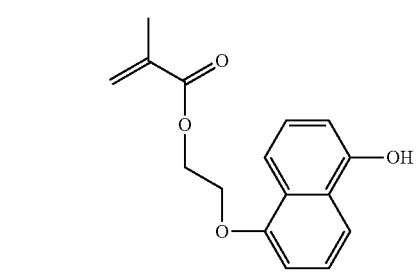
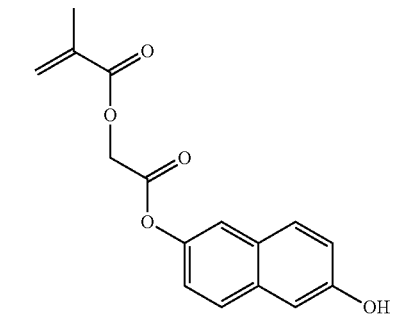
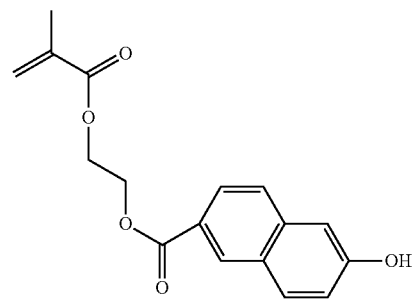
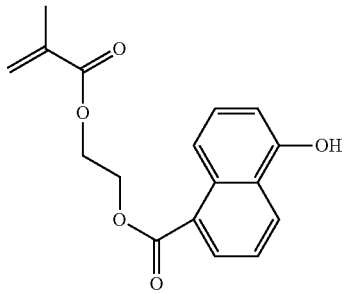
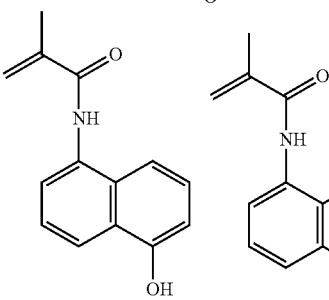
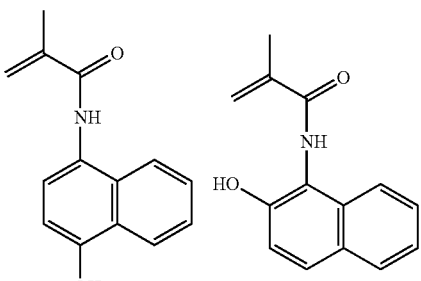
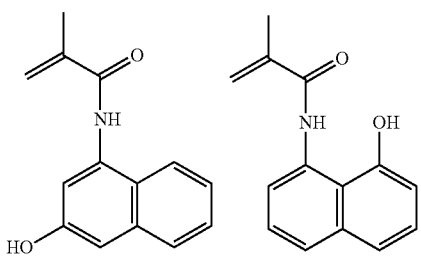
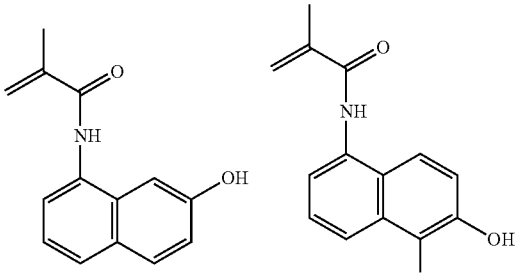
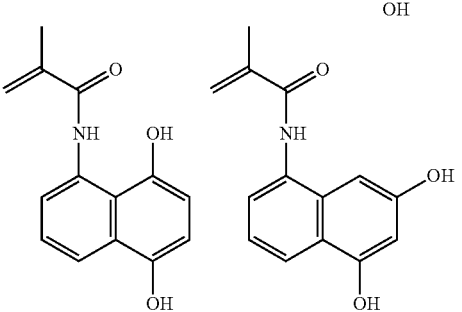

-continued
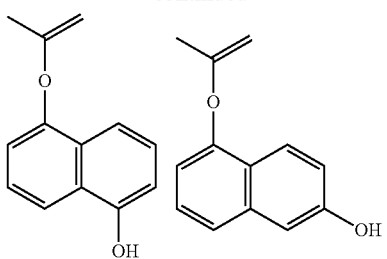
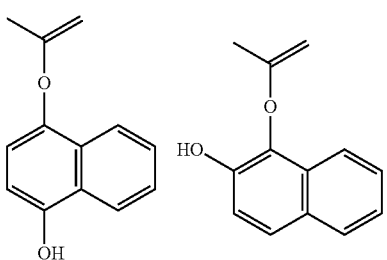
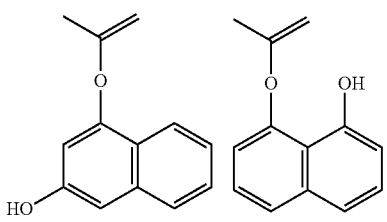
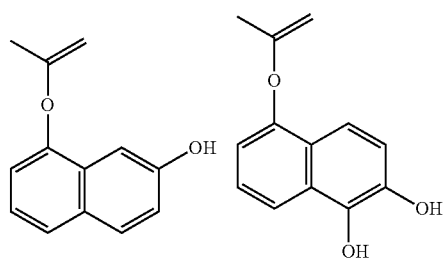
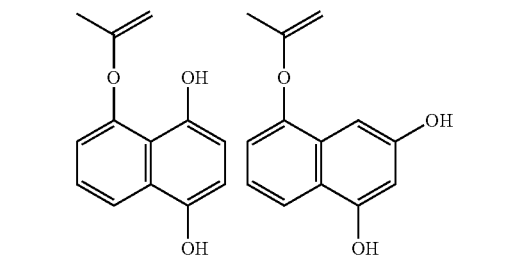
-continued
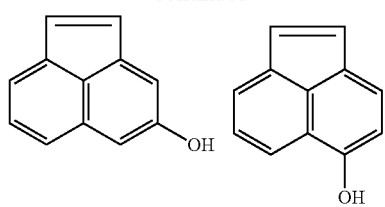
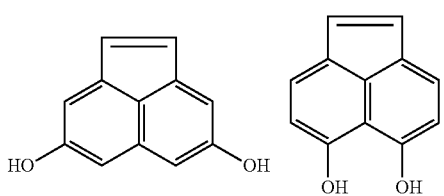
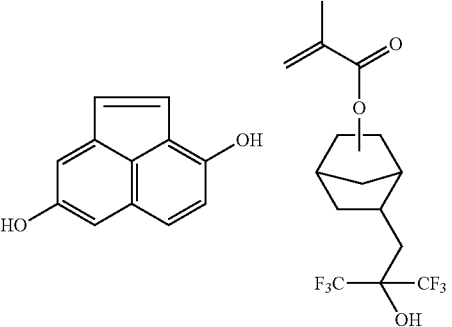
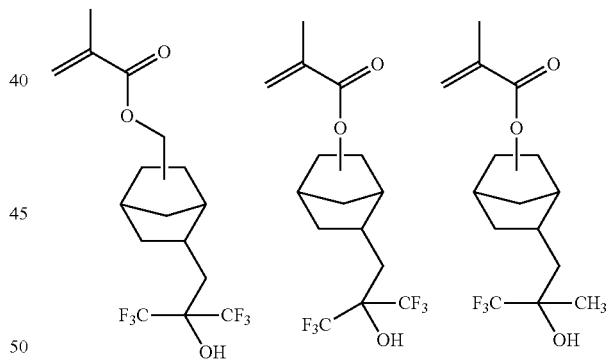
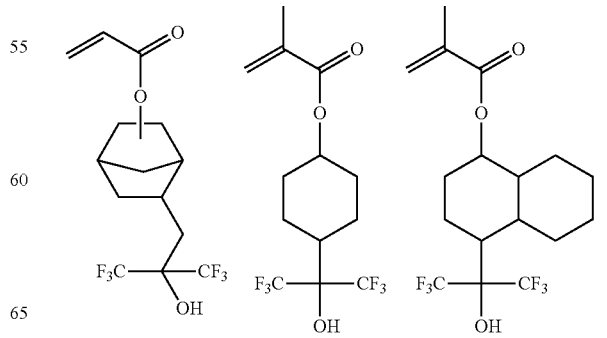

-continued
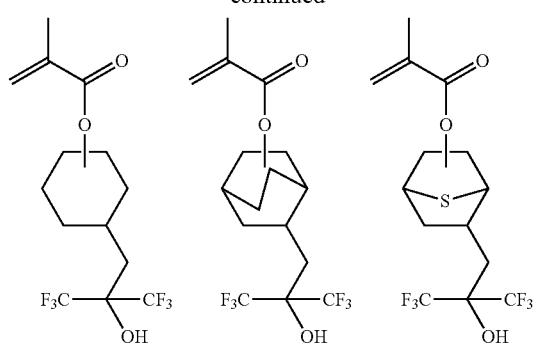
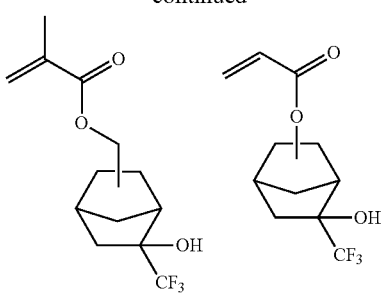
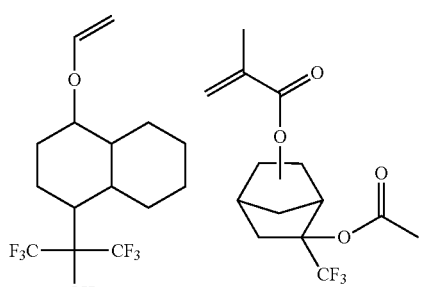
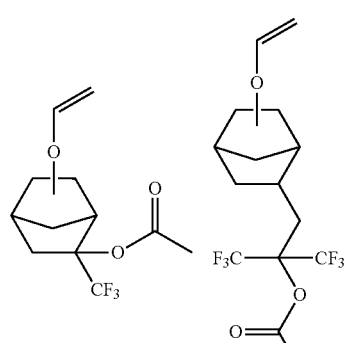
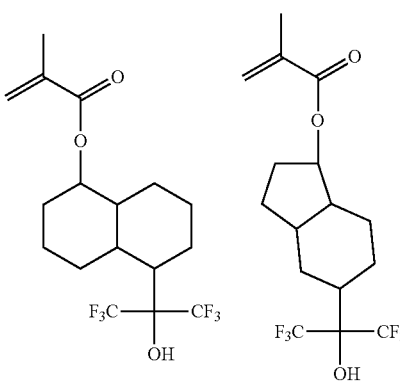
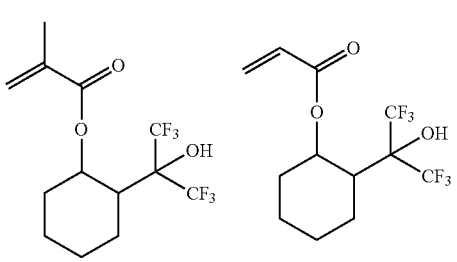

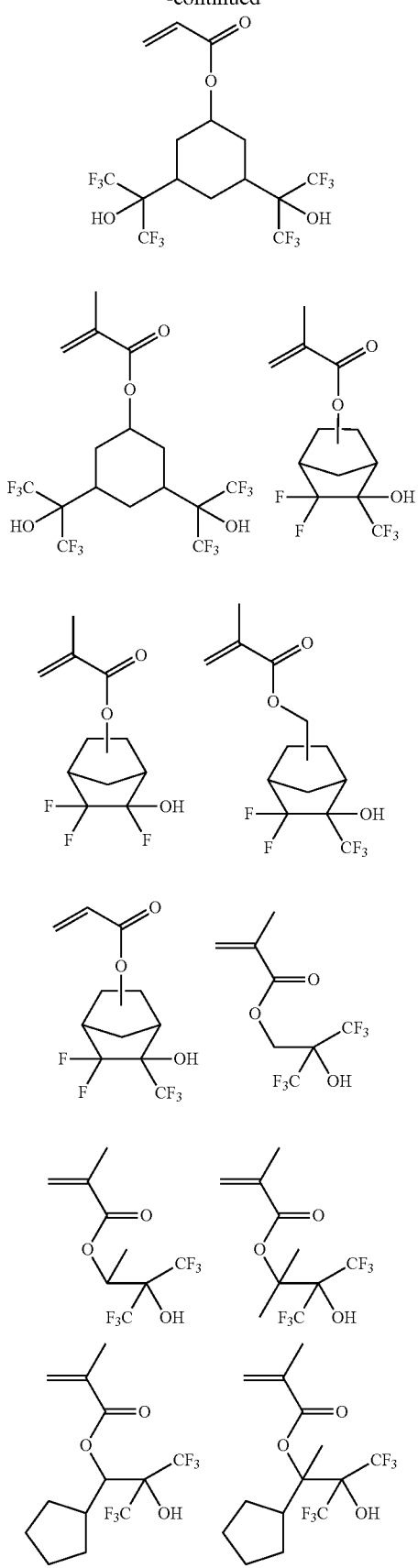
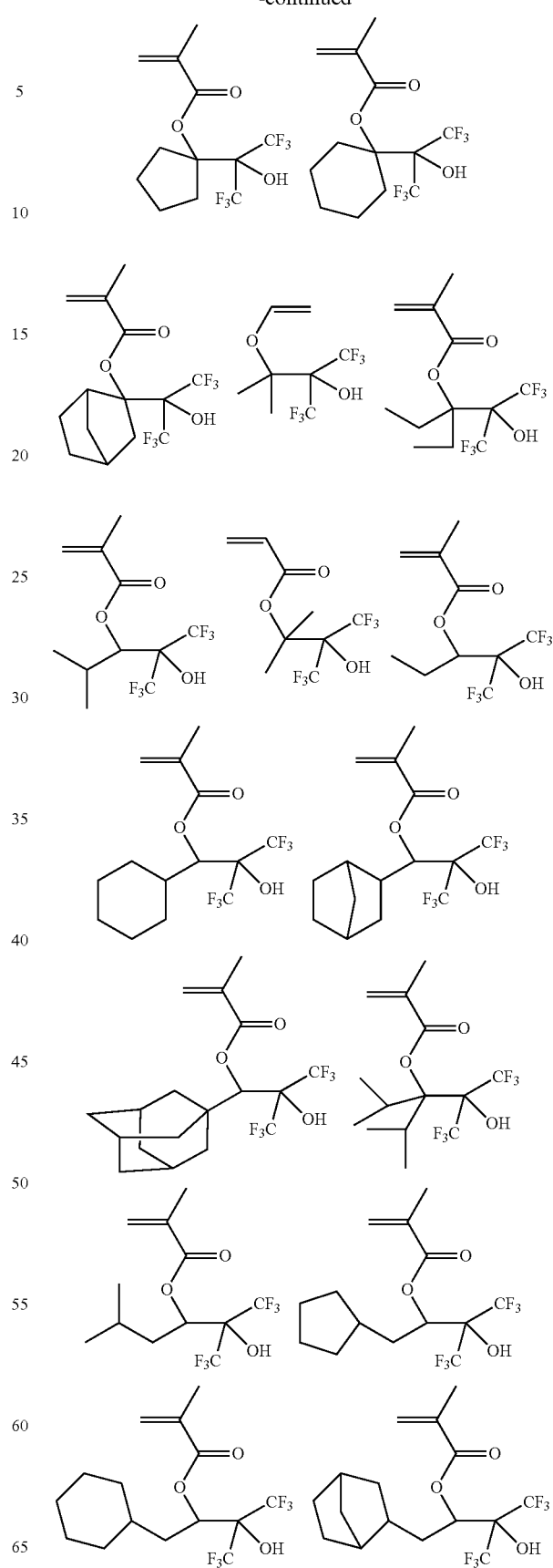

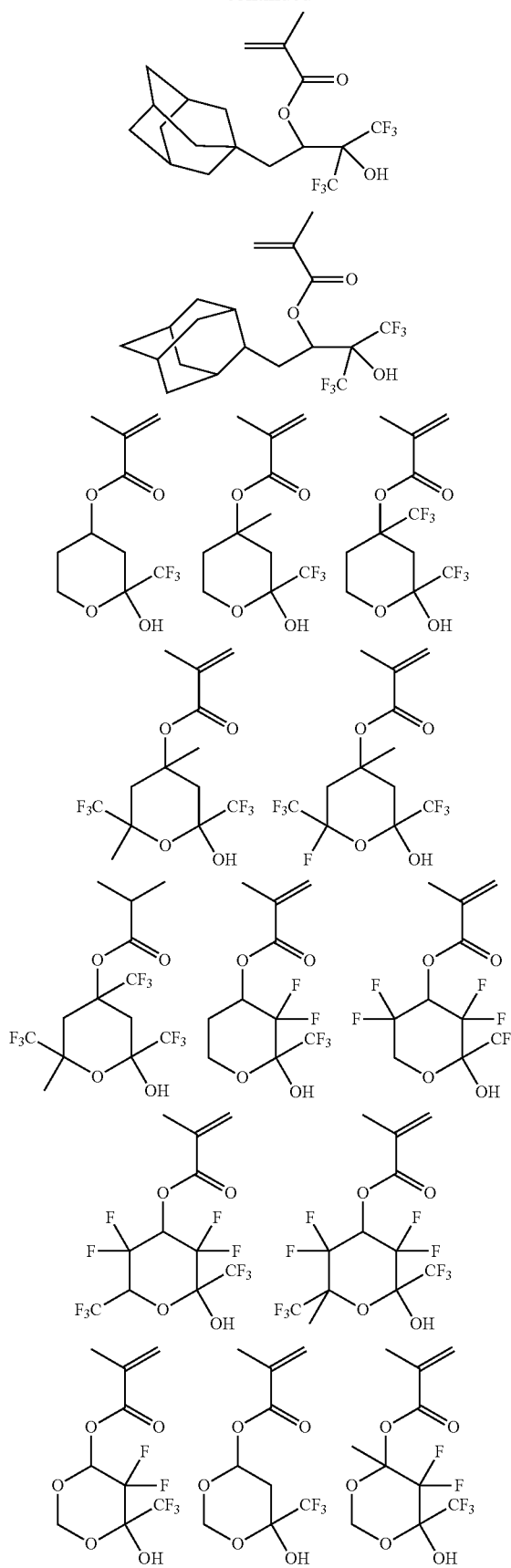
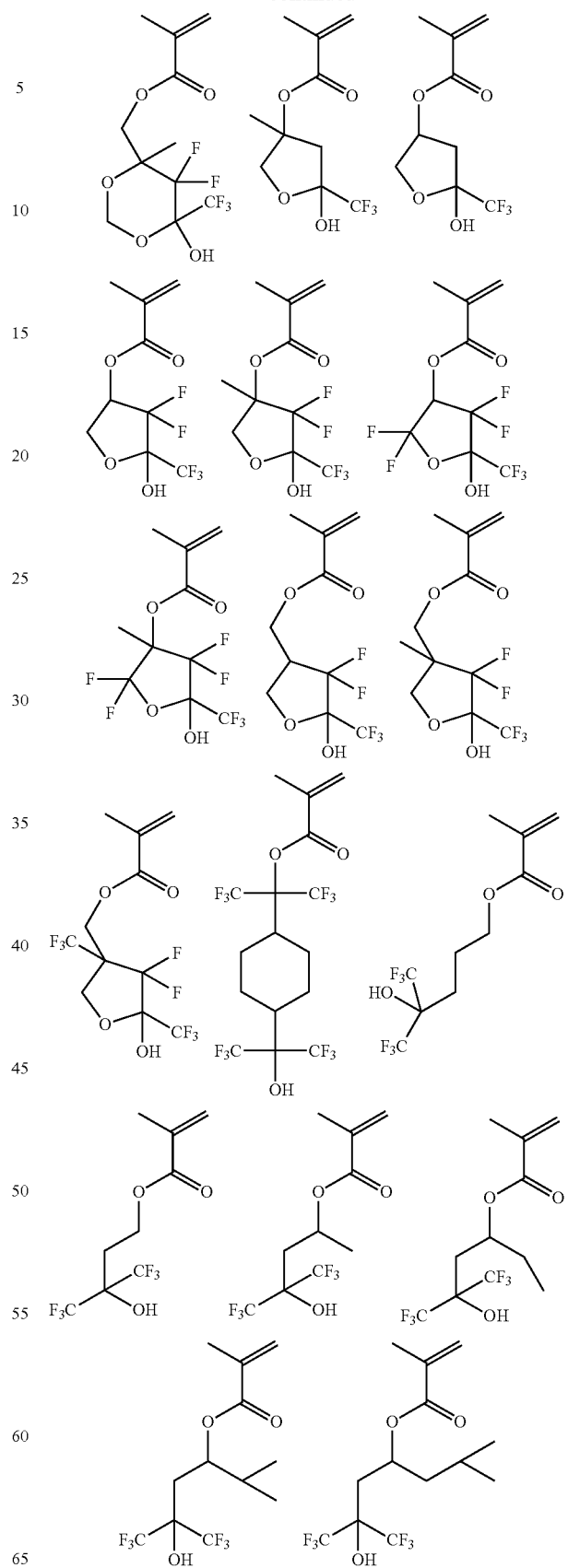

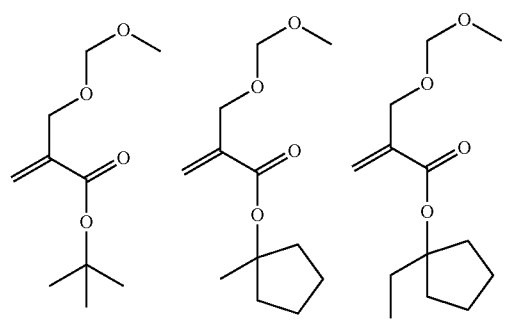
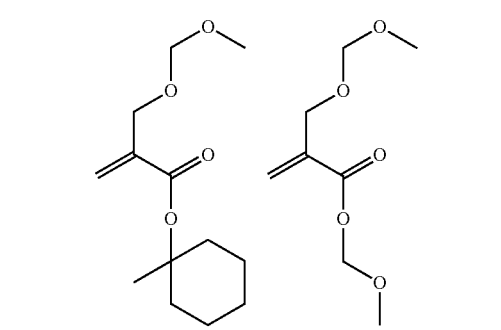
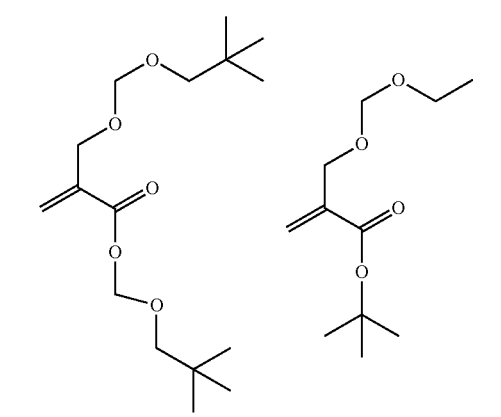
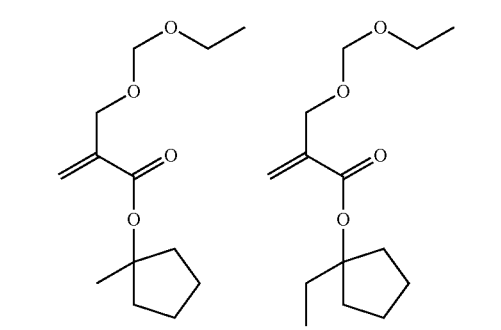
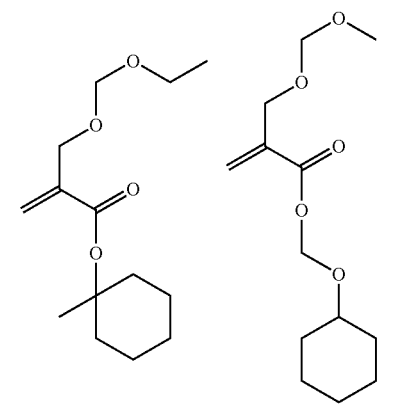
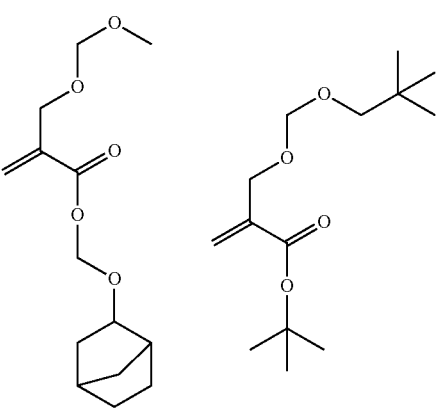
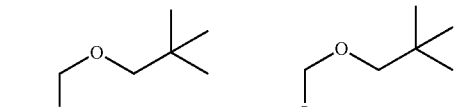
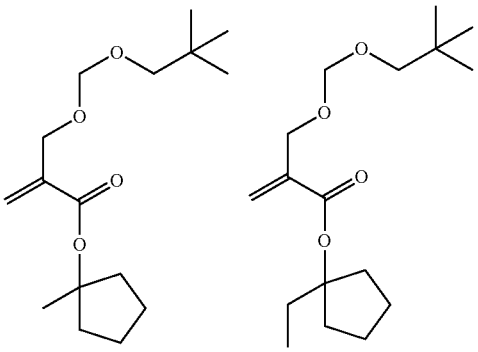
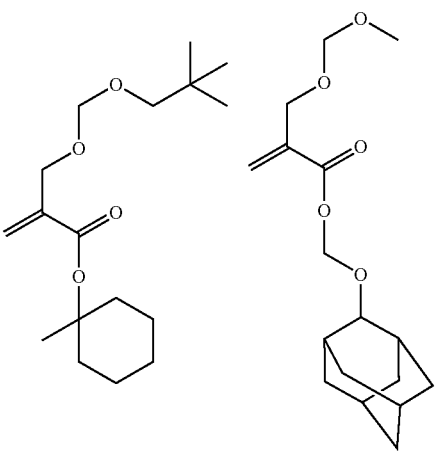

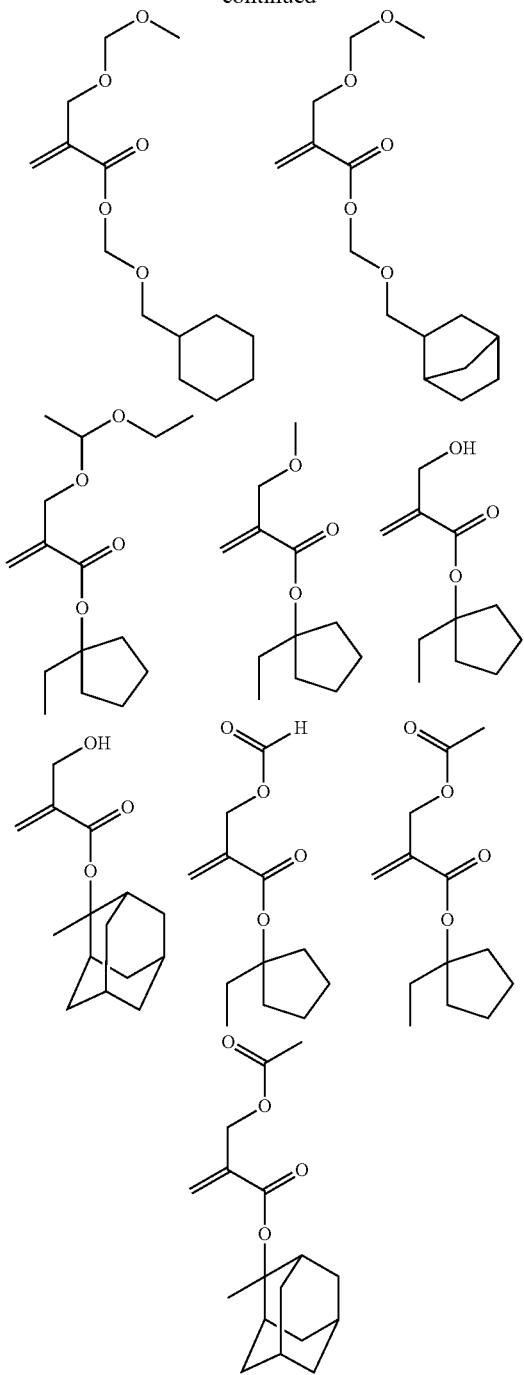

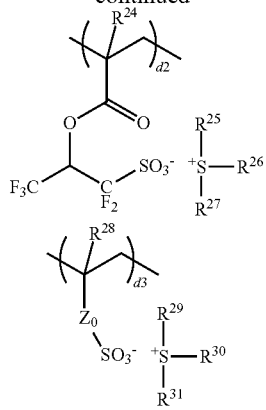

In a preferred embodiment, the copolymer has further copolymerized therein units selected from sulfonium salts (d1) to (d3) represented by the general formulae below.

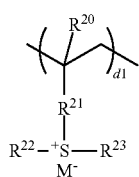

Herein $R^{20}$, $R^{24}$, and $R^{28}$ each are hydrogen or methyl, $R^{21}$ is a single bond, phenylene, —O—$R^{33}$—, or —C(=O)—Y—$R^{33}$—, Y is oxygen or NH, $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. $M^-$ is a non-nucleophilic counter ion, d1, d2 and d3 are in the range of $0 \leq d1 \leq 0.3$, $0 \leq d2 \leq 0.3$, $0 \leq d3 \leq 0.3$, and $0 \leq d1+d2+d3 \leq 0.3$.

In the copolymer, the recurring units (a), (b), (c), (d1), (d2), and (d3) are preferably present in proportions: $0 < a < 1.0$, $0 \leq b < 1.0$, $0 \leq c < 1.0$, $0 \leq d1 \leq 0.3$, $0 \leq d2 \leq 0.3$, $0 \leq d3 \leq 0.3$, and $0 \leq d1+d2+d3 \leq 0.3$, and more preferably $0.1 \leq a \leq 0.8$, $0.1 \leq b \leq 0.75$, $0.1 \leq c \leq 0.8$, $0 \leq d1 < 0.2$, $0 \leq d2 < 0.2$, $0 \leq d3 < 0.2$, and $0 \leq d1+d2+d3 \leq 0.2$, provided that $a+b+c+d1+d2+d3=1$.

It is noted that the meaning of $a+b=1$, for example, is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (c), (d1), (d2) and (d3).

The polymer should preferably have a weight average molecular weight (Mw) in the range of 1,000 to 500,000, and more preferably 3,000 to 100,000, as measured versus polystyrene standards by GPC using tetrahydrofuran solvent. Outside the range, there may result an extreme drop of etch resistance, and a drop of resolution due to difficulty to gain a dissolution rate difference before and after exposure.

The polymers of the invention are prepared by copolymerization reaction using the compound of formula (1) as a first monomer and polymerizable double bond-bearing compounds as second and subsequent monomers. The copolymerization reaction to produce the inventive polymers may be performed in various modes, preferably radical polymerization, anionic polymerization or coordination polymerization. Preferably the first monomer or compound of formula (1) and the second and subsequent monomers used in copolymerization have an oligomeric or polymeric content of up to 10%, more preferably up to 3%, and even more preferably up to 1% by weight.

For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about 0.5 hour to about 48 hours. Reaction conditions outside the described range may be employed if desired.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyl lithium and sec-butyl lithium, ketyl, and Grignard reagents, (c) a temperature of about −78° C. to about 0° C., (d) a time of about 0.5 hour to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkylaluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about 0.5 hour to about 48 hours. Reaction conditions outside the described range may be employed if desired.

Resist Composition

The polymer of the invention is advantageously used as a base resin in a resist composition, specifically a chemically amplified resist composition. The third embodiment of the invention is a resist composition comprising the polymer disclosed herein. The resist composition is defined herein as comprising (A) a base resin comprising the inventive polymer, (B) an acid generator, (C) an organic solvent, and optionally and preferably (D) a basic compound or quencher and (E) a surfactant. Depending on the type of developer, the resist composition may work in either positive or negative tone.

In addition to the inventive polymer, the base resin (A) may include another polymer having a dissolution rate in alkaline developer that increases under the action of acid, if necessary. Examples of the other polymer include, but are not limited to, (i) poly(meth)acrylic acid derivatives, (ii) norbornene derivative-maleic anhydride copolymers, (iii) hydrogenated products of ring-opening metathesis polymerization (ROMP) polymers, and (iv) vinyl ether-maleic anhydride-(meth)acrylic acid derivative copolymers.

Of these, the hydrogenated ROMP polymers are synthesized by the method illustrated in JP-A 2003-66612. Illustrative examples of such hydrogenated polymers include those polymers having the recurring units shown below, but are not limited thereto.

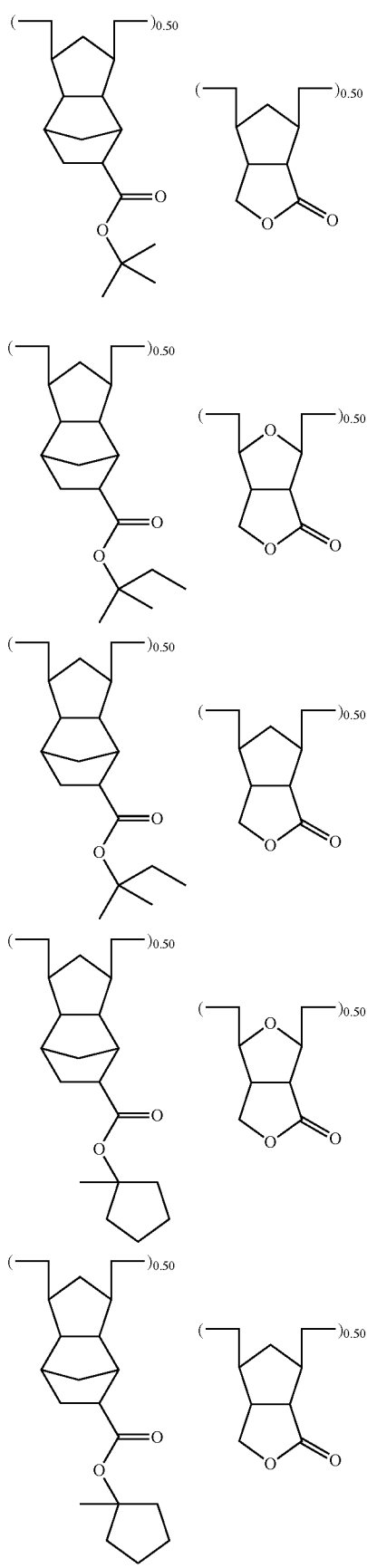

-continued
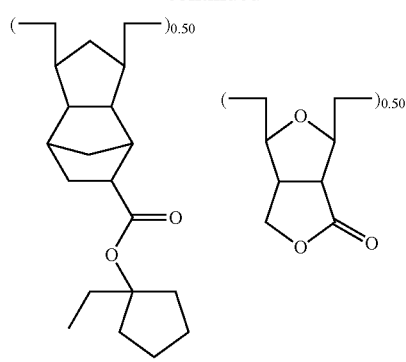 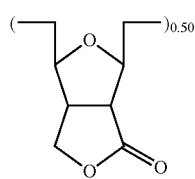
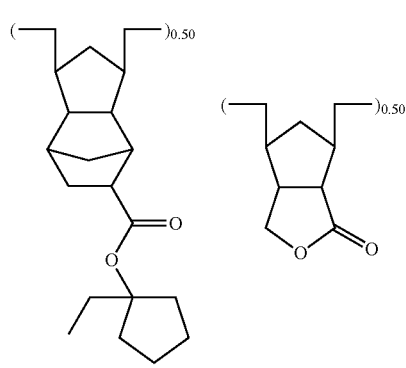 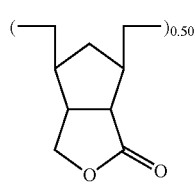
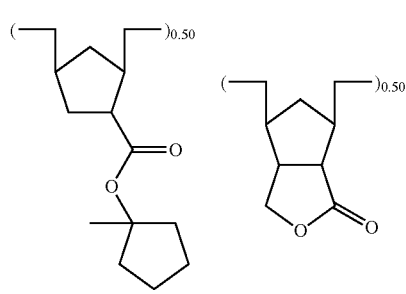 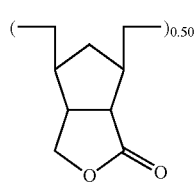
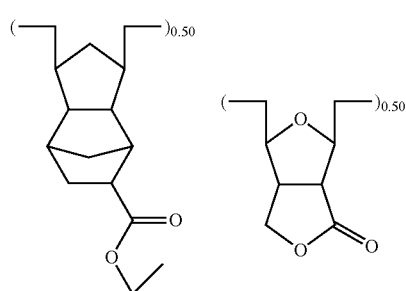 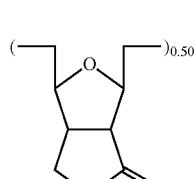
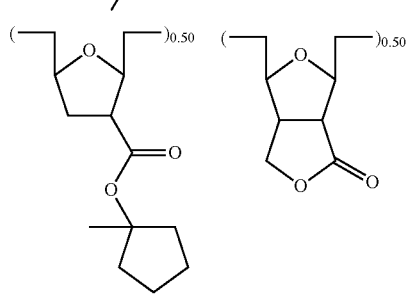 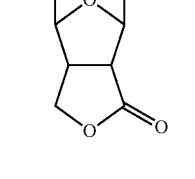
-continued
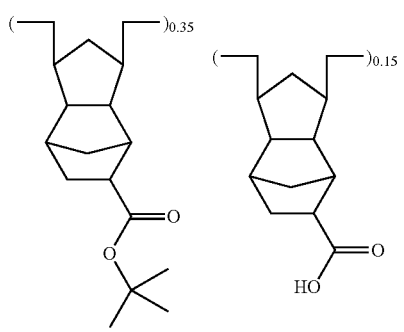 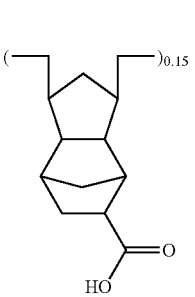
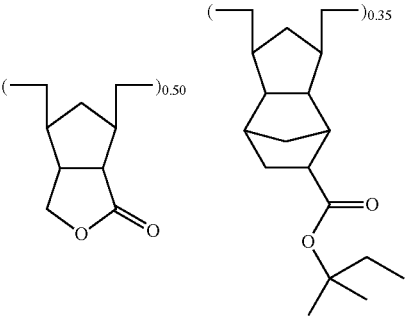 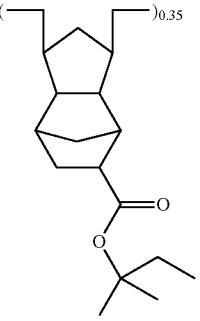
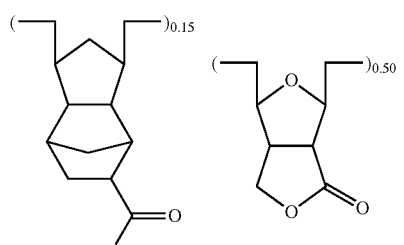 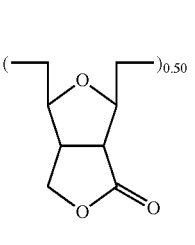
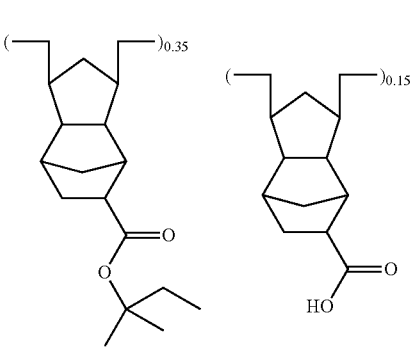 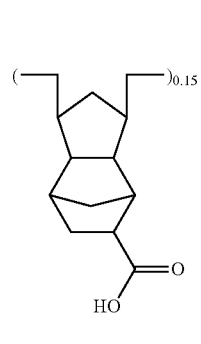
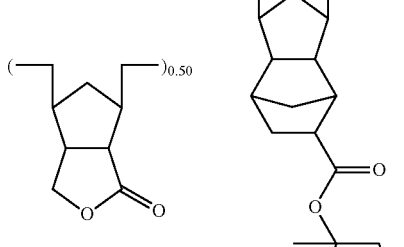 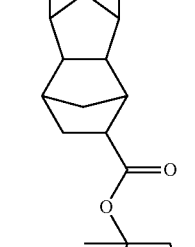

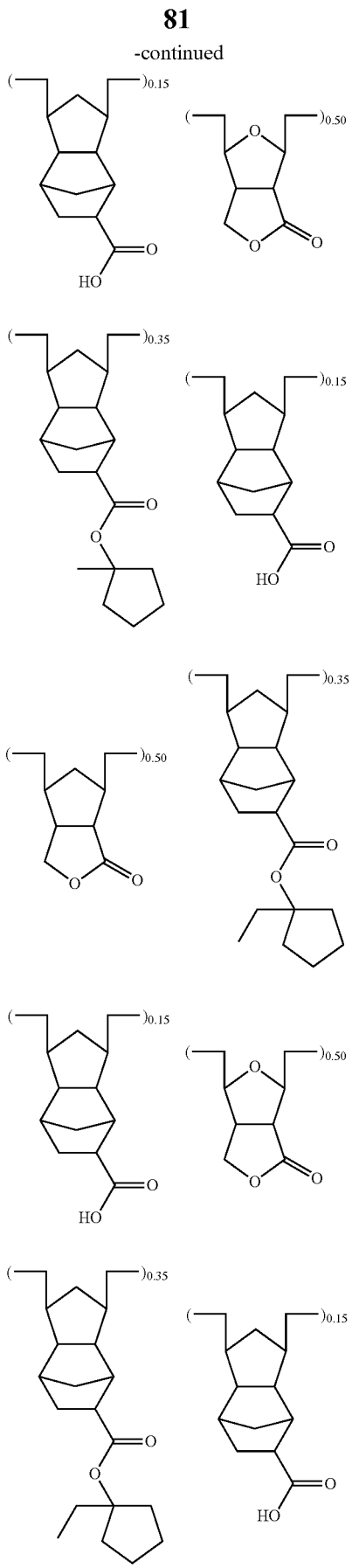
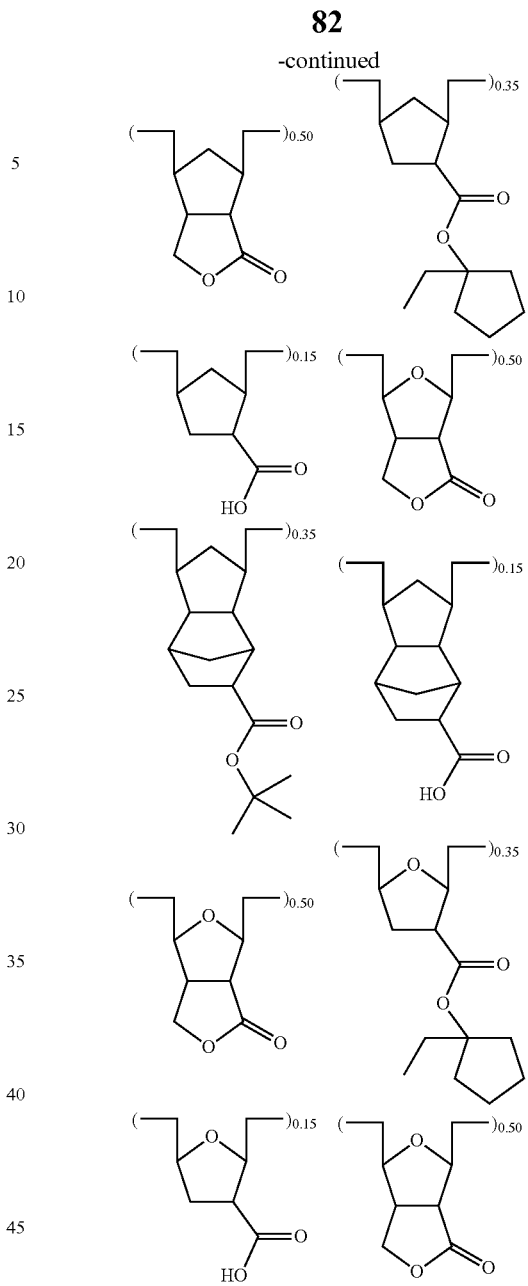

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The polymer is not limited to one type and a mixture of two or more polymers may be added. The use of plural polymers allows for adjustment of resist properties.

Typical of the acid generator (B) used herein is a photoacid generator (PAG). The PAG is any compound capable of generating an acid upon exposure to high-energy radiation. Suitable PAGs include sulfonium salts, iodonium salts, N-sulfonyloxyimide, and oxime-O-sulfonate acid generators. Exemplary acid generators are described in U.S. Pat. No. 7,537,880 (JP-A 2008-111103, paragraphs [0122] to [0142]). The PAGs may be used alone or in admixture of two or more.

Where the polymer has a polymerizable acid generator unit selected from recurring units (d1), (d2) and (d3) copolymerized therein, the acid generator need not necessarily be added.

Among others, acid generators having the general formula (7) are more preferred.

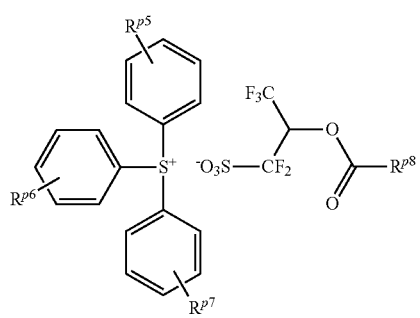

(7)

Herein $R^{p5}$, $R^{p6}$, and $R^{p7}$ are each independently hydrogen or a straight, branched or cyclic, monovalent $C_1$-$C_{20}$ hydrocarbon group which may contain a heteroatom. Examples of hydrocarbon groups optionally containing a heteroatom include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-to-carbon bond is separated by a hetero-atomic grouping such as —O—, —S—, —SO—, —SO$_2$—, —NH—, —C(=O)—, —C(=O)O—, or —C(=O)NH—, or any hydrogen atom is replaced by a functional group such as —OH, —NH$_2$, —CHO, or —CO$_2$H. $R^{p8}$ is a straight, branched or cyclic, monovalent $C_7$-$C_{30}$ hydrocarbon group which may contain a heteroatom, examples of which are exemplified below, but are not limited thereto.

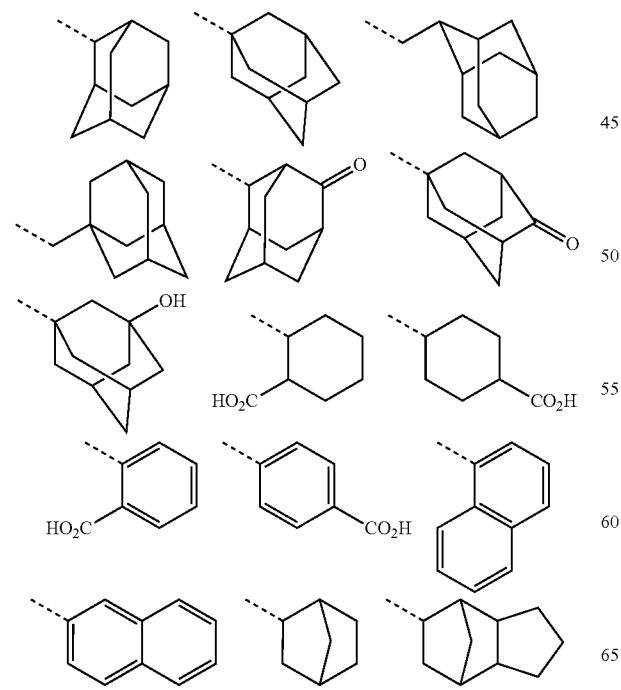

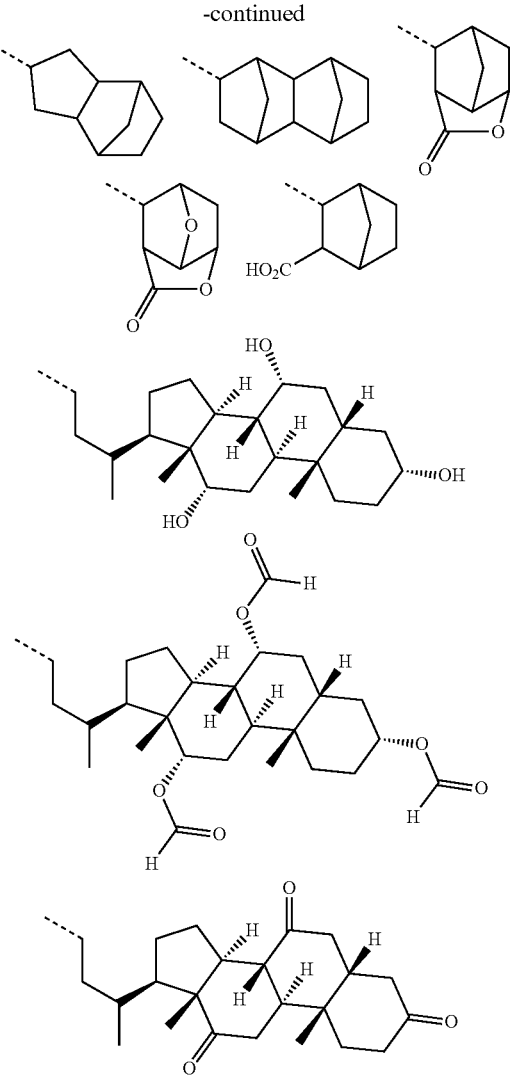

Illustrative examples of acid generators (7) are shown below.

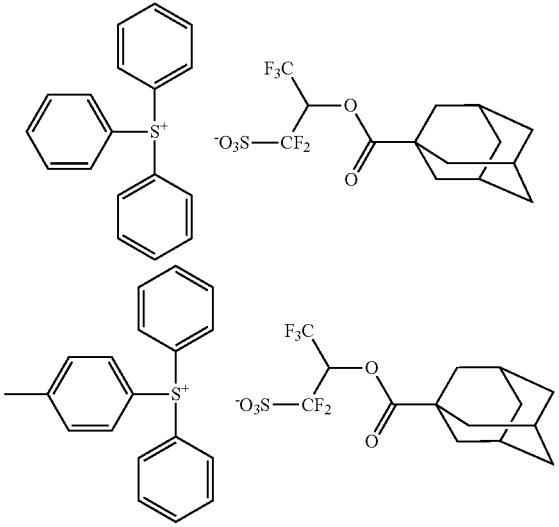

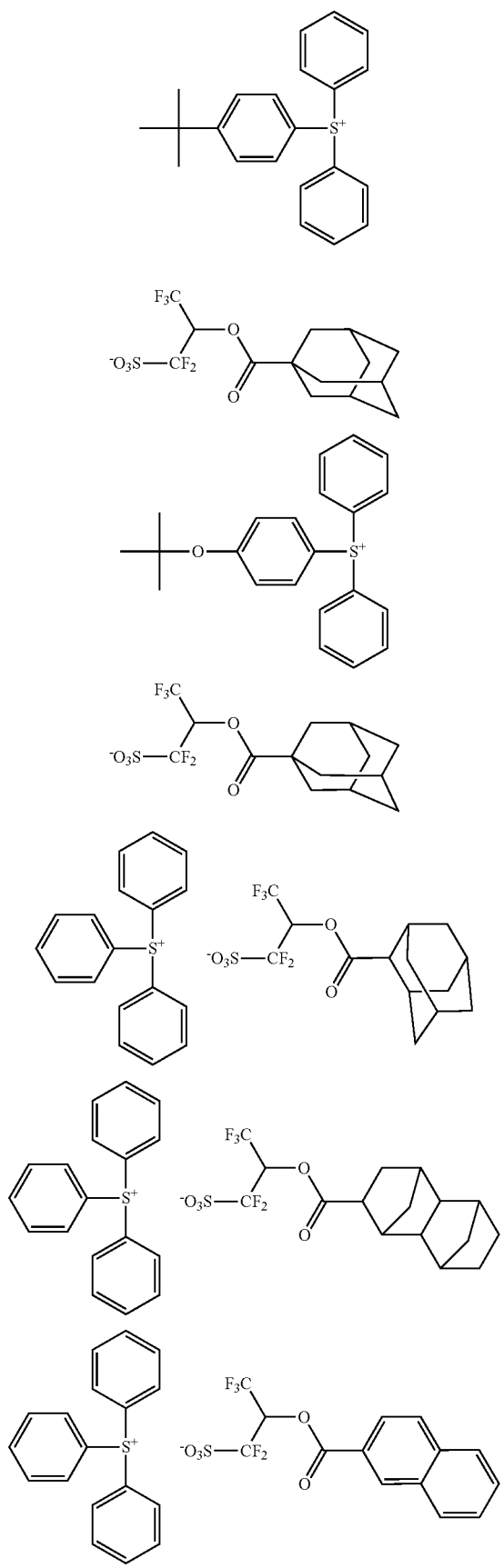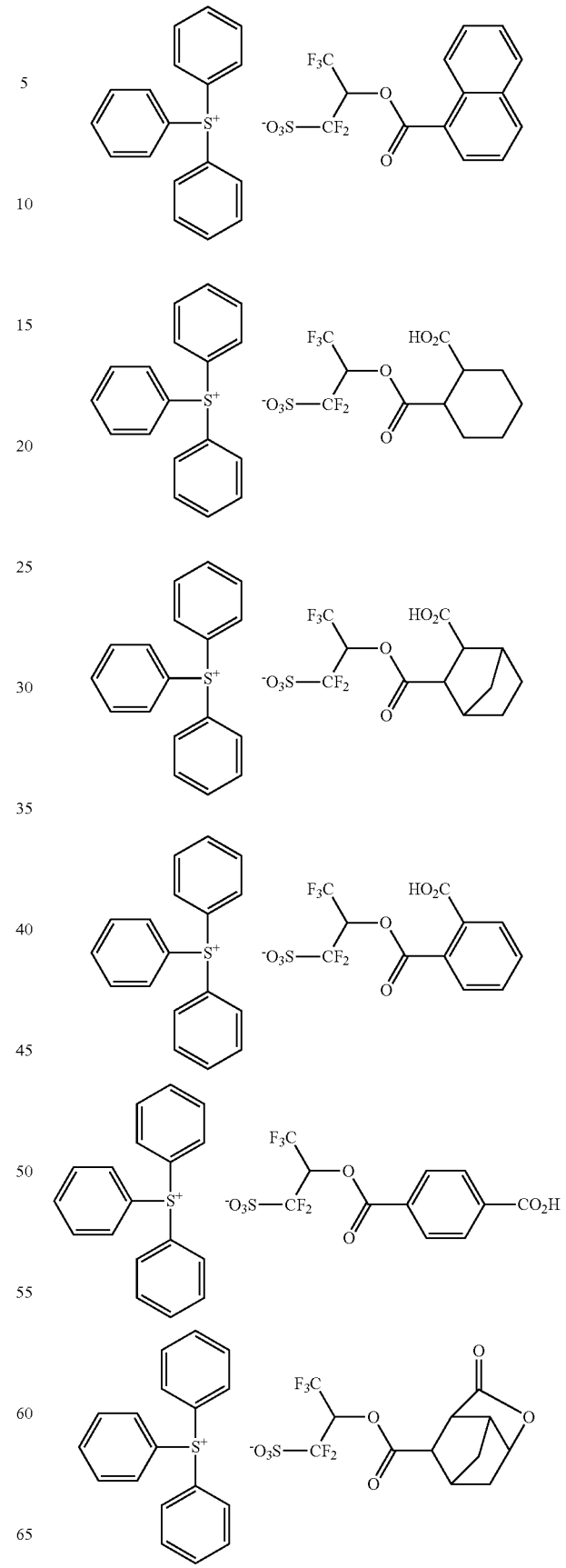

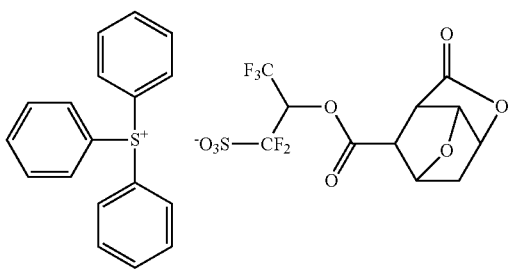
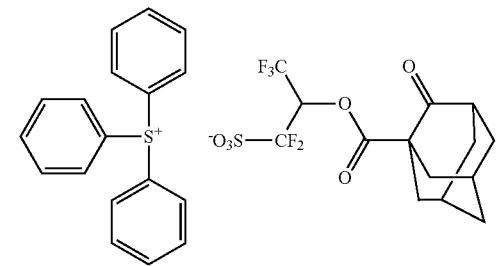
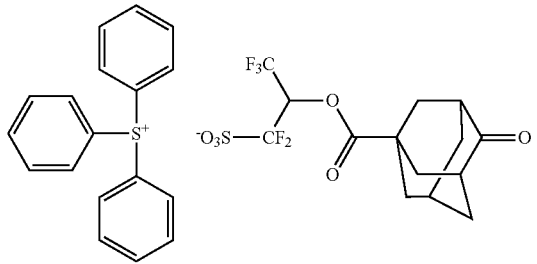
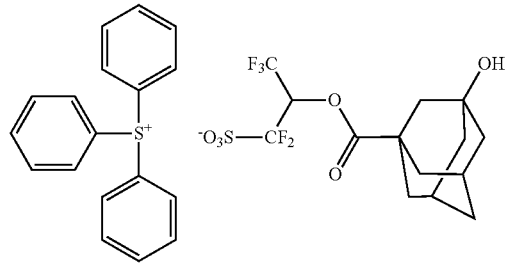
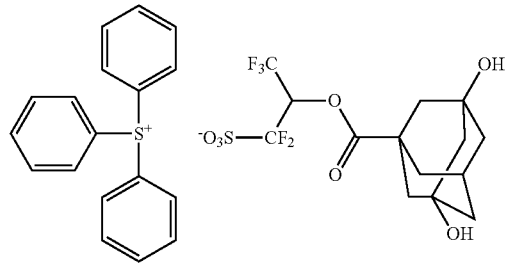
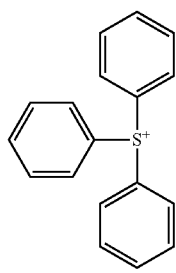

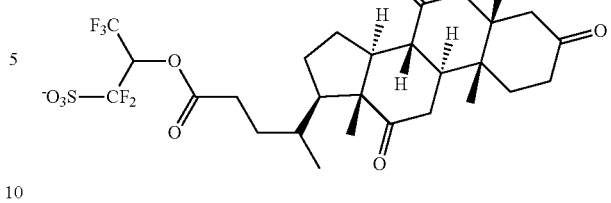

In the chemically amplified resist composition, the PAG (B) may be added in any desired amount as long as the objects of the invention are not compromised. An appropriate amount of the PAG is 0.1 to 30 parts, and more preferably 0.5 to 20 parts by weight per 100 parts by weight of the base resin in the composition. Too high a proportion of the PAG may give rise to problems of degraded resolution and foreign matter upon development and resist film peeling. The PAGs may be used alone or in admixture of two or more. The transmittance of the resist film can be controlled by using a PAG having a low transmittance at the exposure wavelength and adjusting the amount of the PAG added.

It is noted that an acid diffusion controlling function may be provided when two or more PAGs are used in admixture provided that one PAG is an onium salt capable of generating a weak acid. Specifically, in a system using a mixture of a PAG capable of generating a strong acid (e.g., α-position fluorinated sulfonic acid) and an onium salt capable of generating a weak acid (e.g., α-position non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If an onium salt capable of generating a strong acid is used, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

In the resist composition, there may be added a compound which is decomposed with an acid to generate another acid, that is, acid amplifier compound. For these compounds, reference should be made to J. Photopolym. Sci. and Tech., 8, 43-44, 45-46 (1995), and ibid., 9, 29-30 (1996). Examples of the acid amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Examples of the organic solvent used herein as component (C) are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

An appropriate amount of the organic solvent used is 100 to 10,000 parts, and especially 300 to 8,000 parts by weight per 100 parts by weight of the base resin.

Examples of the basic compound (or nitrogen-containing organic compound) used herein as component (D) include primary, secondary, and tertiary amine compounds as described in JP-A 2008-111103, paragraphs [0146] to [0164], specifically amine compounds having a hydroxyl, ether, ester, lactone, cyano or sulfonic ester group, and compounds having a carbamate group as described in JP 3790649. An appropriate amount of the basic compound used is 0.0001 to 30 parts, and especially 0.001 to 20 parts by weight per 100 parts by weight of the base resin. Less than 0.0001 part of the basic compound may achieve no addition effect whereas more than 30 parts may cause an extreme lowering of sensitivity.

The surfactant used herein as component (E) may be typically selected from those described in JP-A 2008-111103, paragraphs [0165] to [0166]. An appropriate amount of the surfactant used is up to 2 parts, and especially up to 1 part by weight per 100 parts by weight of the base resin. When used, the surfactant is preferably added in an amount of at least 0.01 part by weight.

If desired, other components such as dissolution regulator and acetylene alcohol derivative may be added to the resist composition. The optional components may be added in conventional amounts so long as the objects of the invention are not compromised. Exemplary dissolution regulators are described in JP-A 2008-122932, paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, 2008-111103, 2008-122932, 2009-98638, and 2009-276363. The water repellency improver to be added to the resist should be soluble in the organic solvent as the developer. The water repellency improver of specific structure with a 1,1,1,3,3,3-hexafluoro-2-propanol residue is well soluble in the alkaline developer. A polymer having an amino group or amine salt copolymerized as recurring units may serve as the water repellent additive and is effective for preventing evaporation of acid during PEB and avoiding any hole pattern opening failure after development. The resist composition which can be used herein may comprise a water-repellent polymer having an amino group copolymerized as described in JP-A 2009-31767, a polymer having a sulfonic acid amine salt copolymerized as described in JP-A 2008-107443, and a polymer having carboxylic acid amine salt copolymerized as described in JP-A 2008-239918. When the water repellent additive is added to a resist composition intended for organic solvent development, it may be a compound having a fluoroalkyl or alkyl group because a 1,1,1,3,3,3-hexafluoro-2-propanol residue is not essentially necessary. An appropriate amount of the water repellency improver is 0.1 to 20 parts, preferably 0.5 to 10 parts by weight per 100 parts by weight of the base resin.

Process

Pattern formation using the resist composition of the invention may be performed by well-known lithography processes. The process generally involves coating, heat treatment (or prebake), exposure, heat treatment (PEB), and development. If necessary, any additional steps may be added.

The process of forming a positive pattern using an alkaline aqueous solution as developer is well known in the art, for example, from JP-A 2011-231312, paragraphs [0138] to [0146].

The process of forming a negative pattern using an organic solvent as developer is illustrated in FIG. 1. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634, 2008-003569, 2008-81716, and 2008-111089 readily dissolve in organic solvent developers.

In the protective film-forming composition, an amine compound or amine salt or a polymer having copolymerized therein recurring units containing an amine group or amine salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569, and useful protective film materials having an amino group or amine salt copolymerized are described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation. On the other hand, a protective film to which an acid compound such as a carboxyl or sulfo group is added or which is based on a polymer having copolymerized therein monomeric units containing a carboxyl or sulfo group is undesirable because of a potential hole opening failure.

The other embodiment of the invention is a process for forming a pattern by applying a resist composition comprising a polymer comprising recurring units having formula (2), an acid generator, and an organic solvent onto a substrate, baking the composition to form a resist film, forming a protective film on the resist film, exposing the resist film to high-energy radiation to define exposed and unexposed regions, baking, and applying a developer to the coated substrate to form a negative pattern wherein the unexposed region of resist film and the protective film are dissolved and the exposed region of resist film is not dissolved. The protective film is preferably formed from a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

With respect to the recurring units having a 1,1,1,3,3,3-hexafluoro-2-propanol residue, those monomers having a —C(CF$_3$)(OH) group, i.e., a carbon atom having CF$_3$ and OH radicals bonded thereto are preferably selected among the exemplary monomers listed for the recurring unit (c) (some monomers in the last but two and three lists, and all monomers in the last but one list). The amino group-containing compound may be selected from the exemplary amine compounds (to be added to photoresist compositions) described in JP-A 2008-111103, paragraphs [0146] to [0164]. As the amine salt-containing compound, salts of the foregoing amine compounds with carboxylic acid or sulfonic acid may be used.

Suitable alcohols of at least 4 carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed in a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, tert-butylbenzene, and mesitylene. The solvents may be used alone or in admixture.

Where a hole pattern is formed by negative tone development using organic solvent developer, exposure by double dipole illuminations of X- and Y-direction line patterns provides the highest contrast light. The contrast may be further increased by combining dipole illumination with s-polarized illumination. These pattern forming processes are described in JP-A 2011-221513.

EXAMPLE

Examples of the invention are given below by way of illustration and not by way of limitation. The abbreviation "pbw" is parts by weight. Me stands for methyl, Et for ethyl, and i-Pr for isopropyl. For all polymers, Mw and Mn are determined versus polystyrene standards by GPC using tetrahydrofuran as solvent.

Synthesis Example 1

Monomers within the scope of the invention were synthesized in accordance with the formulation shown below.

Synthesis Example 1-1

Synthesis of Monomer 1

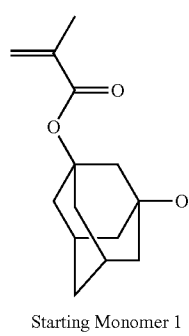

Starting Monomer 1

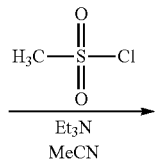

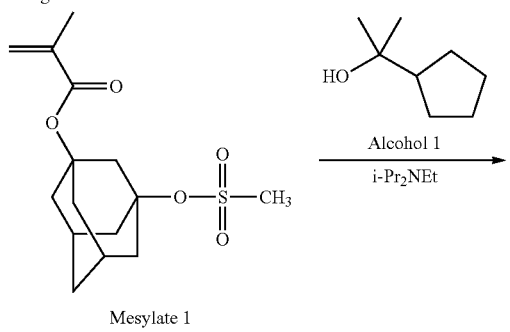

Mesylate 1

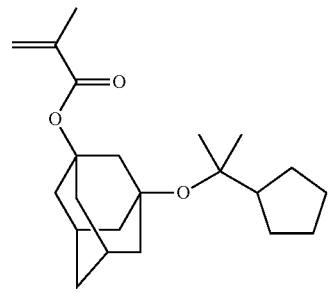

Monomer 1

To 200 ml of acetonitrile were added 43.7 g of Starting Monomer 1 and 23.3 g of methanesulfonyl chloride. To the mixture below 20° C., 22.5 g of triethylamine was added dropwise, followed by stirring at room temperature for one hour. 200 ml of 20 wt % hydrochloric acid aqueous solution was added to quench the reaction, followed by standard aqueous workup. The solvent was distilled off, yielding 58 g of Mesylate 1 as oily matter. Mesylate 1 was used in the next step without purification.

Mesylate 1 was mixed with 119.5 g of N,N-diisopropylethylamine and 237 g of Alcohol 1, followed by stirring at 95° C. for 170 hours. The reaction solution was cooled whereupon 200 ml of saturated sodium bicarbonate aqueous solution was added to quench the reaction. This was followed by standard aqueous workup, distillation of a low-boiling fraction, and purification by silica gel column chromatography, obtaining 50.5 g of Monomer 1 (yield 79%).

$^1$H-NMR (600 MHz in DMSO-d$_6$): δ=1.20 (6H, s), 1.35-1.70 (10H, m), 1.70-1.79 (5H, m), 1.81 (3H, s), 1.94-2.00 (4H, m), 2.10 (2H, s), 2.22 (2H, m), 5.54 (1H, m), 5.91 (1H, s) ppm IR (D-ATR): ν=2947, 2865, 1713, 1637, 1453, 1379, 1362, 1335, 1324, 1299, 1221, 1174, 1121, 1098, 1015, 936, 863, 813, 649 cm$^{-1}$

Synthesis Example 1-2

Synthesis of Monomer 2

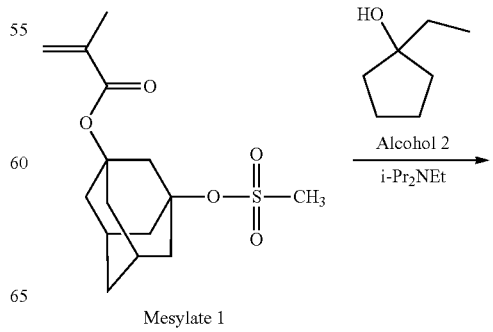

Mesylate 1

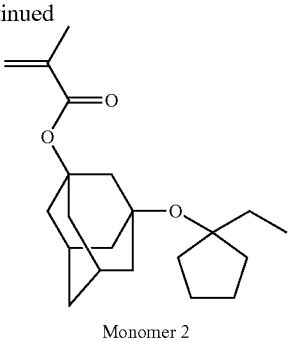

Monomer 2

Monomer 2 was prepared by the same procedure as Synthesis Example 1-1 except that Alcohol 2 was used instead of Alcohol 1. Yield 75%.

$^1$H-NMR (600 MHz in DMSO-$d_6$): δ=0.88 (3H, t), 1.39-1.42 (2H, m), 1.43-1.53 (4H, m), 1.57 (2H, q), 1.60-1.70 (2H, m), 1.75-1.80 (6H, m), 1.81 (3H, s), 1.91-1.98 (4H, m), 2.13 (2H, s), 2.23 (2H, m), 5.53 (1H, s), 5.91 (1H, s) ppm IR (D-ATR): ν=2917, 2868, 1713, 1637, 1453, 1376, 1351, 1328, 1297, 1247, 1173, 1096, 1018, 976, 937, 903, 864, 813, 643 cm$^{-1}$

Synthesis Example 1-3

Synthesis of Monomer 3

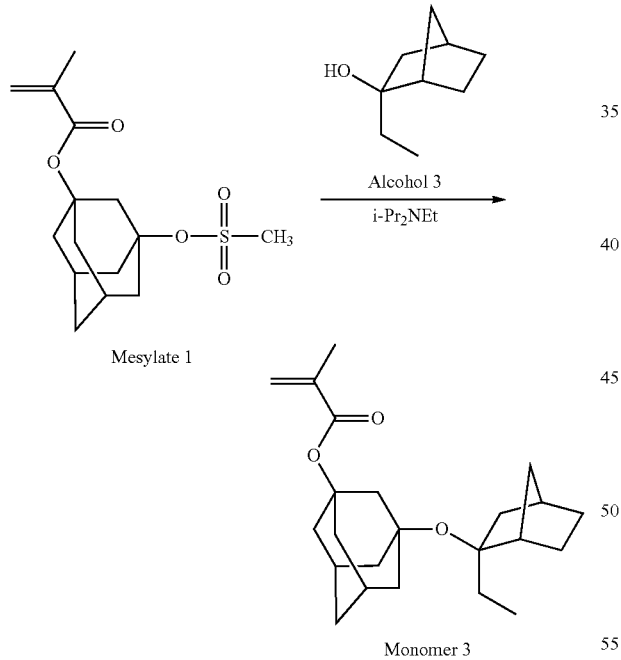

Mesylate 1

Monomer 3

Monomer 3 was prepared by the same procedure as Synthesis Example 1-1 except that Alcohol 3 was used instead of Alcohol 1. Yield 63%.

$^1$H-NMR (600 MHz in DMSO-$d_6$): δ=0.87 (3H, t), 0.90-1.02 (2H, m), 1.07 (1H, d), 1.27-1.34 (2H, m), 1.42 (1H, m), 1.46 (2H, s), 1.53 (1H, m), 1.63 (1H, m), 1.75-1.85 (9H, m), 1.97 (4H, m), 2.12-2.17 (3H, m), 2.22 (2H, s), 2.26 (1H, s), 5.54 (1H, m), 5.92 (1H, s) ppm IR (D-ATR): ν=2931, 2869, 1713, 1637, 1453, 1402, 1376, 1351, 1324, 1299, 1245, 1219, 1167, 1130, 1094, 1041, 1010, 977, 937, 900, 865, 813, 769, 643, 581 cm$^{-1}$

Synthesis Example 1-4

Synthesis of Monomer 4

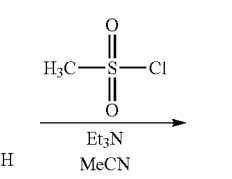

Starting Monomer 2

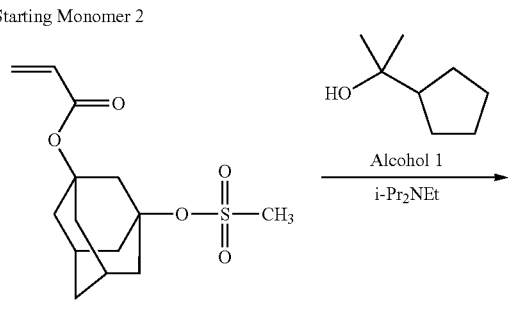

Mesylate 2

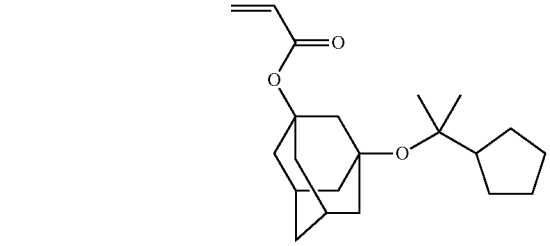

Monomer 4

Monomer 4 was prepared by the same procedure as Synthesis Example 1-1 aside from using Starting Monomer 2 instead of Starting Monomer 1 and forming Mesylate 2 as the intermediate. Yield 77%.

Synthesis Example 1-5

Synthesis of Monomer 5

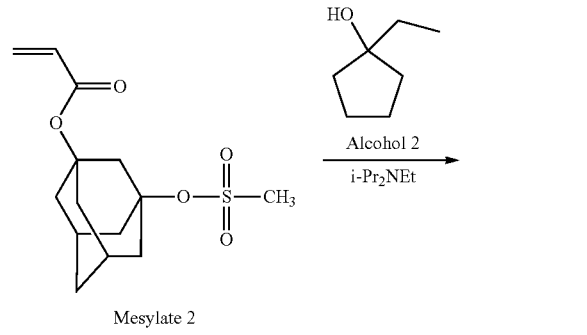

Mesylate 2

-continued

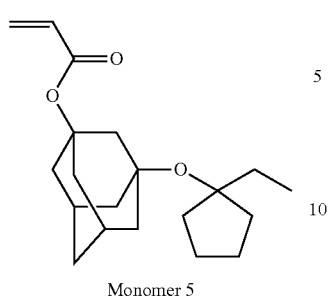

Monomer 5

Monomer 5 was prepared by the same procedure as Synthesis Example 1-2 aside from using Mesylate 2 as in Synthesis Example 1-4. Yield 75%.

Synthesis Example 1-6

Synthesis of Monomer 6

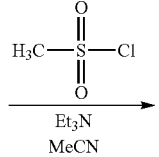

Starting Monomer 3

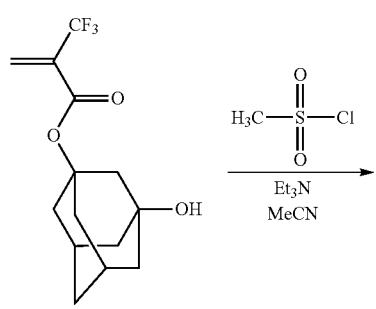

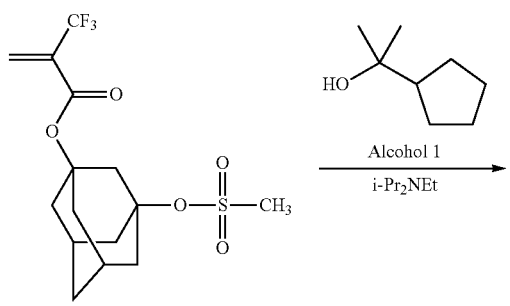

Mesylate 3

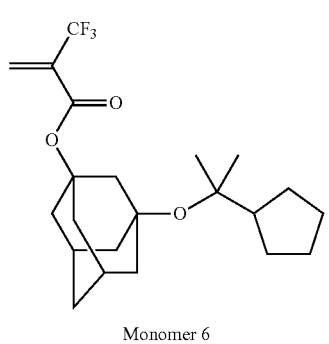

Monomer 6

Monomer 6 was prepared by the same procedure as Synthesis Example 1-1 aside from using Starting Monomer 3 instead of Starting Monomer 1 and forming Mesylate 3 as the intermediate. Yield 71%.

Synthesis Example 1-7

Synthesis of Monomer 7

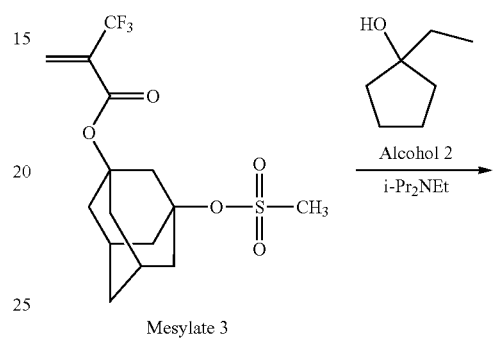

Mesylate 3

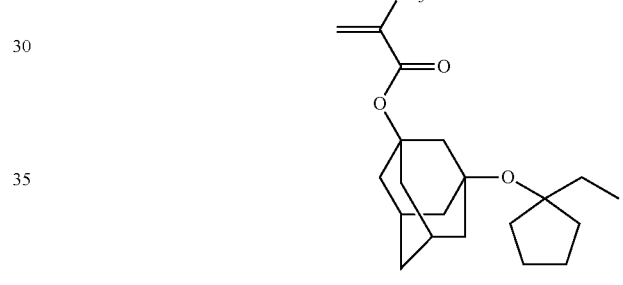

Monomer 7

Monomer 7 was prepared by the same procedure as Synthesis Example 1-2 aside from using Mesylate 3 as in Synthesis Example 1-6. Yield 74%.

Synthesis Example 1-8

Synthesis of Monomer 8

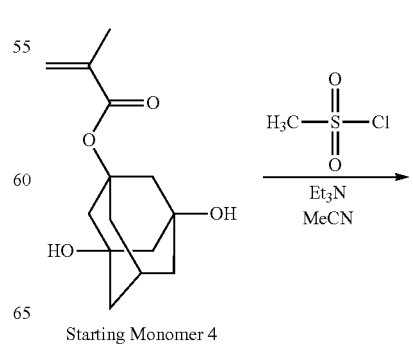

Starting Monomer 4

-continued

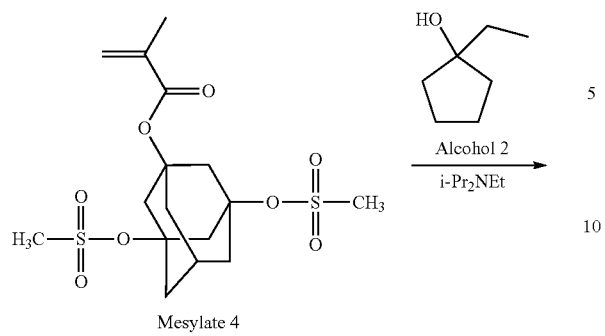

Mesylate 4

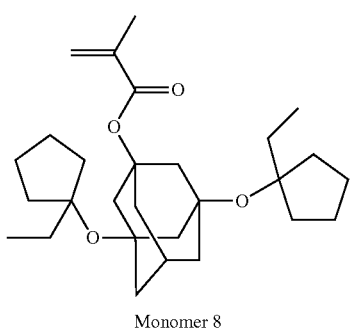

Monomer 8

Monomer 8 was prepared by the same procedure as Synthesis Example 1-2 aside from using Starting Monomer 4 instead of Starting Monomer 1 and forming Mesylate 4 as the intermediate. Yield 64%.

Synthesis Example 1-9

Synthesis of Monomer 9

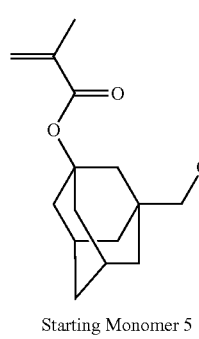

Starting Monomer 5

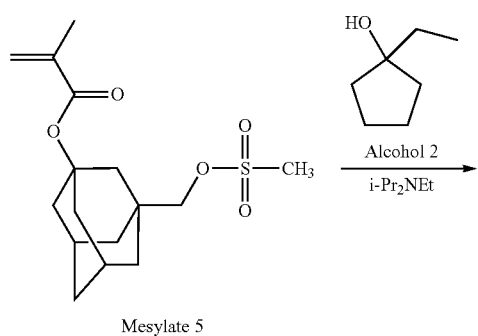

Mesylate 5

-continued

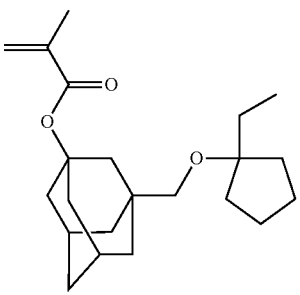

Monomer 9

Monomer 9 was prepared by the same procedure as Synthesis Example 1-2 aside from using Starting Monomer 5 instead of Starting Monomer 1 and forming Mesylate 5 as the intermediate. Yield 65%.

Synthesis Example 1-10

Synthesis of Monomer 10

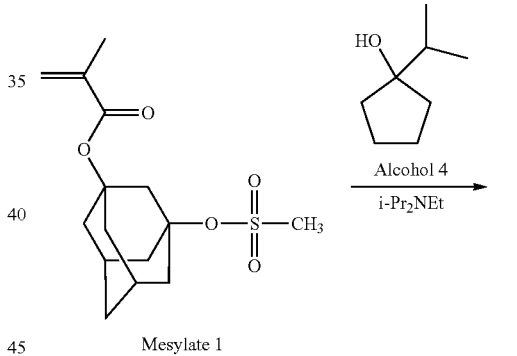

Mesylate 1

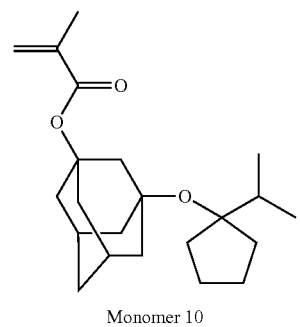

Monomer 10

Monomer 10 was prepared by the same procedure as Synthesis Example 1-1 aside from using Alcohol 4 instead of Alcohol 1. Yield 74%.

Monomers 1 to 10 obtained in Synthesis Example 1 have the structural formulae shown below.

Monomer 1
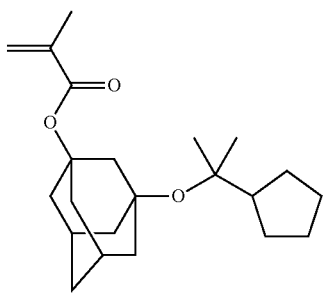
Monomer 2
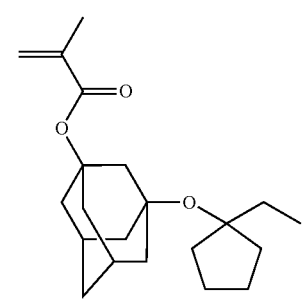
Monomer 3
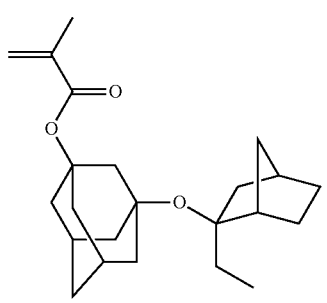
Monomer 4
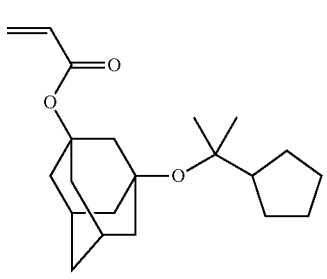
Monomer 5
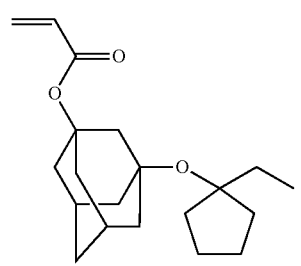
-continued
Monomer 6
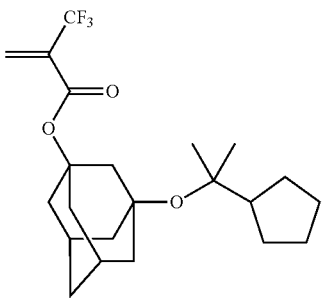
Monomer 7
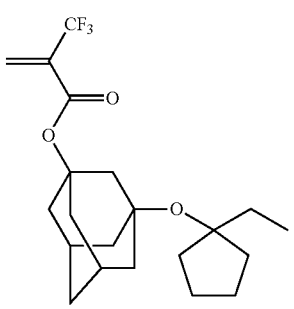
Monomer 8
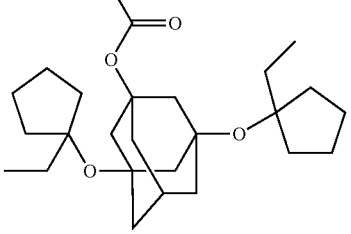
Monomer 9
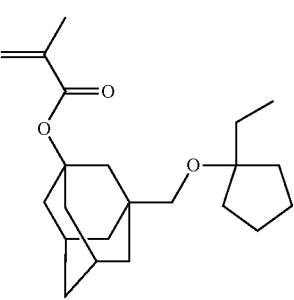
Monomer 10
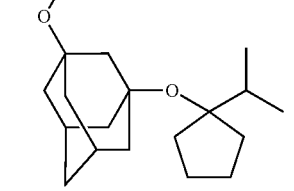
Synthesis Example 2
Polymers within the scope of the invention were synthesized in accordance with the formulation shown below.

Synthesis Example 2-1

Synthesis of Polymer 1

In a nitrogen atmosphere, 36.7 g of Monomer 1, 18.8 g of 4,8-dioxatricyclo[4.2.1.0$^{3,7}$]nonan-5-on-2-yl methacrylate, 5.0 g of 3-hydroxyadamantyl methacrylate, and 2.4 g of dimethyl 2,2'-azobisisobutyrate were dissolved in 105 g of methyl ethyl ketone. With stirring under a nitrogen atmosphere, the solution was added dropwise to 35 g of methyl ethyl ketone at 80° C. over 4 hours. After the completion of dropwise addition, the reaction solution was stirred at 80° C. for 2 hours. After the polymerization solution was cooled to room temperature, it was added dropwise to 960 g of methanol. The thus precipitated solids were filtered, washed with 360 g of methanol, and dried in vacuum at 60° C. for 20 hours, obtaining a polymer in white powder solid form, designated Polymer 1. The amount was 53.8 g, and the yield was 89%.

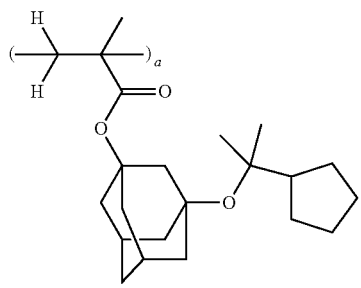

(a = 0.50, b = 0.10, c = 0.40, Mw = 12,400)

Synthesis Example 3

Polymers 2 to 13 and Comparative Polymers 1 to 3 were synthesized by the same procedure as Synthesis Example 2-1 except that the type and proportion of monomers were changed. The structure of these polymers is identified below.

Polymer 2

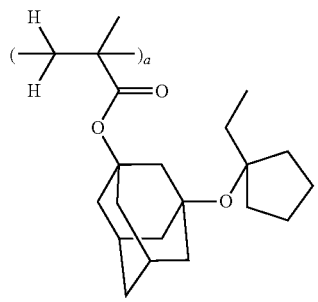

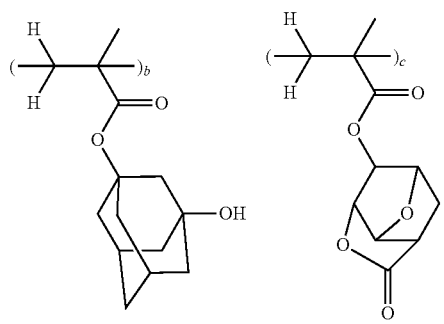

(a = 0.50, b = 0.10, c = 0.40, Mw = 11,400)

Polymer 3

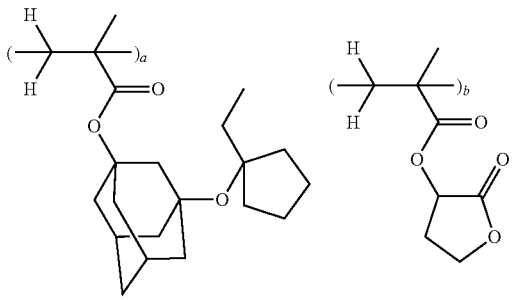

(a = 0.50, b = 0.50, Mw = 13,000)

Polymer 4

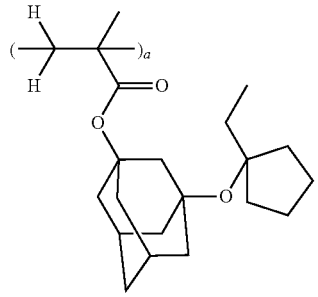

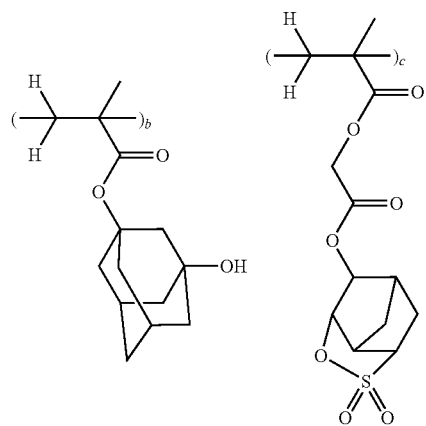
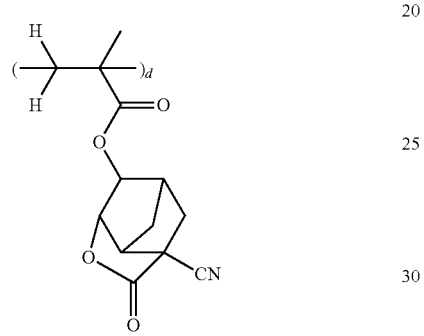
(a = 0.50, b = 0.20, c = 0.15, d = 0.15, Mw = 11,000)
Polymer 5
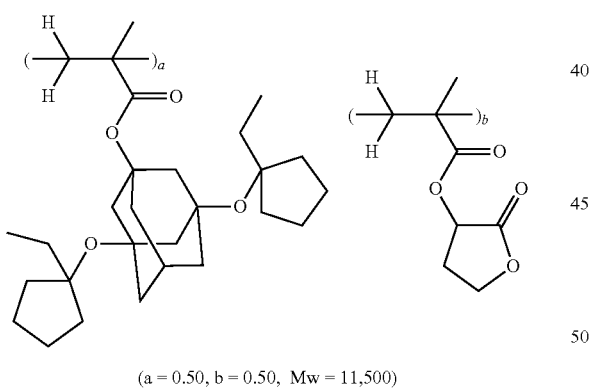
(a = 0.50, b = 0.50, Mw = 11,500)
Polymer 6
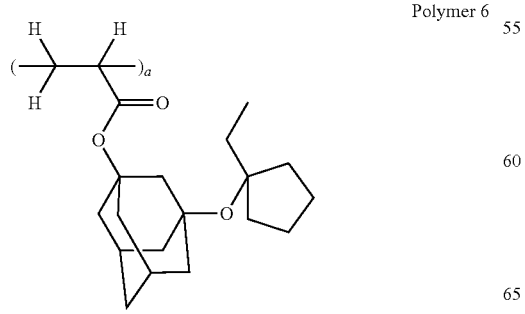
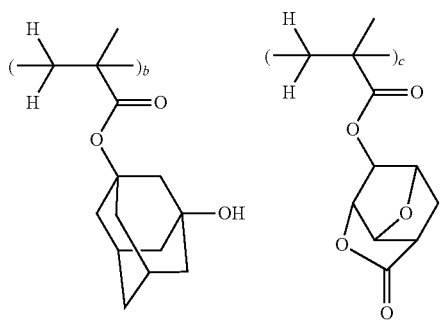
(a = 0.50, b = 0.10, c = 0.40, Mw = 13,600)
Polymer 7
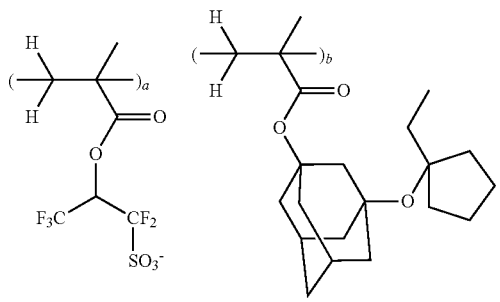
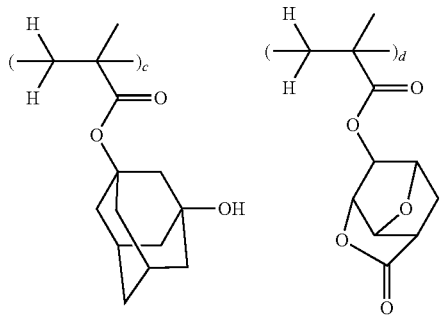
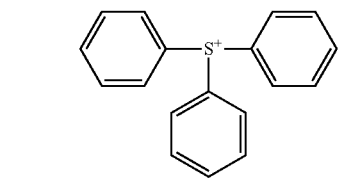
(a = 0.05, b = 0.45, c = 0.10, d = 0.40, Mw = 12,000)
Polymer 8
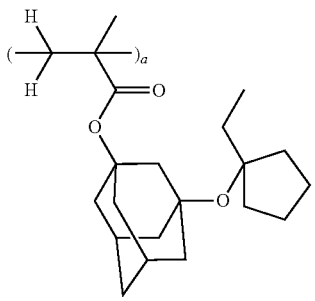

(a = 0.50, b = 0.20, c = 0.30, Mw = 12,500)

Polymer 9

(a = 0.50, b = 0.10, c = 0.40, Mw = 12,000)

Polymer 10

(a = 0.50, b = 0.10, c = 0.40, Mw = 11,500)

Polymer 11

(a = 0.20, b = 0.35, c = 0.45, Mw = 12,700)

Polymer 12

(a = 0.20, b = 0.35, c = 0.45, Mw = 11,400)

Polymer 13

-continued

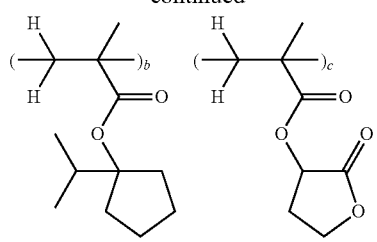

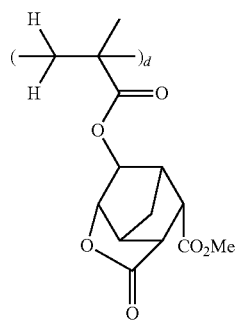

(a = 0.20, b = 0.35, c = 0.20, d = 0.25, Mw = 12,000)

Comparative Polymer 1

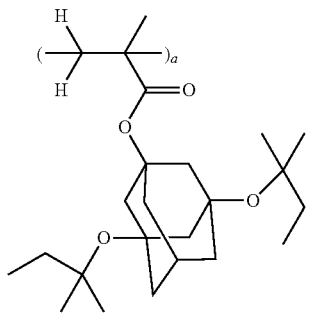

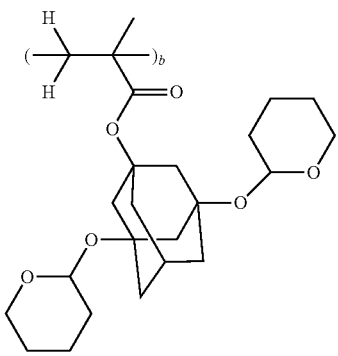

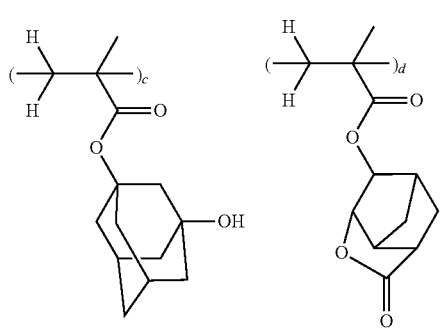

(a = 0.10, b = 0.40, c = 0.20, d = 0.30, Mw = 11,500)

-continued

Comparative Polymer 2

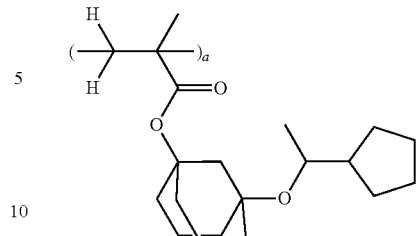

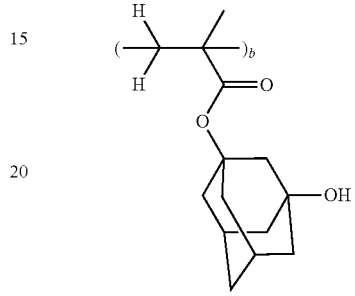

(a = 0.50, b = 0.10, c = 0.40, Mw = 12,000)

Comparative Polymer 3

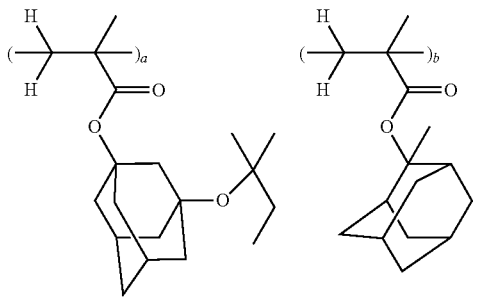

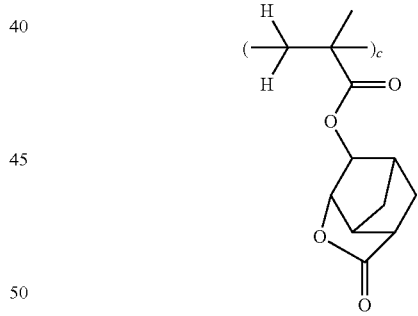

(a = 0.20, b = 0.35, c = 0.45, Mw = 9,700)

Examples 1-1 to 1-13 and Comparative Examples 1-1 to 1-3

Preparation of resist composition

Resist compositions R-01 to R-16 in solution form were prepared by dissolving a polymer (synthesized above) and components in solvents in accordance with the formulation of Table 1 and filtering through a Teflon® filter with a pore size of 0.2 μm. The photoacid generator (PAG1), water-repellent polymer (SF-1, 2), quencher (Quencher 1, 2), and solvents used herein are identified below.

Acid generator: PAG1 of the following structural formula

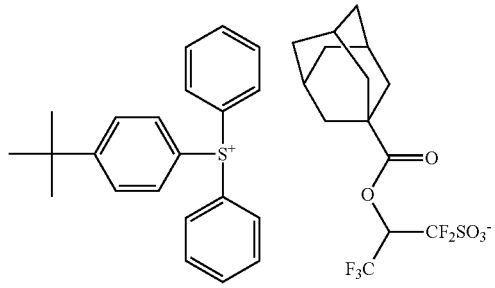

Water-Repellent Polymer 1
Mw=7,500
Mw/Mn=1.51

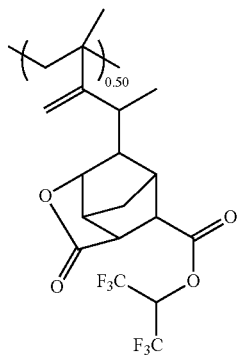

Water-Repellent Polymer 2
Mw=8,900
Mw/Mn=1.89

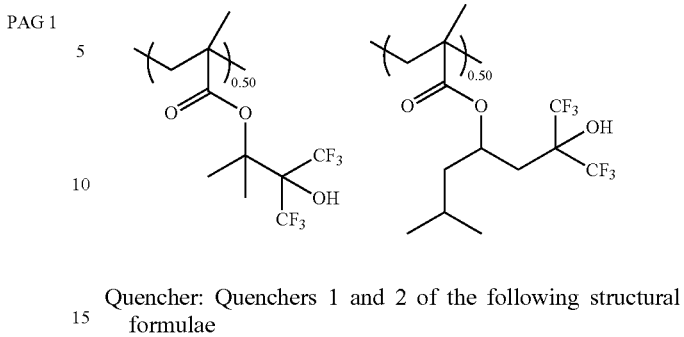

Quencher: Quenchers 1 and 2 of the following structural formulae

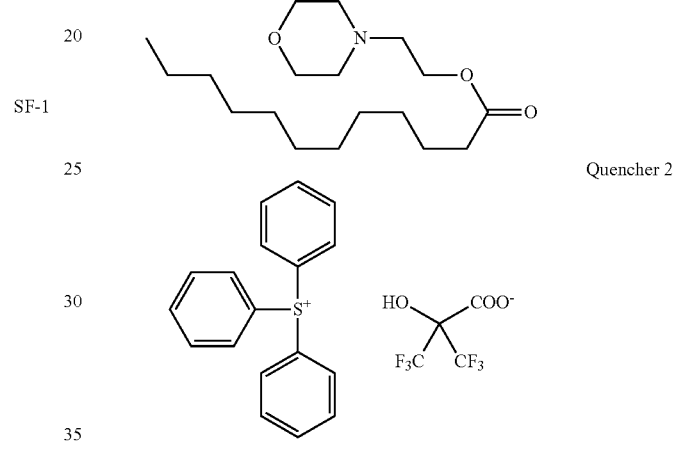

Organic Solvent:
PGMEA (propylene glycol monomethyl ether acetate)
CyH (cyclohexanone)

TABLE 1

|  |  | Resist | Resin (pbw) | PAG (pbw) | Quencher (pbw) | Water-repellent polymer (pbw) | Solvent 1 (pbw) | Solvent 2 (pbw) |
|---|---|---|---|---|---|---|---|---|
| Example | 1-1 | R-01 | Polymer 1 (100) | PAG 1 (12.5) | Quencher 1 (1.5) | SF-1 (6.0) | PGMEA (2,000) | CyH (500) |
|  | 1-2 | R-02 | Polymer 2 (100) | PAG 1 (12.5) | Quencher 2 (1.5) | SF-1 (6.0) | PGMEA (2,000) | CyH (500) |
|  | 1-3 | R-03 | Polymer 3 (100) | PAG 1 (12.5) | Quencher 2 (1.5) | SF-1 (6.0) | PGMEA (2,000) | CyH (500) |
|  | 1-4 | R-04 | Polymer 4 (100) | PAG 1 (12.5) | Quencher 1 (1.5) | SF-1 (6.0) | PGMEA (2,000) | CyH (500) |
|  | 1-5 | R-05 | Polymer 5 (100) | PAG 1 (12.5) | Quencher 2 (1.5) | SF-1 (6.0) | PGMEA (2,000) | CyH (500) |
|  | 1-6 | R-06 | Polymer 6 (100) | PAG 1 (12.5) | Quencher 1 (1.5) | SF-1 (6.0) | PGMEA (2,000) | CyH (500) |
|  | 1-7 | R-07 | Polymer 7 (100) | none | Quencher 2 (1.5) | SF-1 (6.0) | PGMEA (2,000) | CyH (500) |
|  | 1-8 | R-08 | Polymer 8 (100) | PAG 1 (12.5) | Quencher 1 (1.5) | SF-1 (6.0) | PGMEA (2,000) | CyH (500) |
|  | 1-9 | R-09 | Polymer 9 (100) | PAG 1 (12.5) | Quencher 1 (1.5) | SF-1 (6.0) | PGMEA (2,000) | CyH (500) |
|  | 1-10 | R-10 | Polymer 10 (100) | PAG 1 (12.5) | Quencher 1 (1.5) | SF-1 (6.0) | PGMEA (2,000) | CyH (500) |
|  | 1-11 | R-11 | Polymer 11 (100) | PAG 1 (12.5) | Quencher 1 (1.5) | SF-2 (6.0) | PGMEA (2,000) | CyH (500) |
|  | 1-12 | R-12 | Polymer 12 (100) | PAG 1 (12.5) | Quencher 1 (1.5) | SF-2 (6.0) | PGMEA (2,000) | CyH (500) |

TABLE 1-continued

|  |  | Resist | Resin (pbw) | PAG (pbw) | Quencher (pbw) | Water-repellent polymer (pbw) | Solvent 1 (pbw) | Solvent 2 (pbw) |
|---|---|---|---|---|---|---|---|---|
|  | 1-13 | R-13 | Polymer 13 (100) | PAG 1 (12.5) | Quencher 1 (1.5) | SF-2 (6.0) | PGMEA (2,000) | CyH (500) |
| Comparative Example | 1-1 | R-14 | Comparative Polymer 1 (100) | PAG 1 (12.5) | Quencher 1 (1.5) | SF-1 (6.0) | PGMEA (2,000) | CyH (500) |
|  | 1-2 | R-15 | Comparative Polymer 2 (100) | PAG 1 (12.5) | Quencher 1 (1.5) | SF-1 (6.0) | PGMEA (2,000) | CyH (500) |
|  | 1-3 | R-16 | Comparative Polymer 3 (100) | PAG 1 (12.5) | Quencher 1 (1.5) | SF-2 (6.0) | PGMEA (2,000) | CyH (500) |

Examples 2-1 to 2-10 and Comparative Examples 2-1, 2-2

ArF Lithography Patterning Test 1

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (R-01 to R-10, R-14 or R-15) shown in Table 1 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), first exposure was performed through a 6% halftone phase shift mask bearing a X-direction line pattern with a pitch of 80 nm and a line width of 40 nm (on-wafer size) by conformable dipole illumination. Second exposure was then performed through a 6% halftone phase shift mask bearing a Y-direction line pattern with a pitch of 80 nm and a line width of 40 nm (on-wafer size) by conformable dipole illumination. After the exposure, the wafer was baked (PEB) at the temperature shown in Table 2 for 60 seconds and developed. Specifically, butyl acetate was injected from a development nozzle while the wafer was spun at 30 rpm for 3 seconds, which was followed by stationary puddle development for 27 seconds. The wafer was rinsed with 4-methyl-2-pentanol, spin dried, and baked at 100° C. for 20 seconds to evaporate off the rinse liquid.

A hole pattern resulted from image reversal by solvent development. By observation under TDSEM S-9380 (Hitachi Hitechnologies, Ltd.), the size of 50 holes was measured, from which a size variation 3σ was determined. The results are shown in Table 2.

TABLE 2

|  |  | Resist | PEB temperature (° C.) | Dose (mJ/cm$^2$) | Hole size variation 3σ (nm) |
|---|---|---|---|---|---|
| Example | 2-1 | R-01 | 90 | 49 | 1.7 |
|  | 2-2 | R-02 | 85 | 47 | 1.4 |
|  | 2-3 | R-03 | 85 | 46 | 1.5 |
|  | 2-4 | R-04 | 90 | 45 | 1.6 |
|  | 2-5 | R-05 | 80 | 42 | 1.8 |
|  | 2-6 | R-06 | 85 | 44 | 1.3 |
|  | 2-7 | R-07 | 85 | 45 | 1.8 |
|  | 2-8 | R-08 | 85 | 47 | 1.9 |
|  | 2-9 | R-09 | 95 | 54 | 2.1 |
|  | 2-10 | R-10 | 80 | 43 | 1.8 |
| Comparative Example | 2-1 | R-14 | 85 | 43 | 3.4 |
|  | 2-2 | R-15 | 100 | 60 | not resolved |

Examples 3-1 to 3-3 and Comparative Example 3-1

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (R-11, R-12, R-13 or R-16) shown in Table 1 was spin coated, then baked on a hot plate at 100° C. for 60 seconds to form a resist film of 80 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a line pattern with a pitch of 80 nm and a line width of 40 nm (on-wafer size) by dipole illumination. After the exposure, the wafer was baked (PEB) at the temperature shown in Table 3 for 60 seconds and puddle developed in an aqueous solution of 2.38 wt % tetramethylammonium hydroxide (TMAH) for 30 seconds. The wafer was rinsed with deionized water and spin dried.

The roughness (LWR) of the line pattern as developed was measured under TDSEM S-9380 (Hitachi Hitechnologies, Ltd.), with the results shown in Table 3.

TABLE 3

|  |  | Resist | PEB temperature (° C.) | Dose (mJ/cm$^2$) | LWR (nm) |
|---|---|---|---|---|---|
| Example | 3-1 | R-11 | 90 | 49 | 3.5 |
|  | 3-2 | R-12 | 85 | 47 | 3.3 |
|  | 3-3 | R-13 | 90 | 46 | 3.4 |
| Comparative Example | 3-1 | R-16 | 90 | 48 | 5.7 |

It is seen from the results of Tables 2 and 3 that the resist compositions within the scope of the invention are not only effective for forming positive patterns using conventional alkaline developers, but also display improved resolution, sensitivity, and dimensional uniformity upon organic solvent development.

Japanese Patent Application No. 2012-026798 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer selected from the group consisting of the following formulas (i) to (xiii):

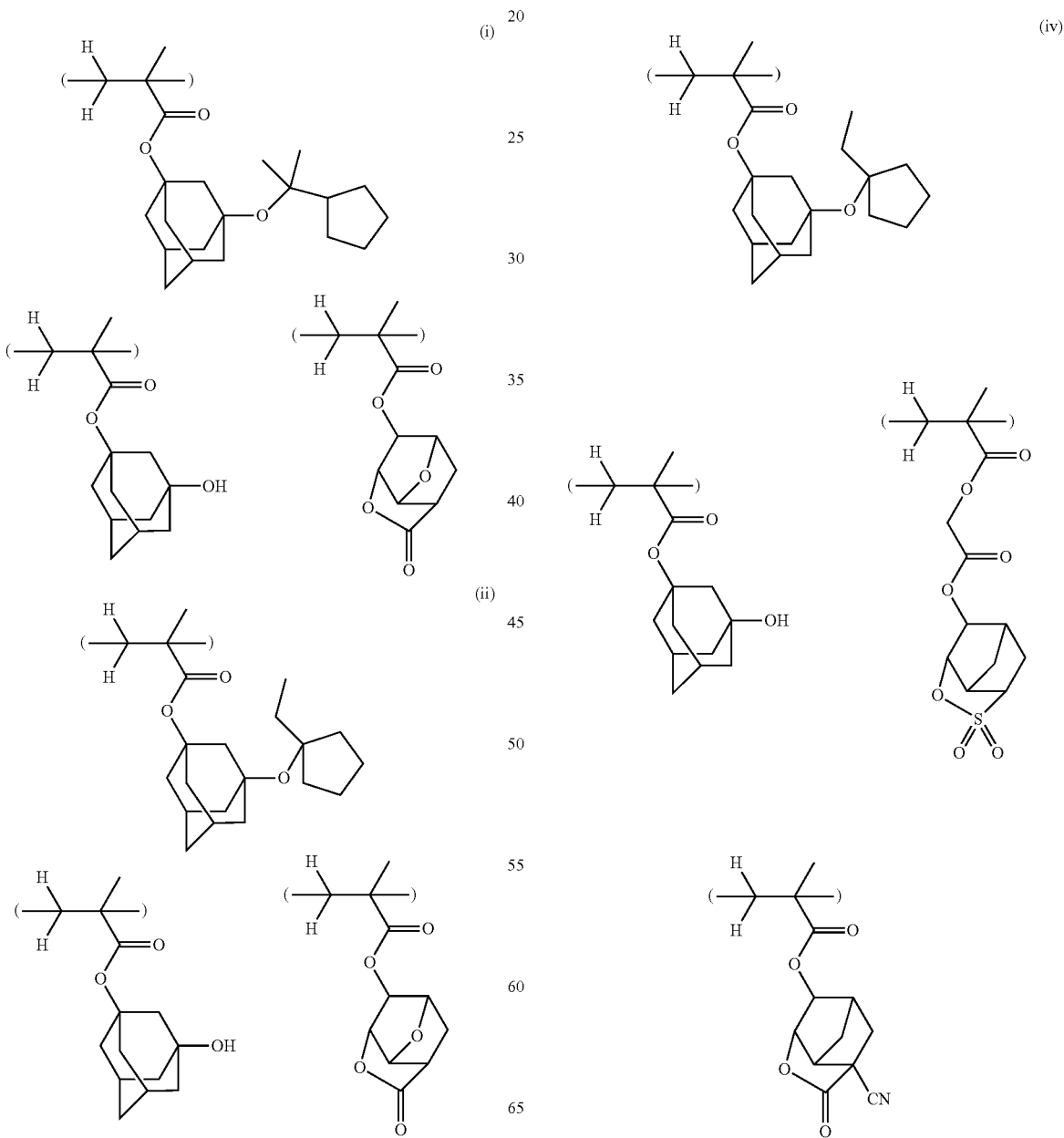

-continued
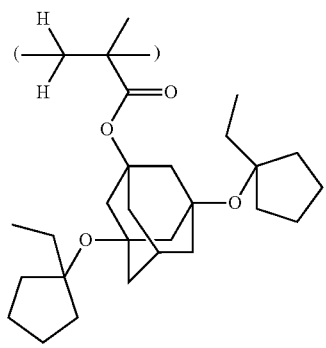
(v)
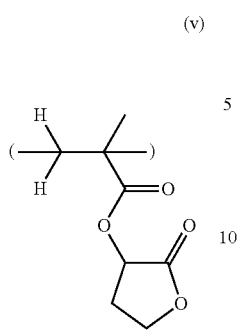
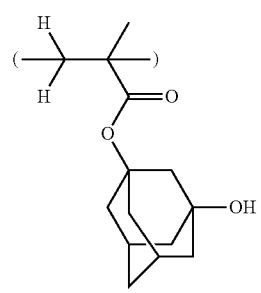
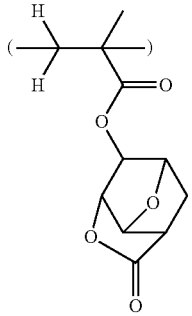
(vi)
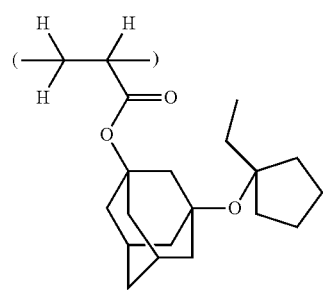
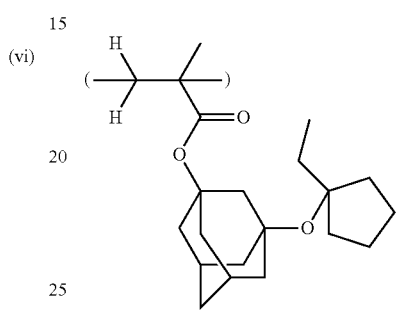
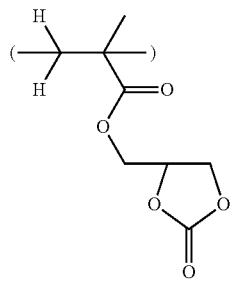
(viii)
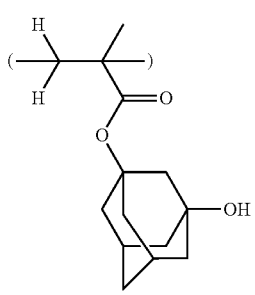
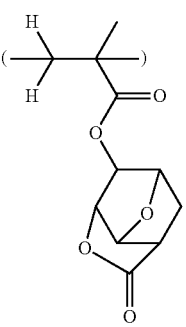
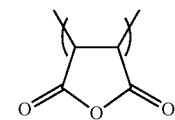
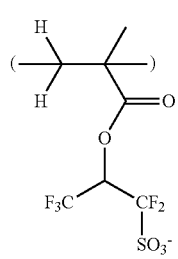
(vii)
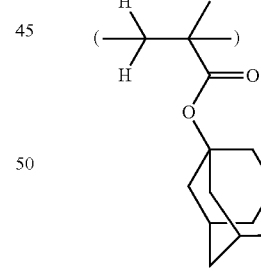
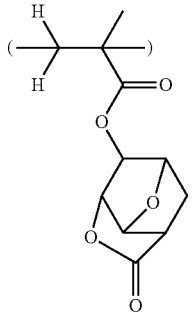
(ix)
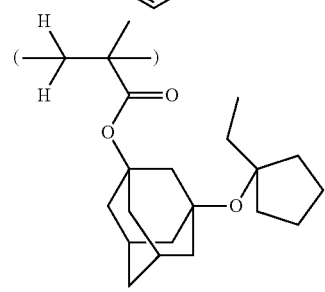
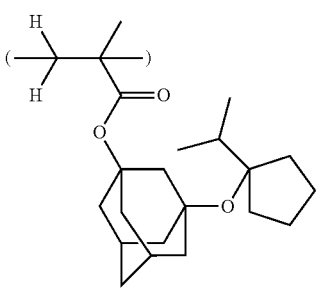
(x)

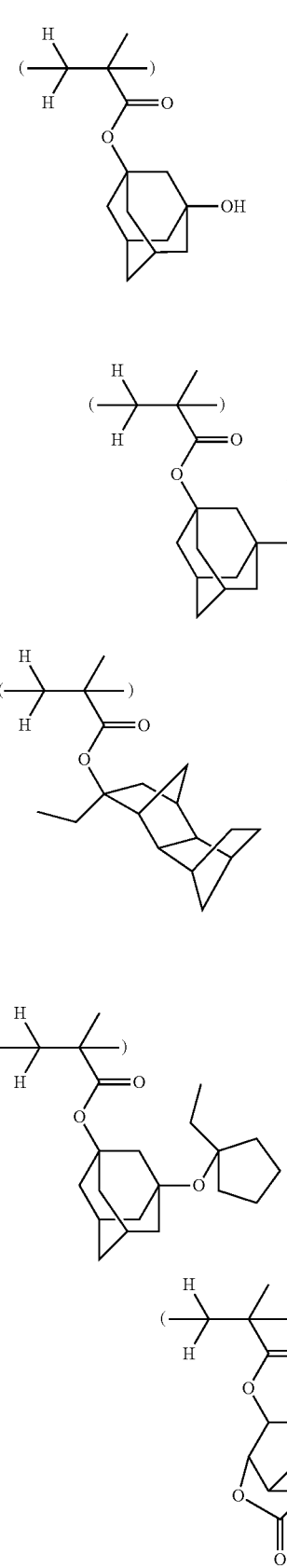

(xi)

(xii)

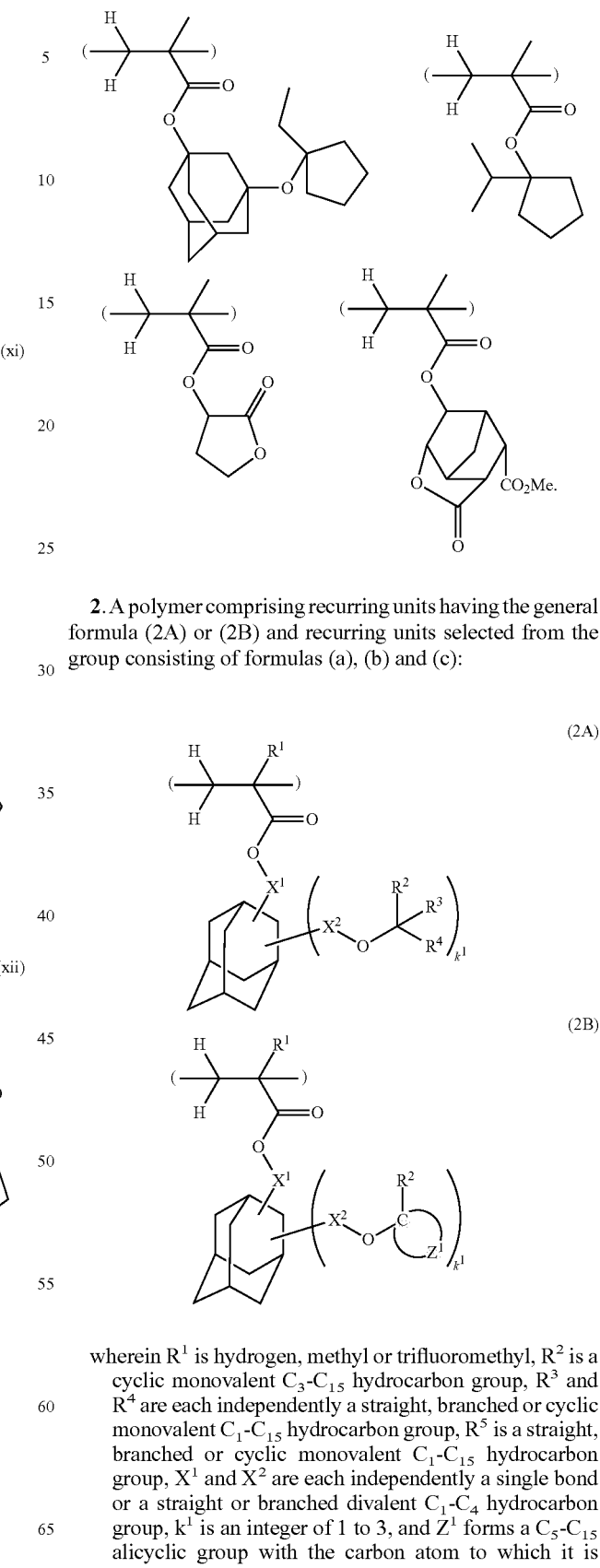

(xiii)

2. A polymer comprising recurring units having the general formula (2A) or (2B) and recurring units selected from the group consisting of formulas (a), (b) and (c):

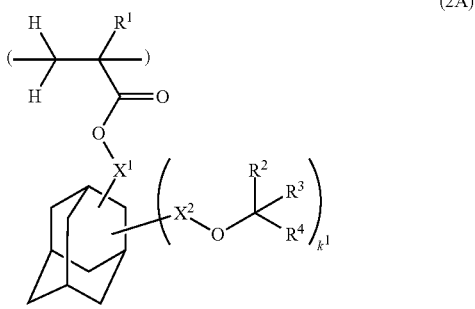
(2A)

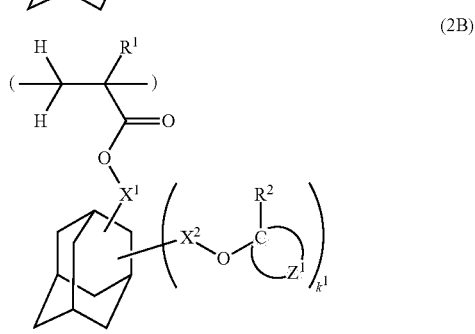
(2B)

wherein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached, (a)

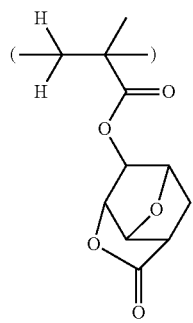

(b)

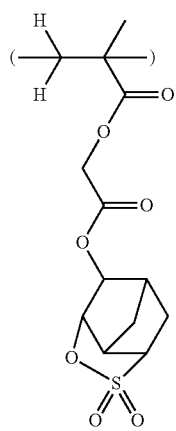

(c)

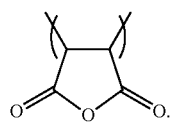

3. A resist composition comprising a base resin, an acid generator, and an organic solvent, wherein the base resin is a polymer comprising recurring units having the general formula (2A) or (2B):

(2A)

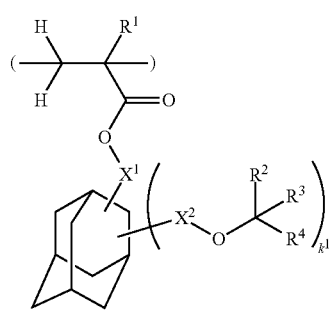

(2B)

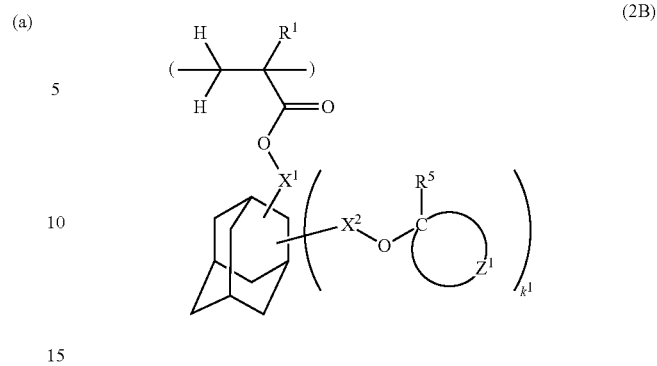

wherein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached, and the acid generator has the general formula (7):

(7)

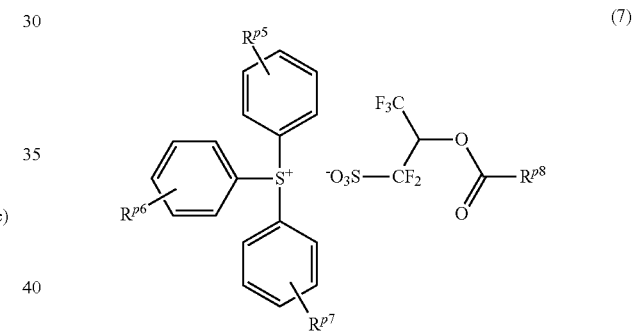

wherein $R^{p5}$, $R^{p6}$, and $R^{p7}$ are each independently hydrogen or a straight, branched or cyclic, monovalent $C_1$-$C_{20}$ hydrocarbon group which may contain a heteroatom, and $R^{p8}$ is a straight, branched or cyclic, monovalent $C_7$-$C_{30}$ hydrocarbon group which may contain a heteroatom.

4. The resist composition of claim 3 wherein the base polymer is one selected from the group consisting of the following formulas (i) to (xiii):

(i)

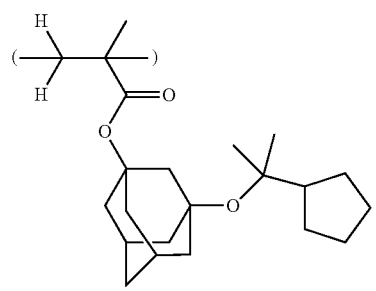

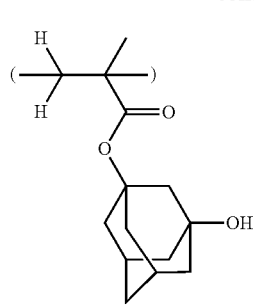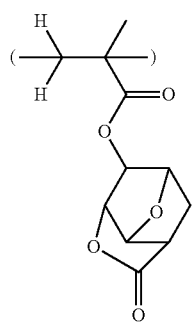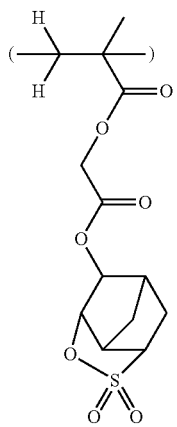
(ii)
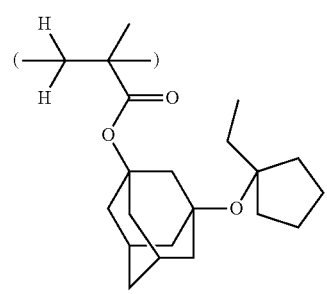
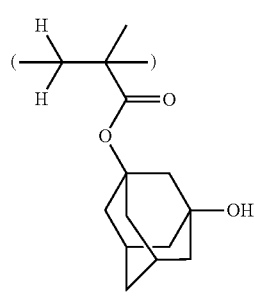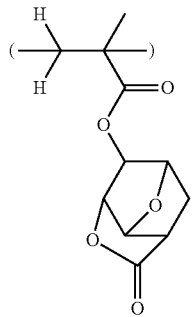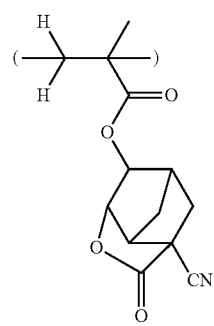
(iii)
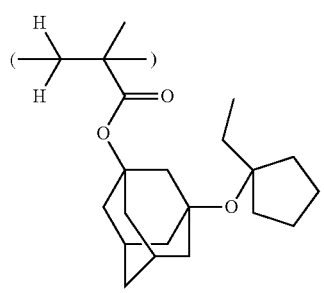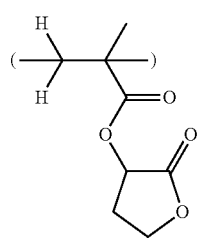
(v)
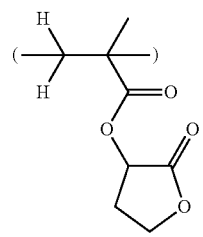
(iv)
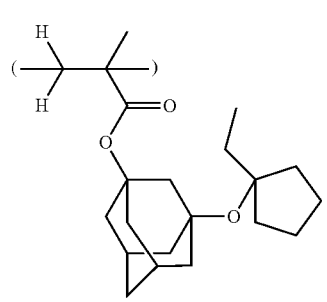
(vi)
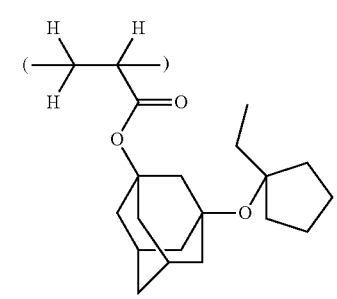

125
-continued
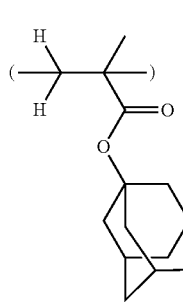 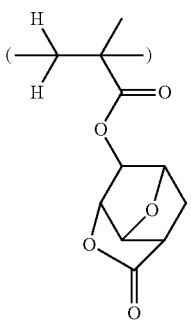
(vii)
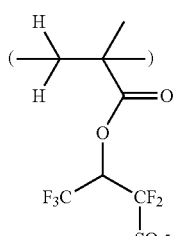
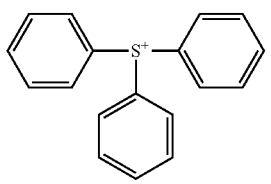
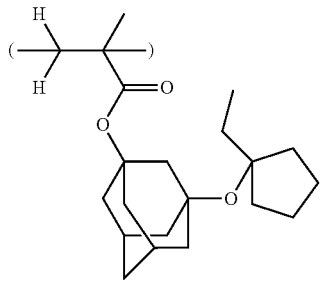
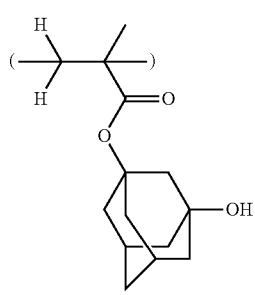 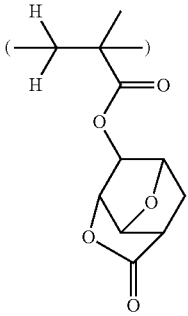
(viii)
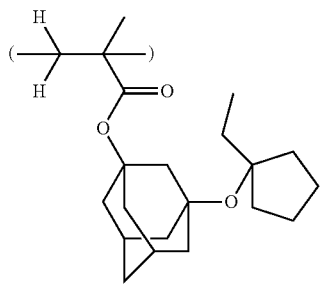 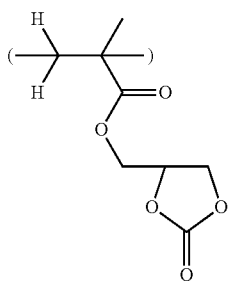
126
-continued
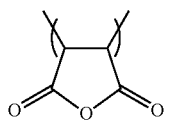
(ix)
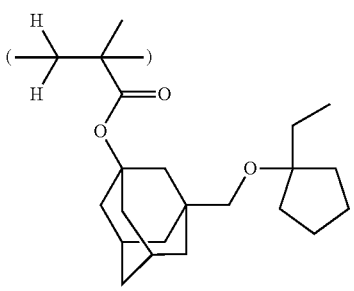
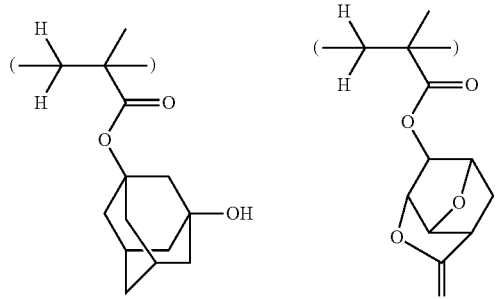
(x)
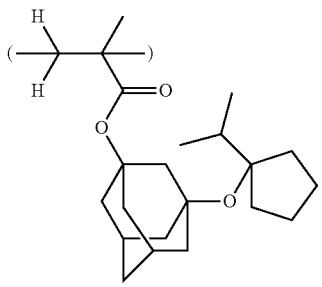
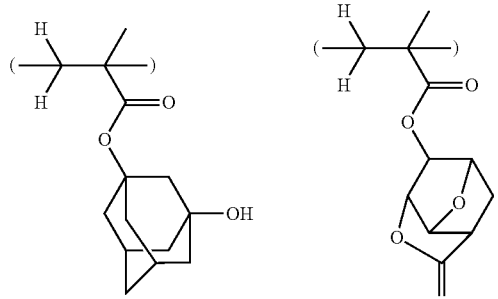
(xi)
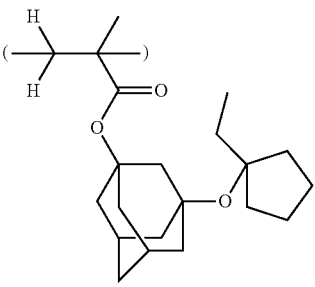

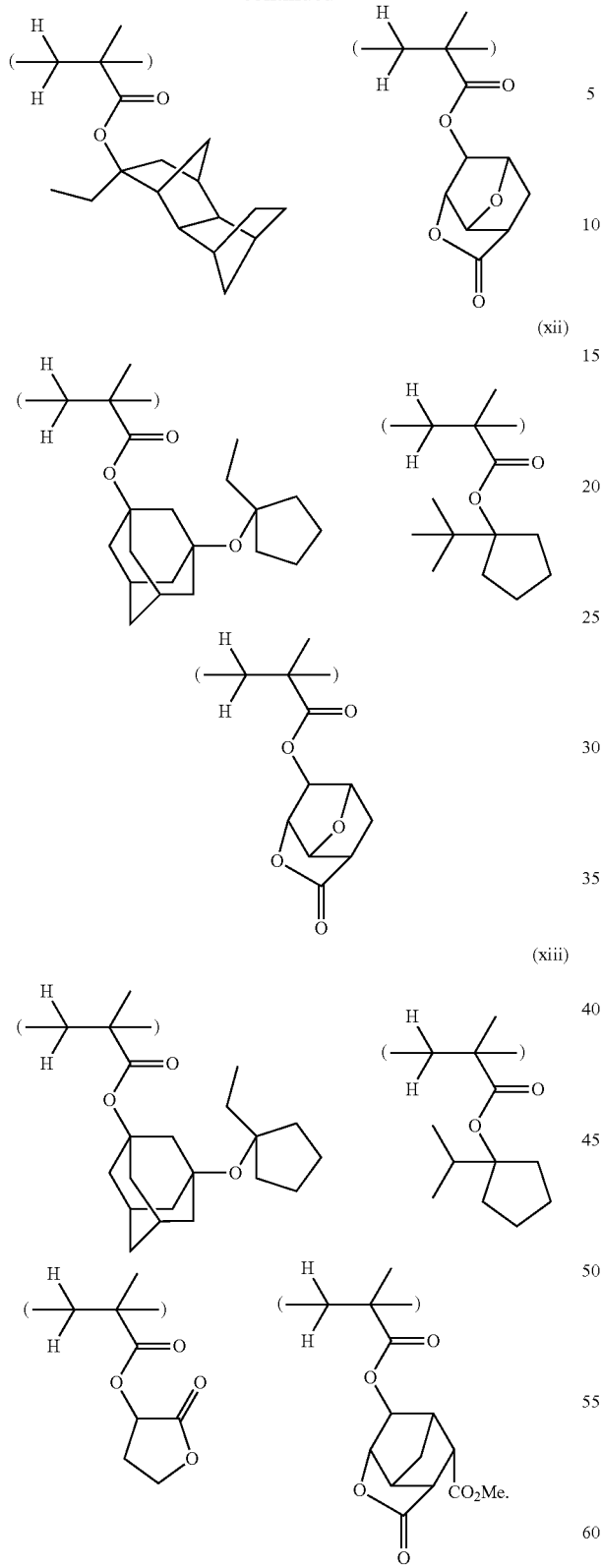

(xii)

(xiii)

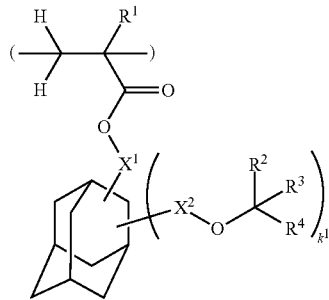

(2A)

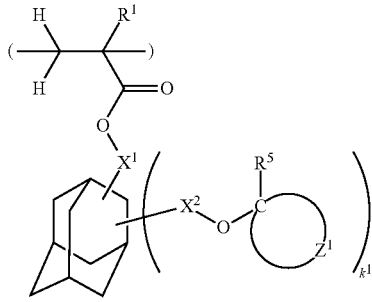

(2B)

wherein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached,

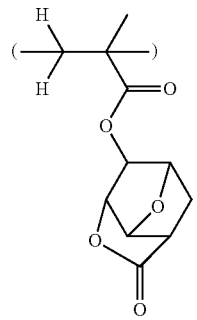

(a)

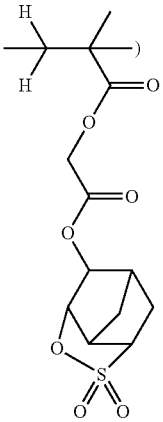

(b)

5. The resist composition of claim 3 wherein the base polymer comprises recurring units having the general formula (2A) or (2B) and recurring units selected from the group consisting of formulas (a), (b) and (c):

(c)

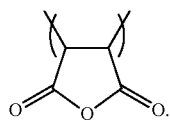

6. A pattern forming process comprising the steps of applying a resist composition of claim 3 onto a substrate, prebaking the composition to form a resist film, exposing the resist film to high-energy radiation to define exposed and unexposed regions, baking, and developing the exposed film in a developer to form a pattern.

7. The process of claim 3 wherein an alkaline aqueous solution is used as the developer in the developing step to form a positive pattern wherein the exposed region of film is dissolved and the unexposed region of film is not dissolved.

8. A pattern forming process comprising the steps of applying a resist composition comprising a base resin comprising recurring units having the general formula (2A) or (2B):

(2A)

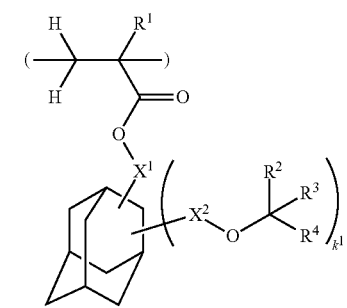

(2B)

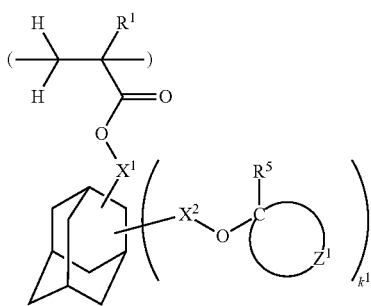

wherein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached, an acid generator, and an organic solvent onto a substrate, prebaking the composition to form a resist film, exposing the resist film to high-energy radiation to define exposed and unexposed regions, baking, and developing the exposed film in a developer to form a pattern, wherein organic solvent is used as the developer in the developing step to form a negative pattern wherein the unexposed region of film is dissolved and the exposed region of film is not dissolved.

9. The process of claim 8 wherein the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

10. The process of claim 8 wherein the acid generator has the general formula (7):

(7)

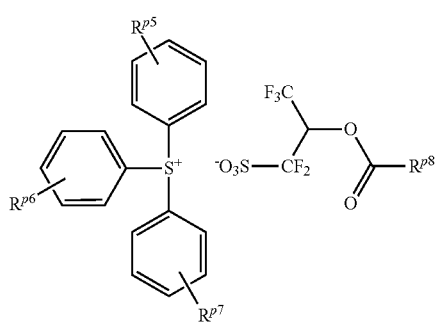

wherein $R^{p5}$, $R^{p6}$, and $R^{p7}$ are each independently hydrogen or a straight, branched or cyclic, monovalent $C_1$-$C_{20}$ hydrocarbon group which may contain a heteroatom, and $R^{P8}$ is a straight, branched or cyclic, monovalent $C_7$-$C_{30}$ hydrocarbon group which may contain a heteroatom.

11. The process of claim 8 wherein the base polymer comprising recurring units having the general formula (2A) or (2B) and recurring units selected from the group consisting of formulas (a), (b) and (c):

(2A)

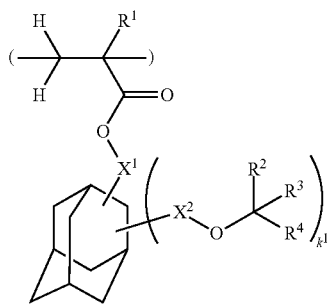

(2B)

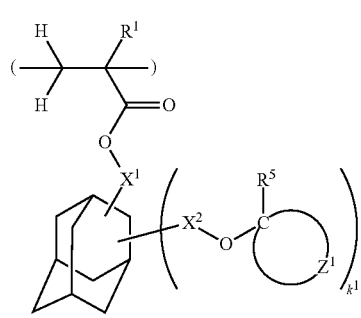

wherein $R^1$ is hydrogen, methyl or trifluoromethyl, $R^2$ is a cyclic monovalent $C_3$-$C_{15}$ hydrocarbon group, $R^3$ and $R^4$ are each independently a straight, branched or cyclic monovalent $C_1$-$C_{15}$ hydrocarbon group, $R^5$ is a straight, branched or cyclic monovalent $C_1$-$C_{15}$ hydrocarbon group, $X^1$ and $X^2$ are each independently a single bond or a straight or branched divalent $C_1$-$C_4$ hydrocarbon group, $k^1$ is an integer of 1 to 3, and $Z^1$ forms a $C_5$-$C_{15}$ alicyclic group with the carbon atom to which it is attached, (a)

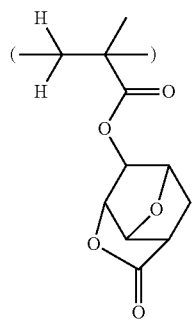

(b)

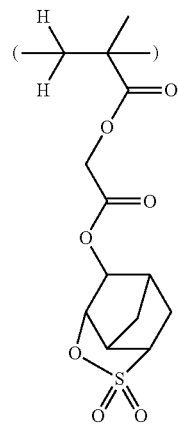

(c)

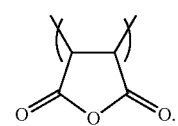

* * * * *